United States Patent
Lu

(10) Patent No.: US 10,431,576 B1
(45) Date of Patent: Oct. 1, 2019

(54) MEMORY CELL ARRAY AND METHOD OF MANUFACTURING SAME

(71) Applicant: TAIWAN SEMICONDUCTOR MANUFACTURING COMPANY, LTD., Hsinchu (TW)

(72) Inventor: Shih-Lien Linus Lu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/964,492

(22) Filed: Apr. 27, 2018

Related U.S. Application Data

(60) Provisional application No. 62/660,834, filed on Apr. 20, 2018.

(51) Int. Cl.
  *H01L 27/02* (2006.01)
  *H01L 27/11* (2006.01)
  *G11C 11/412* (2006.01)

(52) U.S. Cl.
  CPC ........ *H01L 27/0207* (2013.01); *G11C 11/412* (2013.01); *H01L 27/1104* (2013.01)

(58) Field of Classification Search
  None
  See application file for complete search history.

(56) References Cited

U.S. PATENT DOCUMENTS

| | | | |
|---|---|---|---|
| 2004/0061143 A1* | 4/2004 | Koolhaas | G11C 15/04 257/204 |
| 2005/0262293 A1 | 11/2005 | Yoon | |
| 2005/0281098 A1* | 12/2005 | Sadra | H01L 27/1104 365/194 |
| 2009/0014806 A1* | 1/2009 | Ostermayr | H01L 21/823807 257/369 |
| 2009/0146188 A1* | 6/2009 | Yamazaki | H01L 21/26586 257/202 |

(Continued)

FOREIGN PATENT DOCUMENTS

| | | |
|---|---|---|
| TW | 200924117 | 6/2009 |
| TW | 201525999 | 7/2015 |

OTHER PUBLICATIONS

Carlson, I., "Design and Evaluation of High Density 5T SRAM Cache for Advanced Microprocessors", Thesis Linkopings Universitet, registration number, LiTH-ISY-EX-3481-2004, Mar. 23, 2004.*

(Continued)

*Primary Examiner* — J. E. Schoenholtz
(74) *Attorney, Agent, or Firm* — Hauptman Ham, LLP

(57) ABSTRACT

A memory cell array includes a first memory cell arranged in a first row in a first direction and a second memory cell arranged in a second row in the first direction. The first memory cell or the second memory cell includes a set of active regions, a set of gates and a first set of conductive structures. Each of the active regions of the set of active regions is separated from an adjacent active region in the first direction by a first pitch. The set of active regions extends in a second direction. The set of active regions includes a first active region adjacent to a first side of the first memory cell, and a second active region adjacent to a second side of the first memory cell. A length of the first active region is different from a length of the second active region.

20 Claims, 20 Drawing Sheets

(56) References Cited

U.S. PATENT DOCUMENTS

| | | |
|---|---|---|
| 2009/0173971 A1 | 7/2009 | Houston et al. |
| 2009/0303770 A1 | 12/2009 | Shibata |
| 2010/0140666 A1* | 6/2010 | Yoon .................. H01L 27/0207 |
| | | 257/210 |
| 2011/0103137 A1 | 5/2011 | Beat |
| 2011/0235406 A1* | 9/2011 | Jung ..................... G11C 11/412 |
| | | 365/156 |
| 2015/0137252 A1 | 5/2015 | Baek et al. |
| 2016/0308535 A1 | 10/2016 | Madurawe |

OTHER PUBLICATIONS

"Chip Tapeout Design Flow", downloaded from URL< https://docs-ee.readthedocs.io/en/latest/design/tapeout.html#major-milestones> on Nov. 29, 2018.*

* cited by examiner

MEMORY CELL ARRAY AND METHOD OF MANUFACTURING SAME

PRIORITY CLAIM AND CROSS-REFERENCE

This application claims the benefit of U.S. Provisional Application No. 62/660,834, filed Apr. 20, 2018, which is herein incorporated by reference in its entirety.

BACKGROUND

The semiconductor integrated circuit (IC) industry has produced a wide variety of digital devices to address issues in a number of different areas. Some of these digital devices, such as memory macros, are configured for the storage of data. For example, in some applications, a cache is a particular memory macro that can be used on an IC chip. Furthermore, in some applications, cache can be configured to store recently used data such that subsequent accesses of recent data can be implemented by accessing the cache as opposed to accessing memory located off of the IC chip (e.g., off-chip). In general, a larger cache allows more recent data to be stored on-chip resulting in less off-chip memory data access. The design of smaller memory cells enables denser ICs and speeds up overall IC performance. Therefore, alternatives to 6-transistor (6T) synchronous random access memory (SRAM) are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
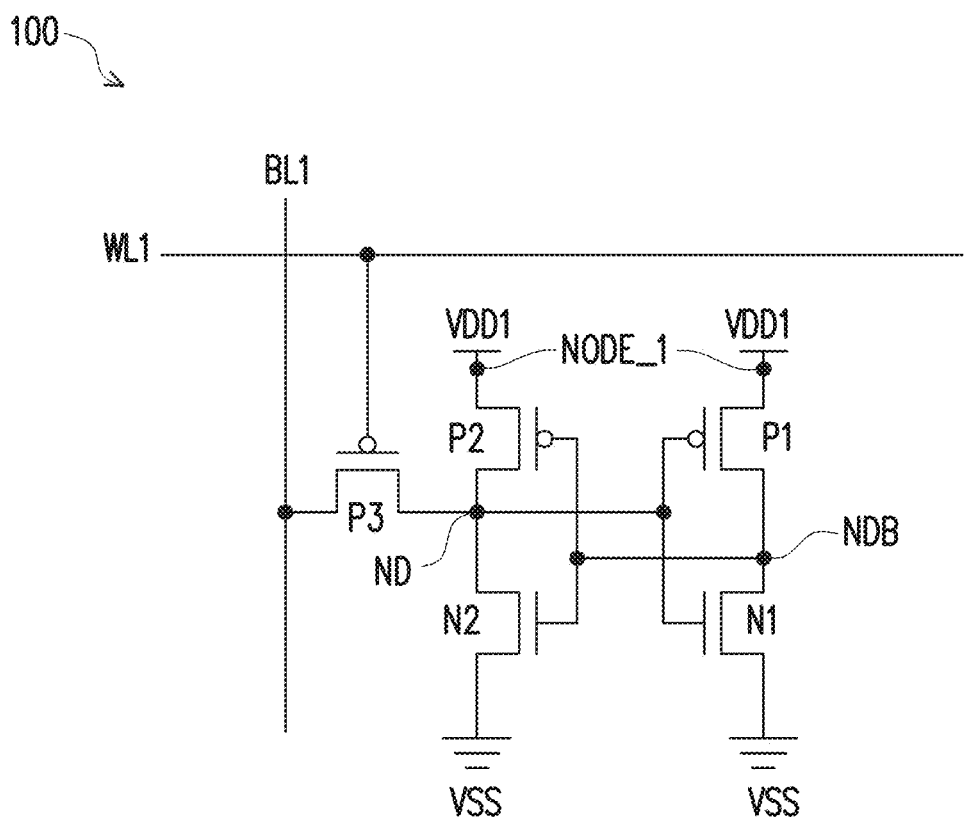
FIG. 1 is a circuit diagram of a memory cell, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a method of forming a memory cell array includes generating a first set of tiles extending in a first direction and generating a second set of tiles extending in the first direction. In some embodiments, each tile of the first set of tiles corresponds to a first layout design of a first set of memory cells. In some embodiments, each tile of the second set of tiles corresponds to a second layout design of a second set of memory cells.

In some embodiments, each memory cell of the first set of memory cells comprises a five transistor (5T) synchronous random access memory (SRAM) memory cell. In some embodiments, each memory cell of the second set of memory cells comprises a 5T SRAM memory cell.

In some embodiments, the first set of memory cells are arranged in at least a first row and a second row of the memory cell array. In some embodiments, the second set of memory cells are arranged in at least a third row and a fourth row of the memory cell array.

In some embodiments, a shape of the first set of tiles or a shape of the second set of tiles is non-rectangular which results in smaller standard cells than other designs. In some embodiments, by having smaller standard cells, the first set of tiles or the second set of tiles can be utilized to manufacture integrated circuits that are smaller than other integrated circuits.

The first set of tiles and the second set of tiles alternate with each other in the second direction. In some embodiments, the second set of tiles is separated from the first set of tiles in the second direction.

In some embodiments, each tile of the first set of tiles is offset from an adjacent tile of the first set of tiles in a second direction different from the first direction. In some embodiments, each tile of the second set of tiles is offset from an adjacent tile of the second set of tiles in the second direction.

In some embodiments, generating the first set of tiles includes generating the first layout design of the first set of memory cells. In some embodiments, generating the second set of tiles includes generating the second layout design of the second set of memory cells.

In some embodiments, each tile of the first set of tiles and each tile of the second set of tiles extends in a third direction different from the first direction and the second direction.

FIG. 1 is a circuit diagram of a memory cell 100, in accordance with some embodiments.

Memory cell 100 is a five transistor (5T) single port (SP) static random access memory (SRAM) memory cell used for illustration. In some embodiments, memory cell 100 employs a number of transistors other than five. Other types of memory are within the scope of various embodiments.

Memory cell 100 comprises three P-type metal oxide semiconductor (PMOS) transistors P1, P2 and P3, and two N-type metal oxide semiconductor (NMOS) transistors N1 and N2. Transistors P1, P2, N1, and N2 form a cross-latch or a pair of cross-coupled inverters. For example, PMOS transistor P1 and NMOS transistor N1 form a first inverter while PMOS transistor P2 and NMOS transistor N2 form a second inverter.

A source terminal of each of PMOS transistors P1 and P2 are configured as a voltage supply node NODE_1. Each voltage supply node NODE_1 is coupled to a first voltage source VDDI. A drain terminal of PMOS transistor P1 is coupled with a drain terminal of NMOS transistor N1, a gate terminal of PMOS transistor P2, a gate terminal of NMOS transistor N2, and is configured as a storage node NDB.

A drain terminal of PMOS transistor P2 is coupled with a drain terminal of NMOS transistor N2, a gate terminal of PMOS transistor P1, a gate terminal of NMOS transistor N1, a source terminal of PMOS transistor P3, and is configured as a storage node ND. A source terminal of each of NMOS transistors N1 and N2 is configured as a supply reference voltage node (not labelled) having a supply reference voltage VSS. The source terminal of each of NMOS transistors N1 and N2 is also coupled to supply reference voltage VSS.

A word line WL1 is coupled with a gate terminal of PMOS transistor P3. Word line WL1 is also called a write control line because PMOS transistor P3 is configured to be controlled by a signal on word line WL1 in order to transfer data between bit line BL1 and node ND.

A drain terminal of PMOS transistor P3 is coupled to a bit line BL1. Bit line BL1 is configured as both data input and output for memory cell 100. In some embodiments, in a write operation, applying a logical value to a bit line BL1 enables writing the logical value on the bit line BL1 to memory cell 100. Bit line BL1 is called a data line because the data carried on bit line BL1 is written to and read from node ND. In some embodiments, the source terminal of PMOS transistor P3 is coupled to the bit line BL1, and the drain terminal of PMOS transistor P3 is coupled to the storage node ND.

Figure 2A:
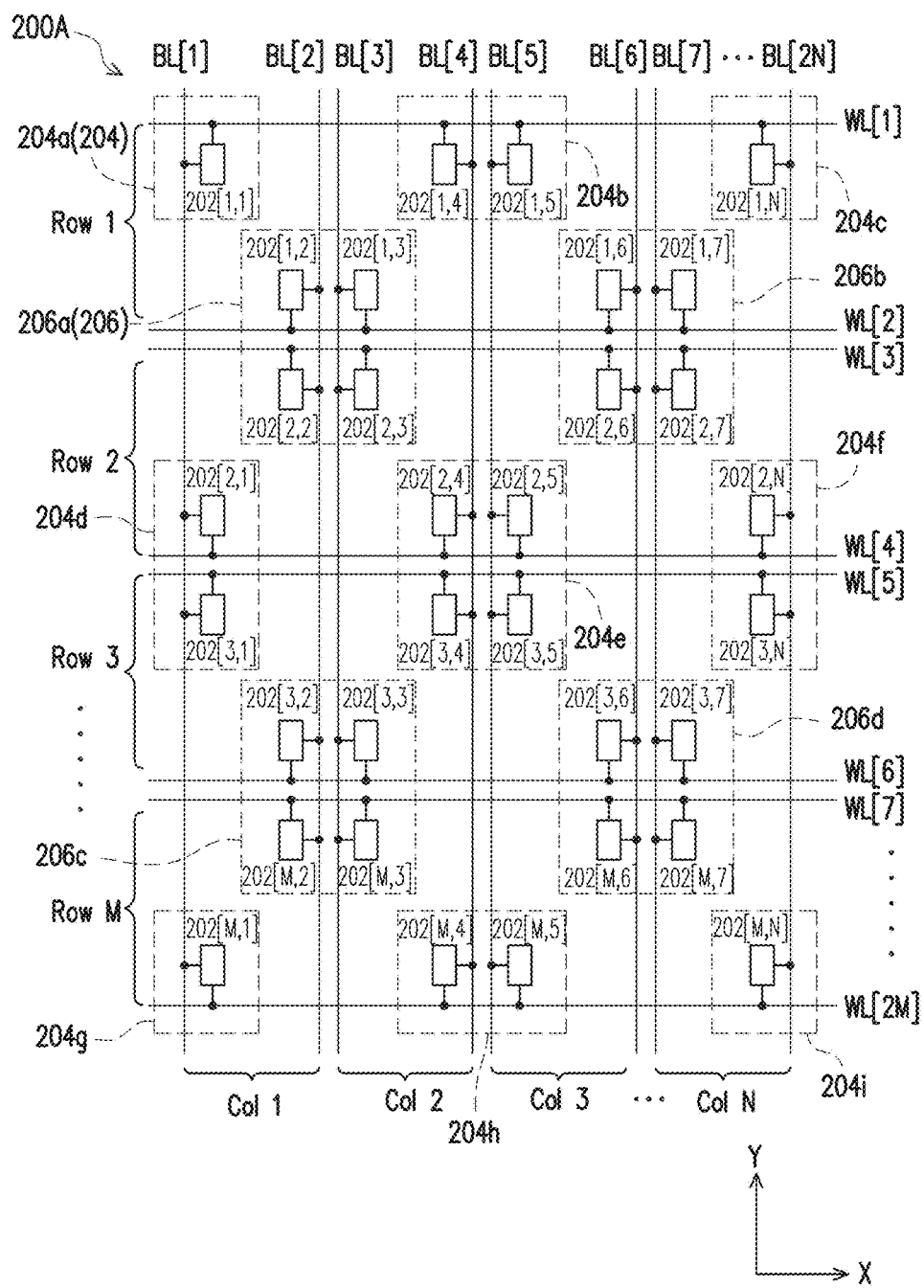
FIG. 2A is a block diagram of a memory cell array having a plurality of memory cells in FIG. 1, in accordance with some embodiments.

FIG. 2A is a block diagram of a memory cell array 200A having a plurality of memory cells in FIG. 1, in accordance with some embodiments. For example, memory cell 100 of FIG. 1 is usable as one or more memory cells in memory cell array 200A.

Memory cell array 200A comprises an array of memory cells 202[1,1], 202[1,2], . . . , 202[2,2], . . . , 202[M,N] (collectively referred to as "array of memory cells 202A") having M rows and N columns, where N is a positive integer corresponding to the number of columns in array of memory cells 202A and M is a positive integer corresponding to the number of rows in array of memory cells 202A. The rows of cells in array of memory cells 202A are arranged in a first direction X. The columns of cells in array of memory cells 202A are arranged in a second direction Y. The second direction Y is different from the first direction X. In some embodiments, the second direction Y is perpendicular to the first direction X. Memory cell 100 of FIG. 1 is usable as one or more memory cells in array of memory cells 202A.

Memory cell array 200A further includes 2N bit lines BL[1], . . . BL[2N] (collectively referred to as "bit line BL"). Each column 1, N in array of memory cells 202A is overlapped by a pair of bit lines BL[1], . . . BL[2N]. Each bit line BL extends in the second direction Y and is over a column of cells (e.g., column 1, . . . N). In some embodiments, memory cell array 200A does not include one or more bit line bars BLB. Note that the term "bar" as used in this context indicates a logically inverted signal, for example, bit line bar BLB[1], . . . BLB[N] carries a signal logically inverted from a signal carried by bit line BL[1], . . . BL[N].

Figure 2B:
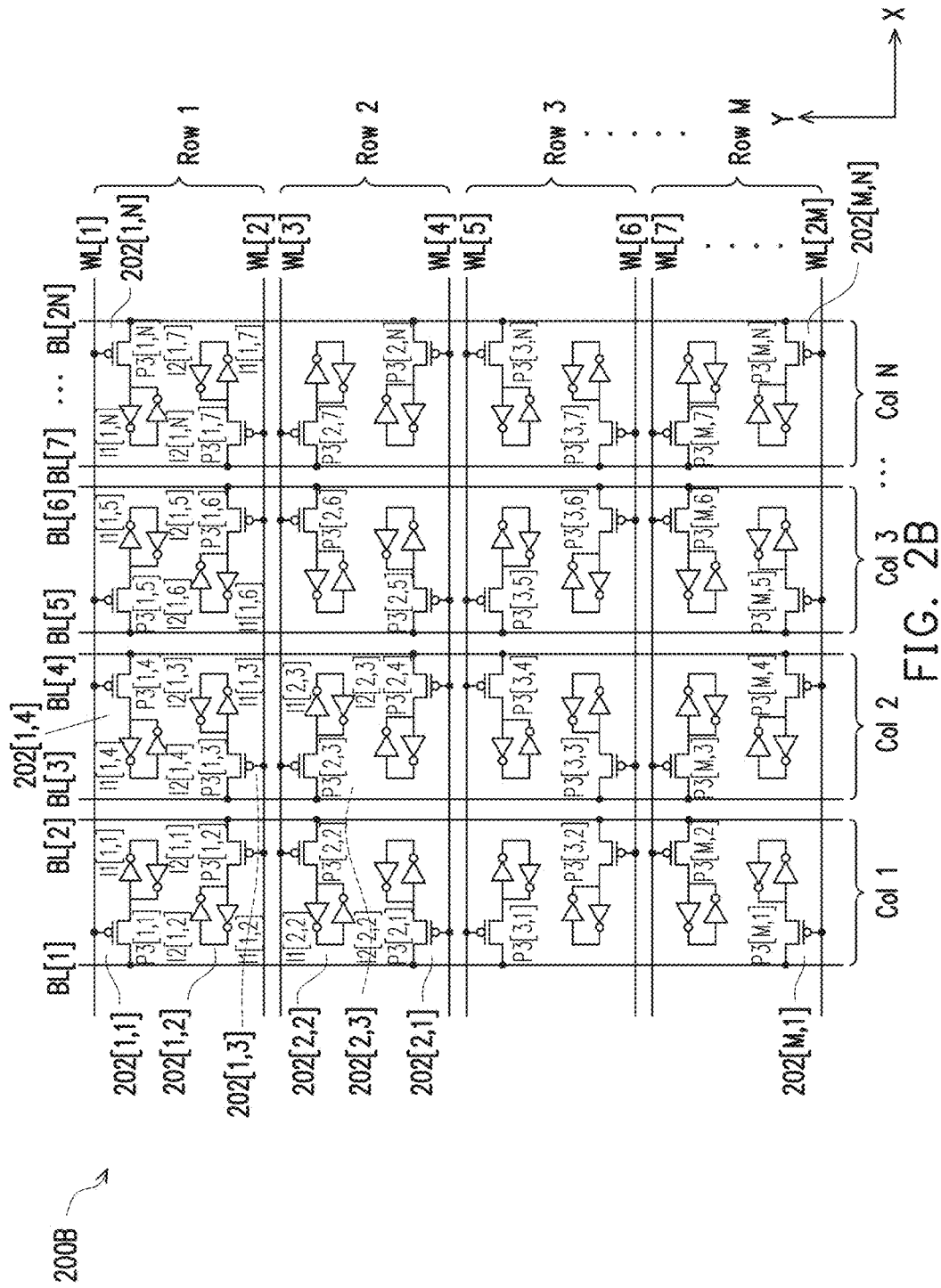
FIG. 2B is a circuit diagram of a memory cell array having a plurality of memory cells in FIG. 1, in accordance with some embodiments.

A bit line of the set of bit lines BL in array of memory cells 202A or array of memory cells 202B of FIG. 2B corresponds to bit line BL1 of FIG. 1.

In some embodiments, a pair of memory cells of array of memory cells 202A are positioned between a pair of bit lines of bit lines BL. For example, in row 1 and column 1 of memory cell array 200A, memory cell 202[1,1] and memory cell 202[1,2] are each positioned between bit line BL[1] and BL[2]. Similarly, in row 1 and column 2 of memory cell array 200A, memory cell 202[1,3] and memory cell 202[1,4] are each positioned between bit line BL[3] and BL[4].

Memory cell array 200A further includes 2M word lines WL[1], . . . WL[2M](collectively referred to as "word line WL"). Each word line WL extends in the first direction X and is over a row of cells (e.g., row 1, . . . , M). Each row 1, . . . , M in array of memory cells 202A is overlapped by a pair of word lines WL[1], . . . , WL[2M]. For example, word line WL[1] and WL[2] each overlap row 1 of array of memory cells 202A. Similarly, word line WL[3] and WL[4] each overlap row 2 of array of memory cells 202A and word line WL[7] and WL[2M] each overlap row M of array of memory cells 202A.

A word line of the set of word lines WL in array of memory cells 202A or array of memory cells 202B of FIG. 2B corresponds to word line WL1 of FIG. 1.

In some embodiments, each row of memory cells of array of memory cells 202A are positioned between a pair of word lines of word lines WL. For example, in row 1 of memory cell array 200A, memory cells 202[1,1], 202[1,2], . . . , 202[1,N] are positioned between word line WL[1] and WL[2]. Similarly, in row 2 of memory cell array 200A, memory cells 202[2,1], 202[2,2], . . . , 202[2,N] are positioned between word line WL[3] and WL[4].

Each memory cell in the array of memory cells 202A is coupled to a corresponding bit line of bit lines BL and a corresponding word line of word lines WL. For example, memory cell 202[1,1] is coupled to bit line BL[1] and word line WL[1]. Similarly, memory cell 202[1,2] is coupled to bit line BL[2] and word line WL[2], memory cell 202[1,3] is coupled to bit line BL[3] and word line WL[2], memory cell 202[2,1] is coupled to bit line BL[1] and word line WL[4], and memory cell 202[2,2] is coupled to bit line BL[2] and word line WL[3].

Memory cells of the array of memory cells 202A are grouped into a first set of memory cells 204 and a second set of memory cells 206.

The first set of memory cells 204 includes memory cells 204a, 204b, . . . , 204i.

The second set of memory cells 206 includes memory cells 206a, 206b, 206c and 206d.

In some embodiments, the memory cells of the first set of memory cells 204 correspond to memory cells of a first layout design type (e.g., layout designs 300A-300B of FIGS. 3A-3B), and the second set of memory cells 206 correspond to memory cells of a second layout design type (e.g., layout designs 400A-400B of FIGS. 4A-4B) different from the first layout design type.

Figure 3A:
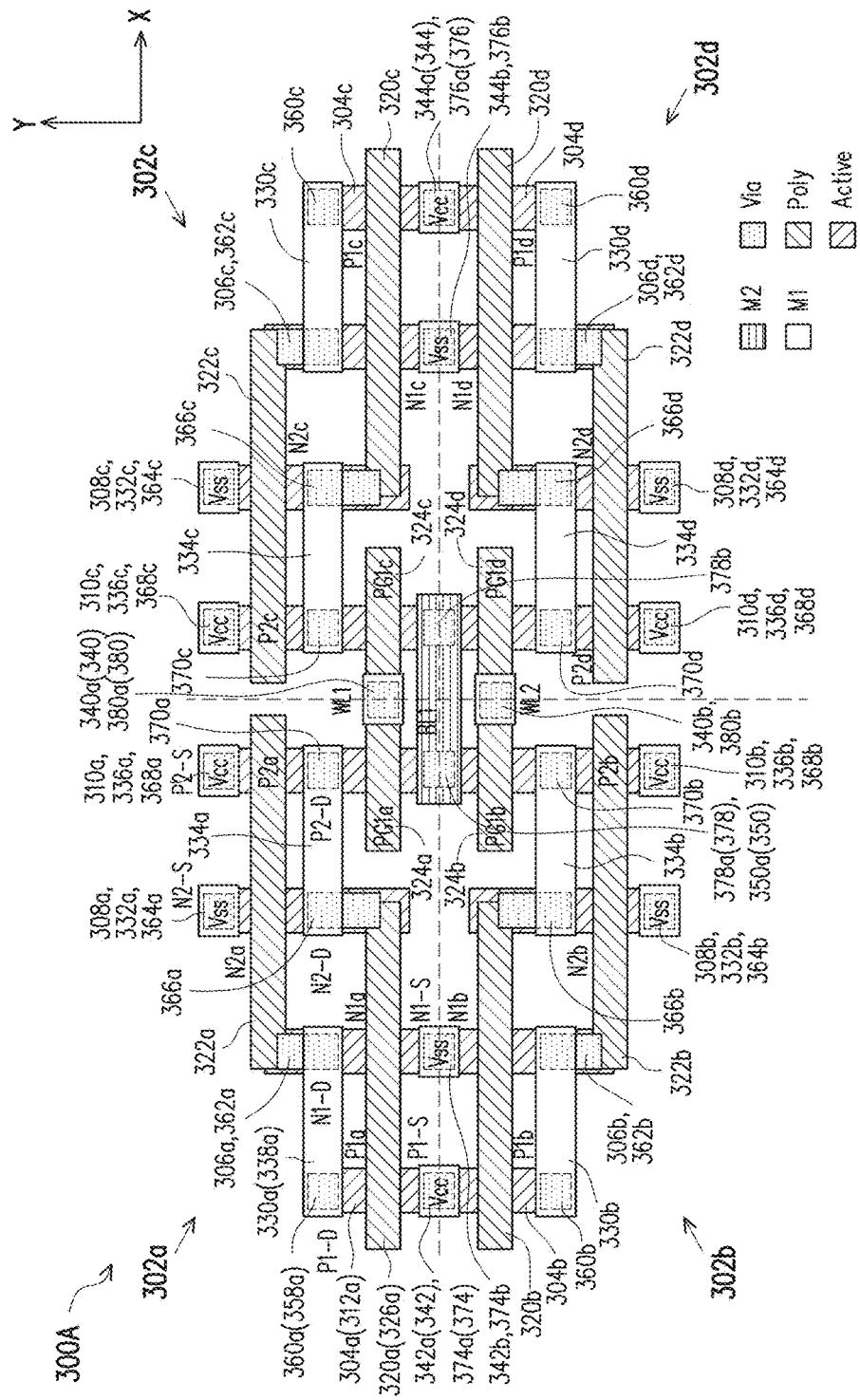
FIG. 3A is a diagram of a layout design, in accordance with some embodiments.
Figure 3B:
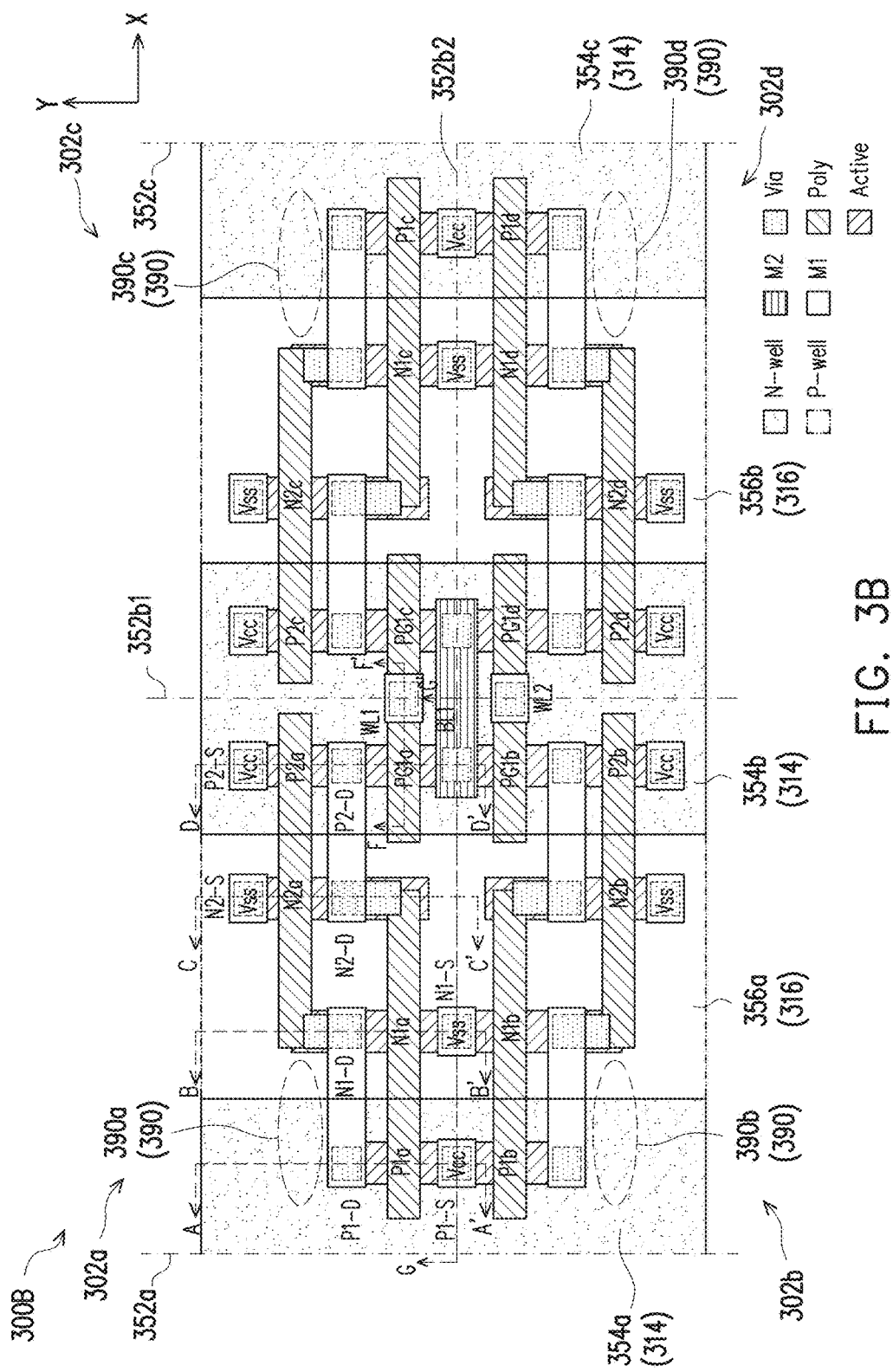
FIG. 3B is a diagram of a layout design, in accordance with some embodiments.

In some embodiments, the memory cells of the first set of memory cells 204 correspond to memory cells of the second layout design type (e.g., layout designs 400A-400B of FIGS. 4A-4B), and the second set of memory cells 206 correspond to memory cells of the first layout design type (e.g., layout designs 300A-300B of FIGS. 3A-3B).

FIG. 2B is a circuit diagram of a memory cell array 200B having a plurality of memory cells in FIG. 1, in accordance with some embodiments. Memory cell array 200B is an embodiment of the block diagram of memory cell array 200A of FIG. 2A expressed in a circuit diagram. Memory cell 100 of FIG. 1 is usable as one or more memory cells in memory cell array 200B.

In comparison with memory cell array 200A of FIG. 2A, array of memory cells 202B of memory cell array 200B replace array of memory cells 202A of FIG. 2A. Array of memory cells 202B is an embodiment of the array of memory cells 202A of FIG. 2A.

Each memory cell in the array of memory cells 202B comprises a corresponding PMOS transistor P3[1,1], P3[1,2] . . . , P[M,N] of a set of PMOS transistors 210 (not labelled) coupled to each of a corresponding inverter I1[1,1], I1[1,2], . . . , I1[M,N] of a first set of inverters 212 (not labelled) and a corresponding inverter I2[1,1], I2[1,2], . . . , I2[M,N] of a second set of inverters 214 (not labelled). The first set of inverters 212 and the second set of inverters 214 are part of a set of cross-coupled inverters 216 (not labelled).

One or more of PMOS transistors P3[1,1], P3[1,2], . . . , P3[M,N] of the set of PMOS transistors 210 in array of memory cells 202B corresponds to PMOS transistor P3 of FIG. 1.

One or more of inverters I1[1,1], I1[1,2], . . . , I1[M,N] of the first set of inverters 212 in array of memory cells 202B corresponds to PMOS transistor P2 and NMOS transistor N2 of FIG. 1.

One or more of inverters I2[1,1], I2[1,2], . . . , I2[M,N] of the second set of inverters 214 in array of memory cells 202B corresponds to PMOS transistor P1 and NMOS transistor N1 of FIG. 1.

In some embodiments, one or more memory cells of memory cell array 200A or 200B includes one or more single port (SP) SRAM cells. In some embodiments, one or more memory cells of memory cell array 200A or 200B includes one or more dual port (DP) SRAM cells. Different types of memory cells in memory cell array 200A or 200B are within the contemplated scope of the present disclosure. Different configurations of array of memory cells 202A or 202B are within the contemplated scope of the present disclosure. Different configurations of bit lines BL or word lines WL in array of memory cells 202A or 202B are within the contemplated scope of the present disclosure.

In some embodiments, memory cell array 200A-200B includes an array of 5T SRAM cells (FIG. 1) causing memory cell array 200A-200B to include less transistors than other memory cell arrays. In some embodiments, by memory cell array 200A-200B including less transistors, memory cell array 200A-200B occupies less area than other memory cell arrays. In some embodiments, by occupying less area than other memory cell arrays, memory cell array 200A-200B is denser and has a larger memory capacity compared with other approaches.

FIG. 3A is a diagram of a layout design 300A, in accordance with some embodiments. Layout design 300A corresponds to a layout diagram of a portion of memory cell array 200A-200B of FIGS. 2A-2B. For example, layout design 300A corresponds to a layout design of one or more memory cells 206a, 206b, 206c or 206d of the second set of memory cells 206 of FIGS. 2A-2B.

Components that are the same or similar to those in one or more of FIGS. 3B, 4A-4B and 6-8 (shown below) are given the same reference numbers, and detailed description thereof is thus omitted.

Structural relationships including alignment, lengths and widths, as well as configurations of layout design 400A-400B (FIGS. 4A-4B), layout design 600 (FIG. 6), layout design 700 (FIG. 7) or layout design 800 (FIG. 8) are similar to the structural relationships and configurations of layout design 300A or 300B of FIGS. 3A-3B, and will not be described in FIGS. 4A-4B, and 6-8 for brevity.

Layout design 300A is usable to manufacture integrated circuit 500A (FIGS. 5A-5H).

Layout design 300A corresponds to a layout design of memory cells 202[1,2], 202[1,3], 202[2,2] and 202[2,3] of FIGS. 2A-2B. In some embodiments, layout design 300A corresponds to a layout design of memory cells 202[1,6], 202[1,7], 202[2,6] and 202[2,7] of FIGS. 2A-2B. In some embodiments, layout design 300A corresponds to a layout design of memory cells 202[3,2], 202[3,3], 202[4,2] and 202[4,3] of FIGS. 2A-2B. In some embodiments, layout design 300A corresponds to a layout design of memory cells 202[3,6], 202[3,7], 202[4,6] and 202[4,7] of FIGS. 2A-2B. In some embodiments, layout design 300A corresponds to a layout design of one or more memory cells 204a, 204b, . . . , 204i of the first set of memory cells 204 of FIGS. 2A-2B.

Layout design 300A includes a first portion 302a, a second portion 302b, a third portion 302c and a fourth portion 302d. A center of layout design 300A corresponds to a boundary between each of the first portion 302a, second portion 302b, third portion 302c and fourth portion 302d. In some embodiments, the first portion 302a corresponds to the layout design of memory cell 202[1,2], the second portion 302b corresponds to the layout design of memory cell 202[2,2], the third portion 302c corresponds to the layout design of memory cell 202[1,3], and the fourth portion 302d corresponds to the layout design of memory cell 202[2,3]. First portion 302a, second portion 302b, third portion 302c and fourth portion 302d have corresponding corner notches 390a, 390b, 390c and 390d (see FIG. 3B). Other configurations of the first portion 302a, second portion 302b, third portion 302c and fourth portion 302d are within the scope of the present disclosure.

The first portion 302a includes active region layout patterns 304a, 306a, 308a and 310a (collectively referred to as "set of active region layout patterns 312a"). Active region layout patterns 304a, 306a, 308a and 310a are useable to manufacture corresponding active regions 504a1, 506a1, 508a1, and 510a1 of integrated circuit 500A or 500B (FIGS. 5A-5H).

In some embodiments, the set of active region layout patterns 312a is referred to as an oxide definition (OD) layout pattern which defines source or drain diffusion layout patterns of layout design 300A-300B. For example, in some embodiments, active region layout pattern 304a is useable to manufacture the drain and source regions of a PMOS transistor P1a of FIGS. 3A-3B, active region layout pattern 306a is useable to manufacture the drain and source regions of an NMOS transistor N1a of FIGS. 3A-3B, active region layout pattern 308a is useable to manufacture the drain and source regions of an NMOS transistor N2a of FIGS. 3A-3B, and active region layout pattern 310a is useable to manufacture the drain and source regions of PMOS transistors P2a and PG1a of FIGS. 3A-3B. In some embodiments, PMOS transistor P1a corresponds to PMOS transistor P1 (FIG. 1), PMOS transistor P2a corresponds to PMOS transistor P2 (FIG. 1), PMOS transistor PG1a corresponds to PMOS transistor P3 (FIG. 1), NMOS transistor N1a corresponds to NMOS transistor N1 (FIG. 1), and NMOS transistor N2a corresponds to NMOS transistor N2 (FIG. 1).

Figure 4A:
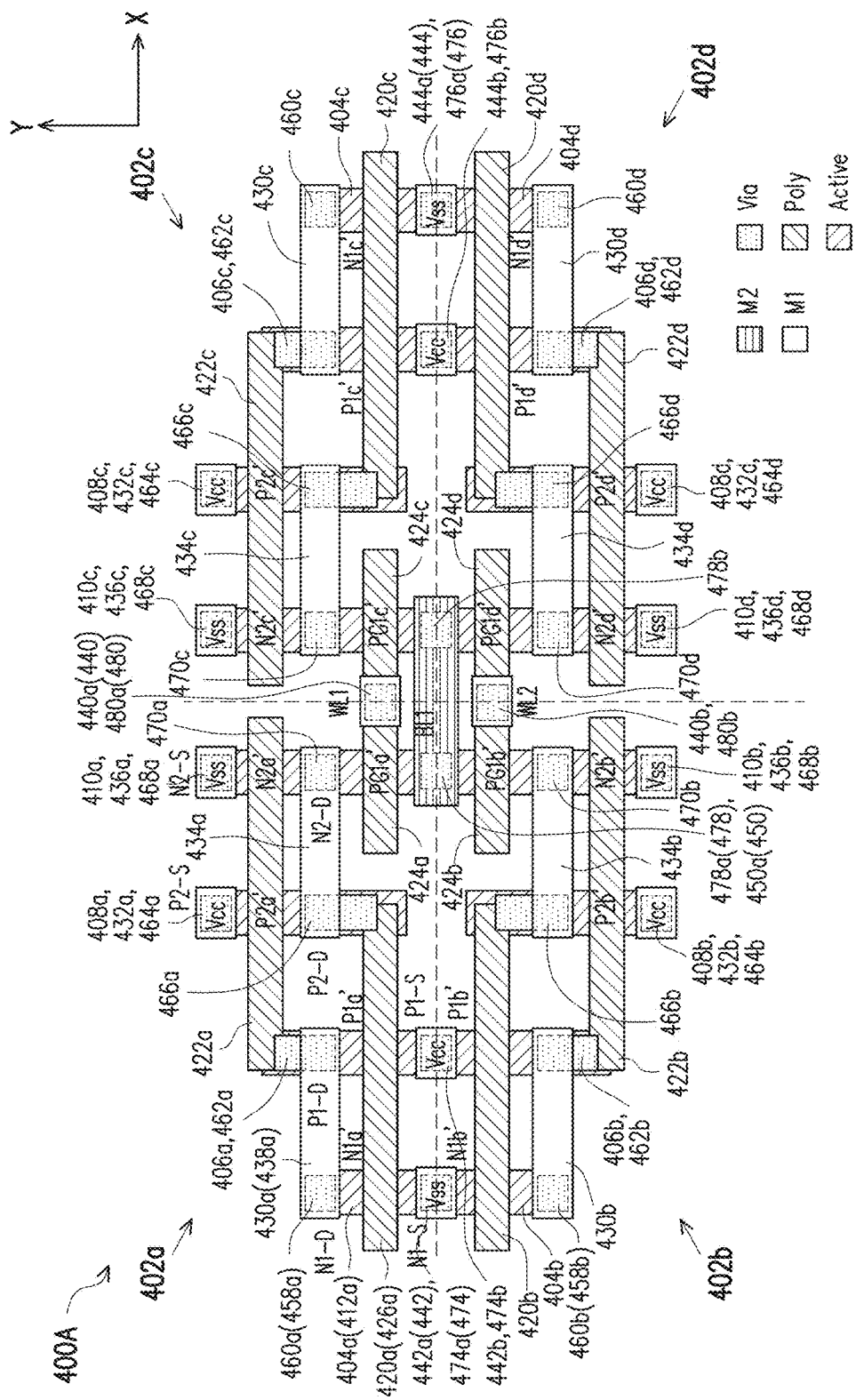
FIG. 4A is a diagram of a layout design, in accordance with some embodiments.
Figure 4B:
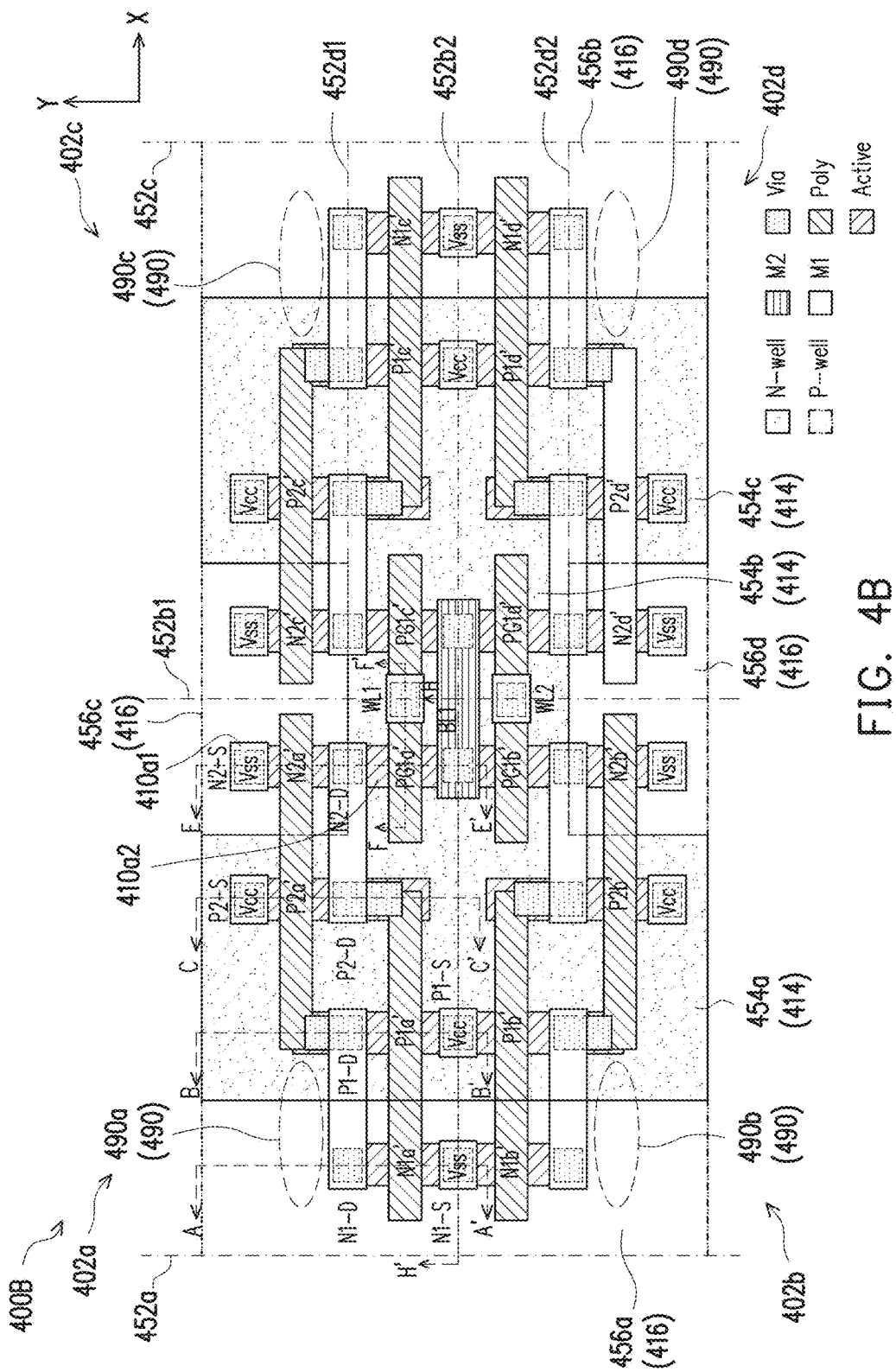
FIG. 4B is a diagram of a layout design, in accordance with some embodiments.

Each of the layout patterns of the set of active region layout patterns 312a is separated from an adjacent layout pattern of the set of active region layout patterns 312a in a first direction X by a first pitch (not labelled). In some embodiments, an adjacent element is directly next to another element. Each of the layout patterns of the set of active region layout patterns 312a extend in a second direction Y different from the first direction X and is located on a first layout level. In some embodiments, the first layout level corresponds to the active region of layout design 300A-300B or 400A-400B (FIGS. 4A-4B).

Active region layout pattern 304a is adjacent or directly next to a first side of the first portion 302a of layout design 300A and a corner notch 390a. Active region layout pattern 310a is adjacent or directly next to a second side of the first portion 302a of layout design 300A. The second side of the first portion 302a of layout design 300A is opposite from the first side of the first portion 302a of layout design 300A. In some embodiments, active region layout pattern 306a is adjacent to corner notch 390a. In some embodiments, the active region layout pattern 304a extends from a side of layout design 300A to the corner notch 390a of the layout design. In some embodiments, the active region layout pattern 304a and 304b extends from notch 390a to notch 390b. In some embodiments, the active region layout pattern 304b extends from the side of layout design 300A to the corner notch 390b of the layout design. In some embodiments, the active region layout pattern 304c extends from a side of layout design 300A to the corner notch 390c of the layout design. In some embodiments, the active region layout pattern 304c and 304d extends from notch 390c to notch 390d. In some embodiments, the active region layout pattern 304d extends from the side of layout design 300A to the corner notch 390d of the layout design.

In some embodiments, a length of active region layout pattern 304a in the second direction Y is different from a length of active region layout pattern 310a in the second direction Y. In some embodiments, a length of active region layout pattern 306a in the second direction Y is different from a length of active region layout pattern 308a in the second direction Y. In some embodiments, a length of active region layout pattern 306a in the second direction Y is the same as the length of active region layout pattern 308a in the second direction Y. Other quantities or configurations of the set of active region layout patterns 312a are within the scope of the present disclosure.

The first portion 302a further includes gate layout patterns 320a, 322a and 324a (collectively referred to as "set of gate layout patterns 326a"). In some embodiments, gate layout patterns 320a, 322a and 324a are usable to manufacture corresponding gate structures 520a, 522a and 524a of integrated circuit 500A-500B (FIGS. 5A-5H). In some embodiments, gate layout pattern 320a is useable to manufacture gate regions of PMOS transistor P1a and NMOS transistor N1a, gate layout pattern 322a is useable to manufacture gate regions of NMOS transistor N2a and PMOS transistor P2a, and gate layout pattern 324a is useable to manufacture a gate region of PMOS transistor PG1a. In some embodiments, gate layout pattern 322a is adjacent to corner notch 390a.

In some embodiments, each gate layout pattern of the set of gate layout patterns 326a extends in the first direction X and overlaps the set of active region layout patterns 312a. The set of gate layout patterns 326a is positioned on a second layout level different from the first layout level. In some embodiments, the second layout level corresponds to the POLY level of layout design 300A-300B or 400A-400B (FIGS. 4A-4B). The set of active region layout patterns 312a is below the set of gate layout patterns 326a. Other quantities or configurations of the set of gate layout patterns 326a are within the scope of the present disclosure.

The first portion 302a further includes conductive feature layout patterns 330a, 332a, 334a and 336a (collectively referred to as "set of conductive feature layout patterns 338a"). In some embodiments, conductive feature layout patterns 330a, 332a, 334a and 336a are usable to manufacture corresponding conductive structures 530a, 532a, 534a and 536a of integrated circuit 500A-500B (FIGS. 5A-5H).

In some embodiments, the set of conductive feature layout patterns 338a extends in the first direction X, and is over at least the set of active region layout patterns 312a or the set of gate layout patterns 326a. Conductive feature layout pattern 330a overlaps active region layout patterns 304a and 306a. Conductive feature layout pattern 334a overlaps active region layout patterns 308a and 310a. Conductive feature layout patterns 332a, 336a are over corresponding active region layout patterns 308a, 310a. In some embodiments, conductive feature layout pattern 330a is adjacent to corner notch 390a.

In some embodiments, each conductive feature layout pattern of the set of conductive feature layout patterns 338a is separated from an adjacent layout pattern of the set of conductive feature layout patterns 338a in at least the first direction X or the second direction Y. The set of conductive feature layout patterns 338a is on a third layout level different from the first layout level and the second layout level. In some embodiments, the third layout level corresponds to the metal one (M1) level of layout design 300A-300B or 400A-400B (FIGS. 4A-4B). Other quantities or configurations of the set of conductive feature layout patterns 338a are within the scope of the present disclosure.

The first portion 302a further includes via layout patterns 360a, 362a, 364a, 366a, 368a, 370a (collectively referred to as "set of via layout patterns 358a"). In some embodiments, via layout patterns 360a, 362a, 364a, 366a, 368a, 370a are usable to manufacture corresponding vias 560a, 562a, 564a, 566a, 568a, 570a of integrated circuit 500A-500B (FIGS. 5A-5H).

In some embodiments, each via layout pattern of the set of via layout patterns 358a is located where each conductive feature layout pattern of the set of conductive feature layout patterns 338a overlaps each active region layout pattern of the set of active region layout patterns 312a. The set of via layout patterns 358a are between the set of conductive feature layout patterns 338a and the set of active region layout patterns 312a. In some embodiments, the set of via layout patterns 358a are on at least the via zero (V0) level of layout design 300A-300B or 400A-400B (FIGS. 4A-4B). In some embodiments, the V0 level is between the third layout level and the first or second layout level of layout design 300A-300B or 400A-400B (FIGS. 4A-4B). In some embodiments, the first portion 302a of layout design 300A is usable to fabricate memory cell 202[1,2], 202[1,6], 202[3,2] or 202[3,6] of the second set of memory cells 206 of memory cell array 200A or 200B. Other quantities or configurations of the set of via layout patterns 358a are within the scope of the present disclosure.

The second portion 302b includes active region layout patterns 304b, 306b, 308b and 310b (collectively referred to as "set of active region layout patterns 312b"), gate layout patterns 320b, 322b and 324b (collectively referred to as "set of gate layout patterns 326b"), conductive feature layout patterns 330b, 332b, 334b and 336b (collectively referred to as "set of conductive feature layout patterns 338b") and via layout patterns 360b, 362b, 364b, 366b, 368b, 370b (collectively referred to as "set of via layout patterns 358b").

In some embodiments, the first portion 302a and the second portion 302b of layout design 300A-300B are mirror images of each other with respect to the second direction Y, and similar detailed description is therefore omitted.

In some embodiments, active region layout patterns 304b, 306b, 308b and 310b are useable to manufacture active regions similar to corresponding active regions 504a1, 506a1, 508a1, and 510a1 of integrated circuit 500A or 500B (FIGS. 5A-5H). In some embodiments, gate layout patterns 320b, 322b and 324b are usable to manufacture gate structures similar to corresponding gate structures 520a, 522a and 524a of integrated circuit 500A-500B (FIGS. 5A-5H). In some embodiments, conductive feature layout patterns 330b, 332b, 334b and 336b are usable to manufacture conductive structures similar to corresponding conductive structures 530a, 532a, 534a and 536a of integrated circuit 500A-500B (FIGS. 5A-5H). In some embodiments, via layout patterns 360b, 362b, 364b, 366b, 368b, 370b are usable to manufacture vias similar to corresponding vias 560a, 562a, 564a, 566a, 568a, 570a of integrated circuit 500A-500B (FIGS. 5A-5H).

In some embodiments, active region layout patterns 304a and 304b are part of a same continuous active region layout pattern. In some embodiments, active region layout patterns 308a and 308b are part of a same continuous active region layout pattern. In some embodiments, active region layout patterns 310a and 310b are part of a same continuous active region layout pattern.

In some embodiments, the second portion 302b of layout design 300A is usable to fabricate memory cell 202[2,2], 202[2,6], 202[M,2] or 202[M,6] of the second set of memory cells 206 of memory cell array 200A or 200B.

The third portion 302c includes active region layout patterns 304c, 306c, 308c and 310c (collectively referred to as "set of active region layout patterns 312c"), gate layout patterns 320c, 322c and 324c (collectively referred to as "set of gate layout patterns 326c"), conductive feature layout patterns 330c, 332c, 334c and 336c (collectively referred to as "set of conductive feature layout patterns 338c") and via layout patterns 360c, 362c, 364c, 366c, 368c, 370c (collectively referred to as "set of via layout patterns 358c").

In some embodiments, the first portion 302a and the third portion 302c of layout design 300A-300B are mirror images of each other with respect to the first direction X, and similar detailed description is therefore omitted.

In some embodiments, active region layout patterns 304c, 306c, 308c and 310c are useable to manufacture active regions similar to corresponding active regions 504a1, 506a1, 508a1, and 510a1 of integrated circuit 500A or 500B (FIGS. 5A-5H). In some embodiments, gate layout patterns 320c, 322c and 324c are usable to manufacture gate structures similar to corresponding gate structures 520a, 522a and 524a of integrated circuit 500A-500B (FIGS. 5A-5H). In some embodiments, conductive feature layout patterns 330c, 332c, 334c and 336c are usable to manufacture conductive structures similar to corresponding conductive structures 530a, 532a, 534a and 536a of integrated circuit 500A-500B (FIGS. 5A-5H). In some embodiments, via layout patterns 360c, 362c, 364c, 366c, 368c, 370c are usable to manufacture vias similar to corresponding vias 560a, 562a, 564a, 566a, 568a, 570a of integrated circuit 500A-500B (FIGS. 5A-5H). In some embodiments, gate layout patterns 324a and 324c are part of a same continuous gate layout pattern.

In some embodiments, the third portion 302c of layout design 300A is usable to fabricate memory cell 202[1,3], 202[1,7], 202[3,3] or 202[3,7] of the second set of memory cells 206 of memory cell array 200A or 200B.

The fourth portion 302d includes active region layout patterns 304d, 306d, 308d and 310d (collectively referred to as "set of active region layout patterns 312d"), gate layout patterns 320d, 322d and 324d (collectively referred to as "set of gate layout patterns 326d"), conductive feature layout patterns 330d, 332d, 334d and 336d (collectively referred to as "set of conductive feature layout patterns 338d") and via layout patterns 360d, 362d, 364d, 366d, 368d, 370d (collectively referred to as "set of via layout patterns 358d").

In some embodiments, the third portion 302c and the fourth portion 302d of layout design 300A-300B are mirror images of each other with respect to the second direction Y, and similar detailed description is therefore omitted. In some embodiments, the second portion 302b and the fourth portion 302d of layout design 300A-300B are mirror images of each other with respect to the first direction X, and similar detailed description is therefore omitted.

In some embodiments, active region layout patterns 304d, 306d, 308d and 310d are useable to manufacture active regions similar to corresponding active regions 504a1, 506a1, 508a1, and 510a1 of integrated circuit 500A or 500B (FIGS. 5A-5H). In some embodiments, active region layout patterns 304b, 304c and 304d are useable to manufacture the drain and source regions of corresponding PMOS transistors P1b, P1c and P1d, active region layout patterns 306b, 306c and 306d are useable to manufacture the drain and source regions of corresponding NMOS transistors N1b, N1c and N1d, active region layout patterns 308b, 308c and 308d are useable to manufacture the drain and source regions of corresponding NMOS transistors N2b, N2c and N2d, active region layout pattern 310b is useable to manufacture the drain and source regions of PMOS transistors P2b and PG1b, active region layout pattern 310c is useable to manufacture the drain and source regions of PMOS transistors P2c and PG1c, and active region layout pattern 310d is useable to manufacture the drain and source regions of PMOS transistors P2d and PG1d.

In some embodiments, PMOS transistor P1b, P1c or P1d is similar to PMOS transistor P1 (FIG. 1), PMOS transistor P2b, P2c or P2d is similar to PMOS transistor P2 (FIG. 1), PMOS transistor PG1b, PG1c or PG1d is similar to PMOS transistor P3 (FIG. 1), NMOS transistor N1b, N1c or N1d is similar to NMOS transistor N1 (FIG. 1), and NMOS transistor N2b, N2c or N2d is similar to NMOS transistor N2 (FIG. 1).

In some embodiments, gate layout patterns 320d, 322d and 324d are usable to manufacture gate structures similar to corresponding gate structures 520a, 522a and 524a of integrated circuit 500A-500B (FIGS. 5A-5H). In some embodiments, gate layout pattern 320b is useable to manufacture gate regions of PMOS transistor P1b and NMOS transistor N1b, gate layout pattern 322b is useable to manufacture gate regions of NMOS transistor N2b and PMOS transistor P2b, gate layout pattern 320c is useable to manufacture gate regions of PMOS transistor P1c and NMOS transistor N1c, gate layout pattern 322c is useable to manufacture gate regions of NMOS transistor N2c and PMOS transistor P2c, gate layout pattern 320d is useable to manufacture gate regions of PMOS transistor P1d and NMOS transistor N1d, gate layout pattern 322d is useable to manufacture gate regions of NMOS transistor N2d and PMOS transistor P2d, and gate layout patterns 324b, 324c and 324d are useable to manufacture corresponding gate regions of PMOS transistors PG1b, PG1c and PG1d.

In some embodiments, conductive feature layout patterns 330d, 332d, 334d and 336d are usable to manufacture conductive structures similar to corresponding conductive structures 530a, 532a, 534a and 536a of integrated circuit 500A-500B (FIGS. 5A-5H). In some embodiments, via layout patterns 360d, 362d, 364d, 366d, 368d, 370d are usable to manufacture vias similar to corresponding vias 560a, 562a, 564a, 566a, 568a, 570a of integrated circuit 500A-500B (FIGS. 5A-5H).

In some embodiments, active region layout patterns 304c and 304d are part of a same continuous active region layout pattern. In some embodiments, active region layout patterns 308c and 308d are part of a same continuous active region layout pattern. In some embodiments, active region layout patterns 310c and 310d are part of a same continuous active region layout pattern.

Each of the set of active region layout patterns 312b, 312c and 312d is similar to the set of active region layout patterns 312a, and similar detailed description is therefore omitted. Each of the set of gate layout patterns 326b, 326c and 326d is similar to the set of gate layout patterns 326a, and similar detailed description is therefore omitted. Each of the set of conductive feature layout patterns 338b, 338c and 338d is similar to the set of conductive feature layout patterns 338a, and similar detailed description is therefore omitted. Each of the set of via layout patterns 358b, 358c and 358d is similar to the set of via layout patterns 358a, and similar detailed description is therefore omitted. In some embodiments, gate layout patterns 324b and 324d are part of a same continuous gate layout pattern.

In some embodiments, the fourth portion 302d of layout design 300A is usable to fabricate memory cell 202[2,3], 202[2,7], 202[M,3] or 202[M,7] of the second set of memory cells 206 of memory cell array 200A or 200B.

Other quantities or configurations of the set of active region layout patterns 312b, 312c, 312d, the set of gate layout patterns 326b, 326c, 326d, the set of conductive feature layout patterns 338b, 338c, 338d, or the set of via layout patterns 358b, 358c and 358d are within the scope of the present disclosure.

Layout design 300A further includes conductive feature layout patterns 340a, 340b (collectively referred to as "set of conductive feature layout patterns 340"). In some embodiments, conductive feature layout patterns 340a and 340b are usable to manufacture conductive structure 540a or similar conductive structures of integrated circuit 500A-500B (FIGS. 5A-5H).

In some embodiments, the set of conductive feature layout patterns 340 extends in the first direction X, and is over gate layout patterns 324a and 324b. Conductive feature layout pattern 340a is over gate layout pattern 324a. Conductive feature layout pattern 340b is over gate layout pattern 324b.

In some embodiments, each conductive feature layout pattern of the set of conductive feature layout patterns 340 is separated from an adjacent layout pattern of the set of conductive feature layout patterns 340 in at least the second direction Y. The set of conductive feature layout patterns 340 is on the third layout level.

Layout design 300A further includes conductive feature layout patterns 342a, 342b (collectively referred to as "set of conductive feature layout patterns 342"). In some embodiments, conductive feature layout patterns 342a and 342b are usable to manufacture corresponding conductive structures 542a and 542b of integrated circuit 500A-500B (FIGS. 5A-5H). In some embodiments, the set of conductive feature layout patterns 342 extends in the first direction X. Conductive feature layout pattern 342a is over active region layout patterns 304a and 304b. Conductive feature layout pattern 342b is over active region layout patterns 306a and 306b. In some embodiments, each conductive feature layout pattern of the set of conductive feature layout patterns 342 is separated from an adjacent layout pattern of the set of conductive feature layout patterns 342 in at least the first direction X. The set of conductive feature layout patterns 342 is on the third layout level.

Layout design 300A further includes conductive feature layout patterns 344a, 344b (collectively referred to as "set of conductive feature layout patterns 344"). In some embodiments, conductive feature layout patterns 344a and 344b are usable to manufacture conductive structures similar to corresponding conductive structures 542a and 542b of integrated circuit 500A-500B (FIGS. 5A-5H). In some embodiments, the set of conductive feature layout patterns 344 extends in the first direction X. Conductive feature layout pattern 344a is over active region layout patterns 304c and 304d. Conductive feature layout pattern 344b is over active region layout patterns 306c and 306d. In some embodiments, each conductive feature layout pattern of the set of conductive feature layout patterns 344 is separated from an adjacent layout pattern of the set of conductive feature layout patterns 344 in at least the first direction X. The set of conductive feature layout patterns 344 is on the third layout level.

Layout design 300A further includes at least conductive feature layout pattern 350a (collectively referred to as "set of conductive feature layout patterns 350"). In some embodiments, conductive feature layout pattern 350a is usable to manufacture conductive structure 550a of integrated circuit 500A-500B (FIGS. 5A-5H).

In some embodiments, conductive feature layout pattern 350a extends in the first direction X, and is over at least active region layout patterns 310a, 310b, 310c and 310d.

In some embodiments, each conductive feature layout pattern 350a of the set of conductive feature layout patterns (not labelled) is separated from an adjacent layout pattern of the set of conductive feature layout patterns (not labelled) in at least the first direction X or the second direction Y. The conductive feature layout pattern 350a is on a fourth layout level different from the first layout level, the second layout level and the third layout level. In some embodiments, the fourth layout level corresponds to the metal two (M2) level of layout design 300A-300B or 400A-400B (FIGS. 4A-4B).

Layout design 300A further includes via layout patterns 374a, 374b (collectively referred to as "set of via layout patterns 374"). In some embodiments, via layout patterns 374a, 374b are usable to manufacture corresponding vias 574a, 574b of integrated circuit 500A-500B (FIGS. 5A-5H). In some embodiments, each via layout pattern of the set of via layout patterns 374 is located where conductive feature layout pattern 342a overlaps active region layout patterns 304a and 304b, or where conductive feature layout pattern 342b overlaps active region layout patterns 306a and 306b. Via layout pattern 374a is between conductive feature layout pattern 342a and active region layout patterns 304a and 304b. Via layout pattern 374b is between conductive feature layout pattern 342b and active region layout patterns 306a and 306b. In some embodiments, the set of via layout patterns 374 are on at least the V0 level of layout design 300A-300B or 400A-400B (FIGS. 4A-4B).

Layout design 300A further includes via layout patterns 376a, 376b (collectively referred to as "set of via layout patterns 376"). In some embodiments, via layout patterns 376a, 376b are usable to manufacture vias similar to corresponding vias 574a, 574b of integrated circuit 500A-500B (FIGS. 5A-5H). In some embodiments, each via layout pattern of the set of via layout patterns 376 is located where conductive feature layout pattern 344a overlaps active region layout patterns 304c and 304d, or where conductive feature layout pattern 344b overlaps active region layout patterns 306c and 306d. Via layout pattern 376a is between conductive feature layout pattern 344a and active region layout patterns 304c and 304d. Via layout pattern 376b is between conductive feature layout pattern 344b and active region layout patterns 306c and 306d. In some embodiments, the set of via layout patterns 376 are on at least the V0 level of layout design 300A-300B or 400A-400B (FIGS. 4A-4B).

Layout design 300A further includes via layout patterns 378a, 378b (collectively referred to as "set of via layout patterns 378"). In some embodiments, via layout patterns 378a, 378b are usable to manufacture via 578a or similar to via 578a of integrated circuit 500A-500B (FIGS. 5A-5H). In some embodiments, the set of via layout patterns 378 is located where conductive feature layout pattern 350a overlaps active region layout patterns 310a, 310b, 310c and 310d. Via layout pattern 378a is between conductive feature layout pattern 350a and active region layout patterns 310a and 310b. Via layout pattern 378b is between conductive feature layout pattern 350a and active region layout patterns 310c and 310d. In some embodiments, the set of via layout patterns 378 are on at least the via one (V1) level of layout design 300A-300B or 400A-400B (FIGS. 4A-4B). In some embodiments, the V1 level is between the third layout level and the fourth layout level of layout design 300A-300B or 400A-400B (FIGS. 4A-4B).

Layout design 300A further includes via layout patterns 380a, 380b (collectively referred to as "set of via layout patterns 380"). In some embodiments, via layout patterns 380a, 380b are usable to manufacture via 580a or vias similar to via 580a of integrated circuit 500A-500B (FIGS. 5A-5H). In some embodiments, via layout pattern 380a is located where conductive feature layout pattern 340a overlaps gate layout patterns 324a and 324c. In some embodiments, via layout pattern 380b is located where conductive feature layout pattern 340b overlaps gate layout patterns 324b and 324d. Via layout pattern 380a is between conductive feature layout pattern 340a and gate layout patterns 324a and 324c. Via layout pattern 380b is between conductive feature layout pattern 340b and gate layout patterns 324b and 324d. In some embodiments, the set of via layout patterns 380 are on at least the via over gate (VG) level of layout design 300A-300B or 400A-400B (FIGS. 4A-4B). In some embodiments, the VG level is between the third layout level and the second layout level of layout design 300A-300B or 400A-400B (FIGS. 4A-4B).

Other quantities or configurations of conductive feature layout patterns 340a, 340b, 342a, 342b, 344a, 344b or 350a, or via layout patterns 374a, 374b, 376a, 376b, 378a, 378b, 380a or 380b are within the scope of the present disclosure.

In some embodiments, layout design 300A-300B has a non-rectangular shape which results in a smaller standard cell than other designs. In some embodiments, by having a smaller standard cell, layout design 300A-300B can be utilized to manufacture integrated circuits that are smaller than other integrated circuits.

FIG. 3B is a diagram of a layout design 300B, in accordance with some embodiments.

Layout design 300B is usable to manufacture integrated circuit 500A (FIGS. 5A-5H). Layout design 300B is a variation of layout design 300A of FIG. 3A. In comparison with layout design 300A of FIG. 3A, layout design 300B further includes a first well layout pattern 314 and a second well layout pattern 316.

First well layout pattern 314 extends in the second direction Y, and is located on a fifth layout level. First well layout pattern 314 is useable to manufacture a first well 501 (e.g., at least portions 501a, 501b) of integrated circuit 500A (FIGS. 5A-5H). In some embodiments, the fifth layout level is different from the first layout level, the second layout level, the third layout level and the fourth layout level. In some embodiments, the fifth layout level corresponds to the well level of layout design 300A-300B or 400A-400B (FIGS. 4A-4B). In some embodiments, a portion of the fifth layout level includes the first layout level. First well layout pattern 314 includes layout patterns 354a, 354b and 354c.

Layout pattern 354a extends in the second direction Y and is below active region layout patterns 304a and 304b. Layout pattern 354a is adjacent to a side 352a of the first portion 302a or the second portion 302b of layout design 300B, and corner notches 390a and 390b. Layout pattern 354a is useable to manufacture portion 501a of first well 501 of integrated circuit 500A (FIGS. 5A-5H). Layout pattern 354a has a width W1 (not labelled) in the first direction X.

Layout pattern 354b extends in the second direction Y and is below active region layout patterns 310a, 310b, 310c and 310d. Layout pattern 354b is positioned over centerlines 352b1 and 352b2 of layout design 300B. In some embodiments, a center of layout pattern 354b is aligned with the centerlines 352b1 and 352b2 of layout design 300B. Layout pattern 354b is useable to manufacture at least portion 501b of the first well 501 of integrated circuit 500A (FIGS. 5A-5H). Layout pattern 354b has a width W2 (not labelled) in the first direction X.

Layout pattern 354c extends in the second direction Y and is below active region layout patterns 304c and 304d. Layout pattern 354c is adjacent to a side 352c of the third portion 302c or the fourth portion 302d of layout design 300B, and corner notches 390c and 390d. Layout pattern 354c is useable to manufacture a portion of first well 501 similar to portion 501a. Layout pattern 354c has width W1 (not labelled) in the first direction X.

Second well layout pattern 316 extends in the second direction Y, and is located on the fifth layout level. Second well layout pattern 316 is useable to manufacture a second well 501' (e.g., at least portion 501c) of integrated circuit 500A (FIGS. 5A-5H).

Second well layout pattern 316 includes layout patterns 356a and 356b.

Layout pattern 356a extends in the second direction Y and is below active region layout patterns 306a, 306b, 308a and 308b. Layout pattern 356a is between layout patterns 354a and 354b. Layout pattern 356a is useable to manufacture portion 501c of second well 501' of integrated circuit 500A (FIGS. 5A-5H). Layout pattern 356a has a width W3 (not labelled) in the first direction X.

Layout pattern 356b extends in the second direction Y and is below active region layout patterns 306c, 306d, 308c and 308d. Layout pattern 356b is between layout patterns 354b and 354c. Layout pattern 356b is useable to manufacture a portion of second well 501' similar to portion 501c of integrated circuit 500A (FIGS. 5A-5H). Layout pattern 356b has width W3 (not labelled) in the first direction X.

In some embodiments, width W1, W2 or W3 is the same as another width of width W1, W2 or W3. In some embodiments, width W1, W2 or W3 is different from another width of width W1, W2 or W3.

Other configurations or quantities of first well layout pattern 314 or second well layout pattern 316 are within the scope of the present disclosure. Other configurations or quantities of layout patterns 354a, 354b, 354c, 356a or 356b are within the scope of the present disclosure.

FIG. 4A is a diagram of a layout design 400A, in accordance with some embodiments. Layout design 400A corresponds to a layout diagram of a portion of memory cell array 200A-200B of FIGS. 2A-2B. For example, layout design 400A corresponds to a layout design of one or more memory cells 204a, 204b, . . . , 204i of the first set of memory cells 204 of FIGS. 2A-2B.

Layout design 400A is similar to layout design 300A (FIG. 3A). Similar elements have a same reference number increased by 100.

Layout design 400A is usable to manufacture integrated circuit 500B (FIGS. 5A-51H).

Layout design 400A corresponds to a layout design of memory cells 202[2,4], 202[2,5], 202[3,4] and 202[3,5] of FIGS. 2A-2B. For example, in some embodiments, the first portion 402a corresponds to the layout design of memory cell 202[2,4] of FIGS. 2A-2B, the second portion 402b corresponds to the layout design of memory cell 202[3,4] of FIGS. 2A-2B, the third portion 402c corresponds to the layout design of memory cell 202[2,5] of FIGS. 2A-2B, and the fourth portion 402d corresponds to the layout design of memory cell 202[3,5] of FIGS. 2A-2B. First portion 402a, second portion 402b, third portion 402c and fourth portion 402d have corresponding corner notches 490a, 490b, 490c and 490d (see FIG. 4B). Corner notches 490a, 490b, 490c and 490d are similar to corresponding corner notches 390a, 390b, 390c and 390d, and similar detailed description is therefore omitted. In some embodiments, layout design 400A corresponds to a layout design of memory cells 206a, 206b, 206c or 206d of the second set of memory cells 206 of FIGS. 2A-2B.

In some embodiments, the first portion 402a of layout design 400A is usable to fabricate memory cell 202[2,4], 202[2,N], 202[M,4] or 202[M,N] of the first set of memory cells 204 of memory cell array 200A or 200B.

In some embodiments, the second portion 402b of layout design 400A is usable to fabricate memory cell 202[1,4], 202[1,N], 202[3,4] or 202[3,N] of the first set of memory cells 204 of memory cell array 200A or 200B.

In some embodiments, the third portion 402c of layout design 400A is usable to fabricate memory cell 202[2,1], 202[2,5], 202[M,1] or 202[M,5] of the first set of memory cells 204 of memory cell array 200A or 200B.

In some embodiments, the fourth portion 402d of layout design 400A is usable to fabricate memory cell 202[1,1], 202[1,5], 202[3,1] or 202[3,5] of the first set of memory cells 204 of memory cell array 200A or 200B.

Active region layout patterns 404a, 406a, 408a and 410a (collectively referred to as "set of active region layout patterns 412a") are useable to manufacture corresponding active regions 504a2, 506a2, 508a2, 510e of integrated circuit 500B (FIGS. 5A-5H). In some embodiments, set of active region layout patterns 412a is referred to as OD layout patterns which define source or drain diffusion layout patterns of layout design 400A-400B. For example, in some embodiments, active region layout pattern 404a is useable to manufacture the drain and source regions of NMOS transistor N1a' of FIGS. 4A-4B, active region layout pattern 406a is useable to manufacture the drain and source regions of PMOS transistor P1a' of FIGS. 4A-4B, active region layout pattern 408a is useable to manufacture the drain and source regions of PMOS transistor P2a' of FIGS. 4A-4B, and active region layout pattern 410a is useable to manufacture the drain and source regions of NMOS transistor N2a' and the drain and source regions of PMOS transistor PG1a' of FIGS. 4A-4B.

In some embodiments, active region layout patterns 404b, 406b, 408b and 410b (collectively referred to as "set of active region layout patterns 412b") are useable to manufacture active regions similar to corresponding active regions 504a2, 506a2, 508a2, and 510e of integrated circuit 500B (FIGS. 5A-5H). In some embodiments, active region layout patterns 404c, 406c, 408c and 410c (collectively referred to as "set of active region layout patterns 412c") are useable to manufacture active regions similar to corresponding active regions 504a2, 506a2, 508a2, and 510e of integrated circuit 500B (FIGS. 5A-5H). In some embodiments, active region layout patterns 404d, 406d, 408d and 410d (collectively referred to as "set of active region layout patterns 412d") are useable to manufacture active regions similar to corresponding active regions 504a2, 506a2, 508a2, and 510e of integrated circuit 500B (FIGS. 5A-5H).

In some embodiments, active region layout patterns 404b, 404c and 404d are useable to manufacture the drain and source regions of corresponding NMOS transistors N1b', N1c' and N1d', active region layout patterns 406b, 406c and 406d are useable to manufacture the drain and source regions of corresponding PMOS transistors P1b', P1c' and P1d', active region layout patterns 408b, 408c and 408d are useable to manufacture the drain and source regions of corresponding PMOS transistors P2b', P2c' and P2d', active region layout pattern 410b is useable to manufacture the drain and source regions of NMOS transistors N2b' and the drain and source regions of PMOS transistor PG1b', active region layout pattern 410c is useable to manufacture the drain and source regions of NMOS transistors N2c' and the drain and source regions of PMOS transistor PG1c', and active region layout pattern 410d is useable to manufacture the drain and source regions of NMOS transistors N2d' and the drain and source regions of PMOS transistor PG1d'.

In some embodiments, gate layout patterns 420a, 422a and 424a (collectively referred to as "set of gate layout patterns 426a") are usable to manufacture corresponding gate structures 520a, 522a and 524a of integrated circuit 500B (FIGS. 5A-5H). In some embodiments, gate layout pattern 420a is useable to manufacture gate regions of NMOS transistor N1a' and PMOS transistor P1a', gate layout pattern 422a is useable to manufacture gate regions of NMOS transistor N2a' and PMOS transistor P2a', and gate layout pattern 424a is useable to manufacture a gate region of PMOS transistor PG1a'.

In some embodiments, gate layout patterns 420b, 422b and 424b (collectively referred to as "set of gate layout patterns 426b") are usable to manufacture gate structures similar to corresponding gate structures 520a, 522a and 524a of integrated circuit 500B (FIGS. 5A-5H). In some embodiments, gate layout patterns 420c, 422c and 424c (collectively referred to as "set of gate layout patterns 426c") are usable to manufacture gate structures similar to corresponding gate structures 520a, 522a and 524a of integrated circuit 500B (FIGS. 5A-5H). In some embodiments, gate layout patterns 420d, 422d and 424d (collectively referred to as "set of gate layout patterns 426d") are usable to manufacture gate structures similar to corresponding gate structures 520a, 522a and 524a of integrated circuit 500B (FIGS. 5A-5H).

In some embodiments, gate layout pattern 420b is useable to manufacture gate regions of PMOS transistor P1b' and NMOS transistor N1b', gate layout pattern 422b is useable to manufacture gate regions of NMOS transistor N2b' and PMOS transistor P2b', gate layout pattern 420c is useable to manufacture gate regions of PMOS transistor P1c' and NMOS transistor N1c', gate layout pattern 422c is useable to manufacture gate regions of NMOS transistor N2c' and PMOS transistor P2c', gate layout pattern 420d is useable to manufacture gate regions of PMOS transistor P1d' and NMOS transistor N1d', gate layout pattern 422d is useable to manufacture gate regions of NMOS transistor N2d' and PMOS transistor P2d', and gate layout patterns 424b, 424c and 424d are useable to manufacture corresponding gate regions of PMOS transistors PG1b', PG1c' and PG1d'.

In some embodiments, conductive feature layout patterns 430a, 432a, 434a and 436a (collectively referred to as "set of conductive feature layout patterns 438a") are usable to manufacture corresponding conductive structures 530a, 532a, 534b and 536b of integrated circuit 500B (FIGS. 5A-5H). In some embodiments, conductive feature layout patterns 430b, 432b, 434b and 436b (collectively referred to as "set of conductive feature layout patterns 438b") are usable to manufacture conductive structures similar to corresponding conductive structures 530a, 532a, 534b and 536b of integrated circuit 500B (FIGS. 5A-5H). In some embodiments, conductive feature layout patterns 430c, 432c, 434c and 436c (collectively referred to as "set of conductive feature layout patterns 438c") are usable to manufacture conductive structures similar to corresponding conductive structures 530a, 532a, 534b and 536b of integrated circuit 500B (FIGS. 5A-5H). In some embodiments, conductive feature layout patterns 430d, 432d, 434d and 436d (collectively referred to as "set of conductive feature layout patterns 438d") are usable to manufacture conductive structures similar to corresponding conductive structures 530a, 532a, 534b and 536b of integrated circuit 500B (FIGS. 5A-5H).

In some embodiments, via layout patterns 460a, 462a, 464a, 466a, 468a, 470a (collectively referred to as "set of via layout patterns 458a") are usable to manufacture corresponding vias 560a, 562a, 564a, 566b, 568b, 570b of integrated circuit 500B (FIGS. 5A-5H). In some embodiments, via layout patterns 460b, 462b, 464b, 466b, 468b, 470b (collectively referred to as "set of via layout patterns 458b") are usable to manufacture vias similar to corresponding vias 560a, 562a, 564a, 566b, 568b, 570b of integrated circuit 500B (FIGS. 5A-5H). In some embodiments, via layout patterns 460c, 462c, 464c, 466c, 468c, 470c (collectively referred to as "set of via layout patterns 458c") are usable to manufacture vias similar to corresponding vias 560a, 562a, 564a, 566b, 568b, 570b of integrated circuit 500B (FIGS. 5A-5H). In some embodiments, via layout patterns 460d, 462d, 464d, 466d, 468d, 470d (collectively referred to as "set of via layout patterns 458d") are usable to manufacture vias similar to corresponding vias 560a, 562a, 564a, 566b, 568b, 570b of integrated circuit 500B (FIGS. 5A-5H).

In some embodiments, conductive feature layout patterns 440a and 440b (collectively referred to as "set of conductive feature layout patterns 440") are usable to manufacture conductive structure 540a or similar conductive structures of integrated circuit 500B (FIGS. 5A-5H).

In some embodiments, conductive feature layout patterns 442a and 442b (collectively referred to as "set of conductive feature layout patterns 442") are usable to manufacture corresponding conductive structures 542a and 542b of integrated circuit 500B (FIGS. 5A-5H).

In some embodiments, conductive feature layout patterns 444a and 444b (collectively referred to as "set of conductive feature layout patterns 444") are usable to manufacture conductive structures similar to corresponding conductive structures 542a and 542b of integrated circuit 500B (FIGS. 5A-5H).

In some embodiments, conductive feature layout pattern 450a (collectively referred to as "set of conductive feature layout patterns 450") is usable to manufacture conductive structure 550b of integrated circuit 500B (FIGS. 5A-5H).

In some embodiments, via layout patterns 474a, 474b (collectively referred to as "set of via layout patterns 474") are usable to manufacture corresponding vias 574a, 574b of integrated circuit 500B (FIGS. 5A-5H).

In some embodiments, via layout patterns 476a, 476b (collectively referred to as "set of via layout patterns 476") are usable to manufacture vias similar to corresponding vias 574a, 574b of integrated circuit 500B (FIGS. 5A-5H).

In some embodiments, via layout patterns 478a, 478b (collectively referred to as "set of via layout patterns 478") are usable to manufacture via 578b or vias similar to 578b of integrated circuit 500B (FIGS. 5A-5H).

In some embodiments, via layout patterns 480a, 480b (collectively referred to as "set of via layout patterns 480") are usable to manufacture via 580a or vias similar to via 580a of integrated circuit 500B (FIGS. 5A-5H).

In some embodiments, layout design 400A-400B has a non-rectangular shape which results in a smaller standard cell than other designs. In some embodiments, by having a smaller standard cell, layout design 400A-400B can be utilized to manufacture integrated circuits that are smaller than other integrated circuits.

FIG. 4B is a diagram of a layout design 400B, in accordance with some embodiments.

Layout design 400B is usable to manufacture integrated circuit 500B (FIGS. 5A-5H).

Layout design 400B is a variation of layout design 400A of FIG. 4A. In comparison with layout design 400A of FIG. 4A, layout design 400B further includes a first well layout pattern 416 and a second well layout pattern 414.

First well layout pattern 416 extends in the second direction Y, and is located on the fifth layout level. First well layout pattern 416 is useable to manufacture a first well 502 (e.g., at least portions 502a, 502b) of integrated circuit 500B (FIGS. 5A-5H).

First well layout pattern 416 includes layout patterns 456a, 456b, 456c and 456d.

Layout pattern 456a extends in the second direction Y and is below active region layout patterns 404a and 404b. Layout pattern 456a is adjacent to a side 452a of the first portion 402a or the second portion 402b of layout design 400B. Layout pattern 456a is useable to manufacture portion 502a of first well 502 of integrated circuit 500B (FIGS. 5A-5H). Layout pattern 456a has width W1 (not labelled) in the first direction X.

Layout pattern 456b extends in the second direction Y and is below active region layout patterns 404c and 404d. Layout pattern 456b is adjacent to a side 452c of the third portion 402c or the fourth portion 402d of layout design 400B. Layout pattern 456b is useable to manufacture a portion of first well 502 similar to portion 502a of integrated circuit 500B (FIGS. 5A-5H). Layout pattern 456b has width W1 (not labelled) in the first direction X.

Layout pattern 456c extends in the first direction X and is below a portion of active region layout patterns 410a and 410c. In some embodiments, a side of layout pattern 456c is aligned with a first side of layout pattern 454b along line 452d1 in the first direction X. Layout pattern 456c is useable to manufacture portion 502b of first well 502 of integrated circuit 500B (FIGS. 5A-5H). Layout pattern 456c has width W2 (not labelled) in the first direction X.

Layout pattern 456d extends in the first direction X and is below a portion of active region layout patterns 410b and 410d. In some embodiments, a side of layout pattern 456d is aligned with a second side of layout pattern 454b along line 452d2 in the first direction X. Layout pattern 456d is useable to manufacture a portion of first well 502 similar to portion 502b of integrated circuit 500B (FIGS. 5A-5H). Layout pattern 456d has width W2 (not labelled) in the first direction X.

Second well layout pattern 414 extends in the second direction Y, and is located on the fifth layout level. Second well layout pattern 414 is useable to manufacture a second well 502' (e.g., at least portions 502c, 502d) of integrated circuit 500B (FIGS. 5A-5H). Second well layout pattern 414 includes layout patterns 454a, 454b and 454c.

Layout pattern 454a extends in the second direction Y and is below active region layout patterns 406a, 406b, 408a and 408b. Layout pattern 454a is useable to manufacture portion 502c of second well 502' of integrated circuit 500B (FIGS. 5A-5H). Layout pattern 454a has width W3 (not labelled) in the first direction X.

Layout pattern 454b extends in the first direction X and is below a portion of active region layout patterns 410a, 410b, 410c and 410d. Layout pattern 454b is positioned over center lines 452b, 452b2 of layout design 400B. In some embodiments, a center of layout pattern 454b is aligned with center lines 452b1 and 452b2 of layout design 400B. In some embodiments, the first side of layout pattern 454b is aligned with line 452d1 in the first direction X. In some embodiments, the second side of layout pattern 454b is aligned with line 452d2 in the first direction X. Layout pattern 454b is useable to manufacture at least portion 502d of the second well 502' of integrated circuit 500B (FIGS. 5A-5H). In some embodiments, layout pattern 454b is useable to manufacture portions similar to portion 502d of the second well 502' of integrated circuit 500B (FIGS. 5A-5H). Layout pattern 454b has width W2 (not labelled) in the first direction X.

Layout pattern 454c extends in the second direction Y and is below active region layout patterns 406c, 406d, 408c and 408d. Layout pattern 454c is useable to manufacture a portion of second well 502' similar to portion 502c of integrated circuit 500B (FIGS. 5A-5H). Layout pattern 454c has width W3 (not labelled) in the first direction X.

In some embodiments, layout patterns 454a, 454b and 454c are part of a same continuous layout pattern (e.g., second well layout pattern 414).

Layout pattern 454a is between layout patterns 456a and each of layout patterns 454b, 456c and 456d. Layout pattern 454c is between layout patterns 456b and each of layout patterns 454b, 456c and 456d. Layout pattern 454b is between layout patterns 456c and 456d. Layout pattern 454b is between layout patterns 454a and 454c.

In some embodiments, width W1, W2 or W3 is the same as another width of width W1, W2 or W3. In some embodiments, width W1, W2 or W3 is different from another width of width W1, W2 or W3.

Other configurations or quantities of first well layout pattern 416 or second well layout pattern 414 are within the scope of the present disclosure. Other configurations or quantities of layout patterns 454a, 454b, 454c, 456a, 456b, 456c or 456d are within the scope of the present disclosure.

FIGS. 5A, 5B, 5C, 5D, 5E, 5F, 5G and 5H are diagrams of an integrated circuit 500A or 500B, in accordance with some embodiments.

Figure 5A:
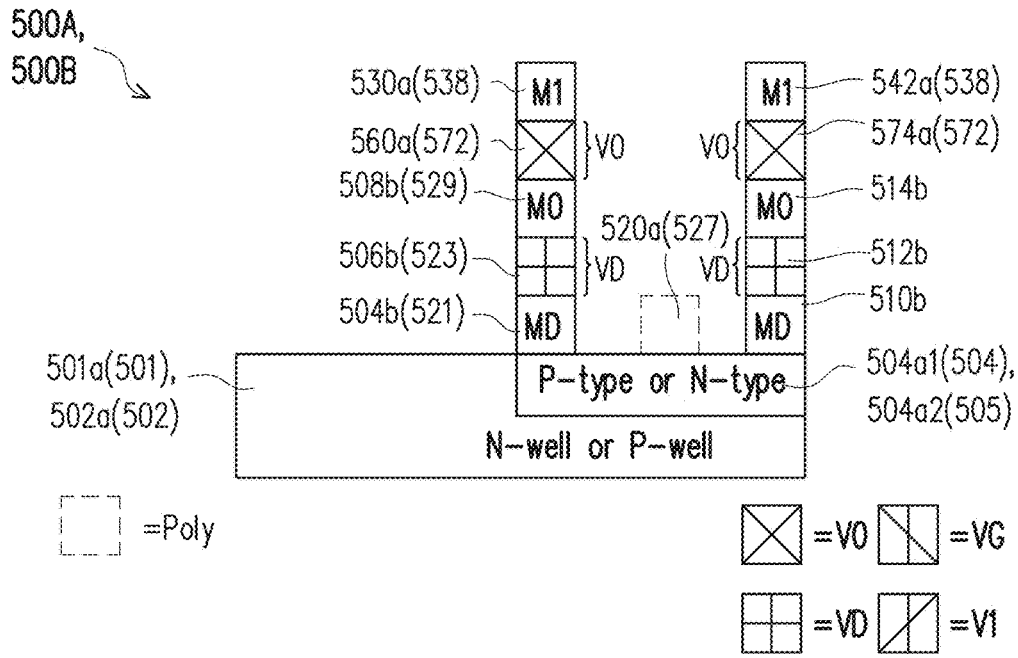
FIGS. 5A, 5B, 5C, 5D, 5E, 5F, 5G and 5H are diagrams of at least one integrated circuit, in accordance with some embodiments.

FIG. 5A is a cross-sectional view of an integrated circuit 500A or 500B corresponding to layout design 300B or 400B as intersected by plane A-A', respectively.

Figure 5B:
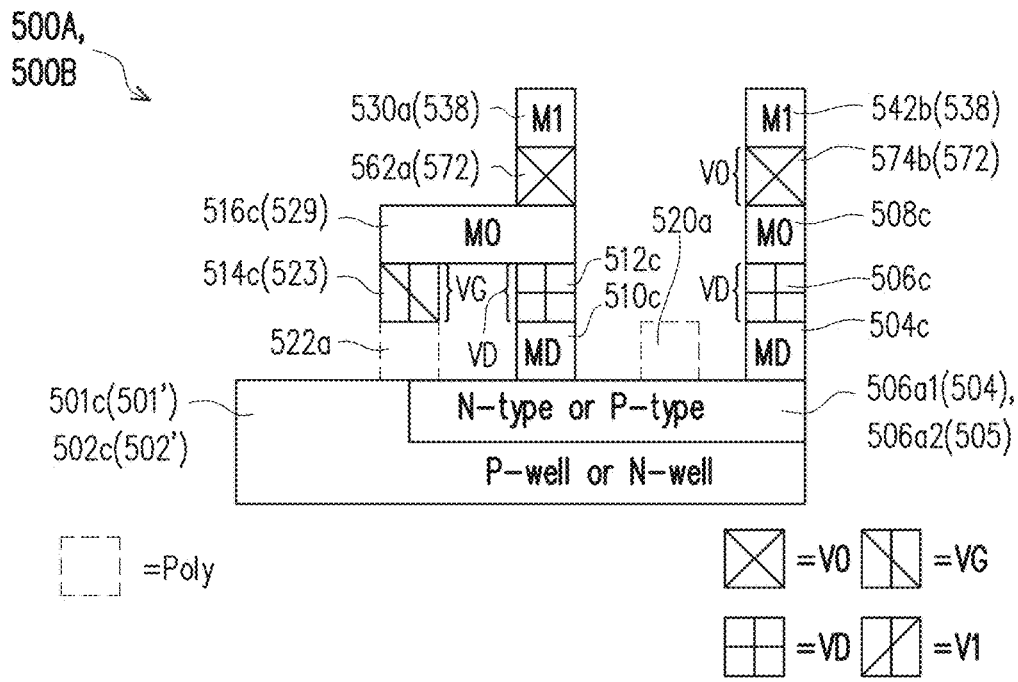

FIG. 5B is a cross-sectional view of an integrated circuit 500A or 500B corresponding to layout design 300B or 400B as intersected by plane B-B', respectively.

Figure 5C:
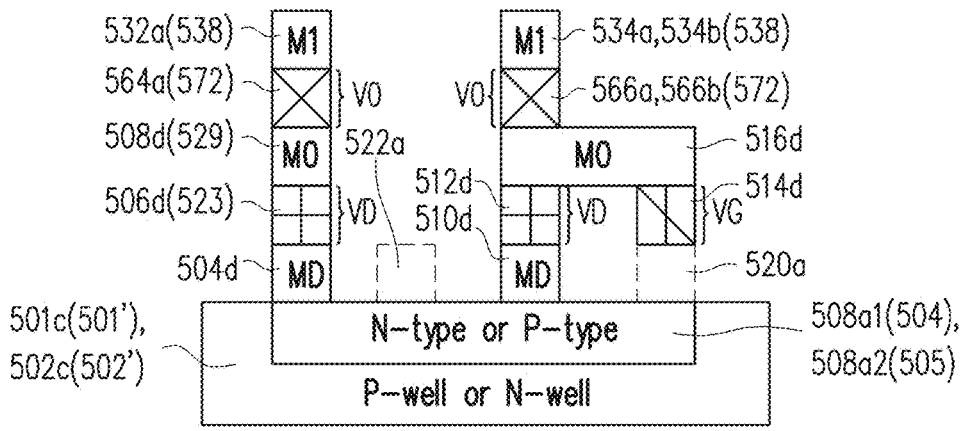

FIG. 5C is a cross-sectional view of an integrated circuit 500A or 500B corresponding to layout design 300B or 400B as intersected by plane C-C', respectively.

Figure 5D:
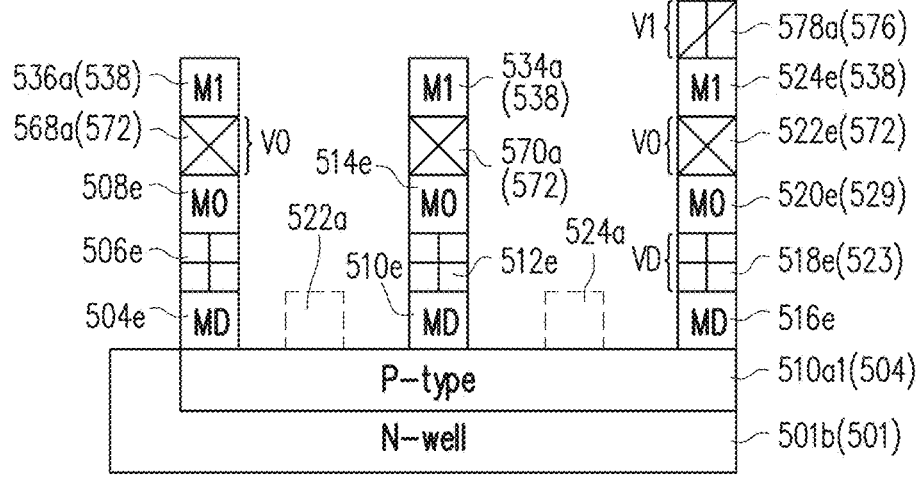
Figure 5E:
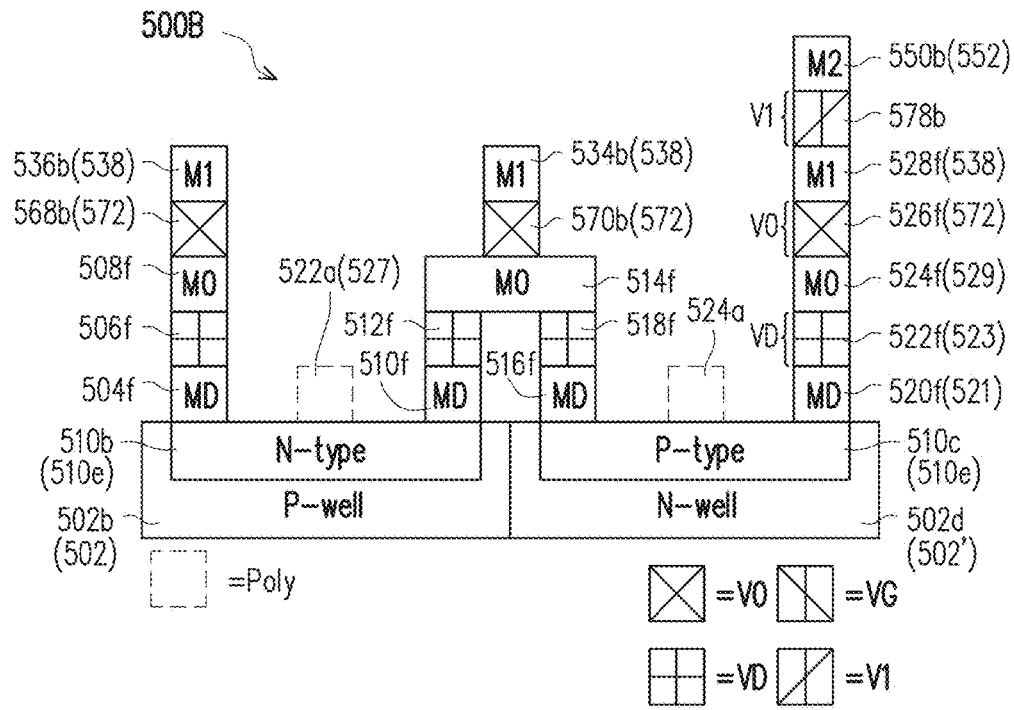

FIG. 5D is a cross-sectional view of an integrated circuit 500A corresponding to layout design 300B as intersected by plane D-D', and FIG. 5E is a cross-sectional view of an integrated circuit 500B corresponding to layout design 400B as intersected by plane E-E'.

Figure 5F:
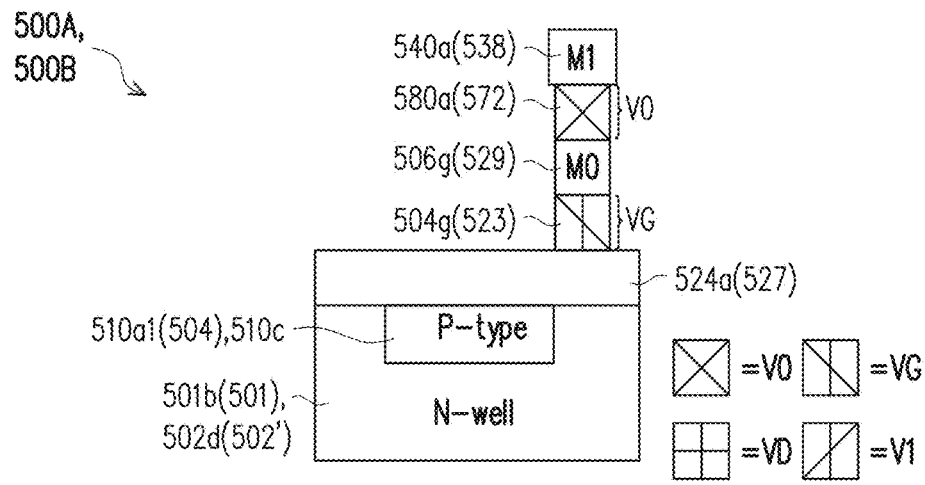

FIG. 5F is a cross-sectional view of an integrated circuit 500A or 500B corresponding to layout design 300B or 400B as intersected by plane F-F', respectively.

Figure 5G:
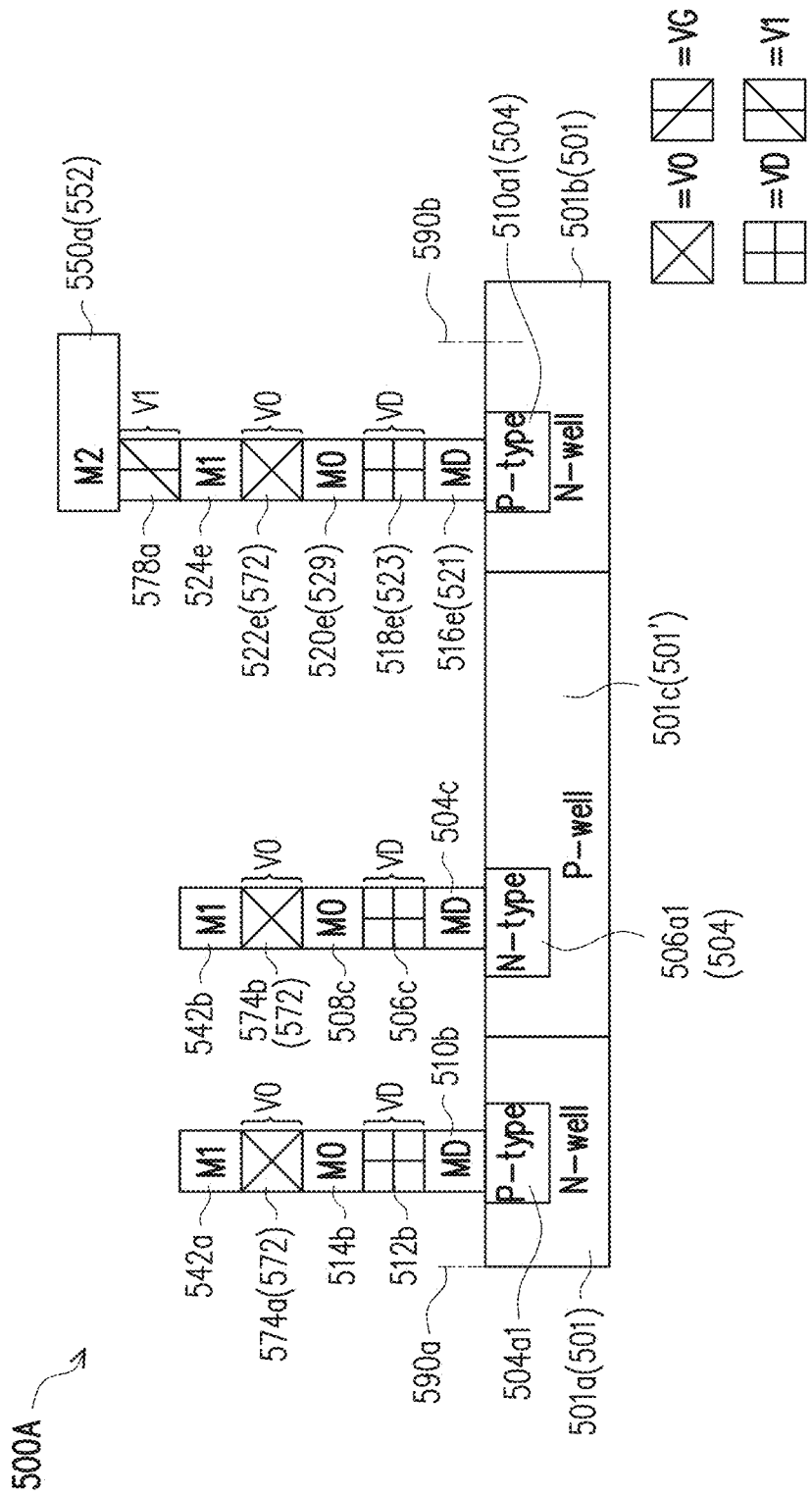
Figure 5H:
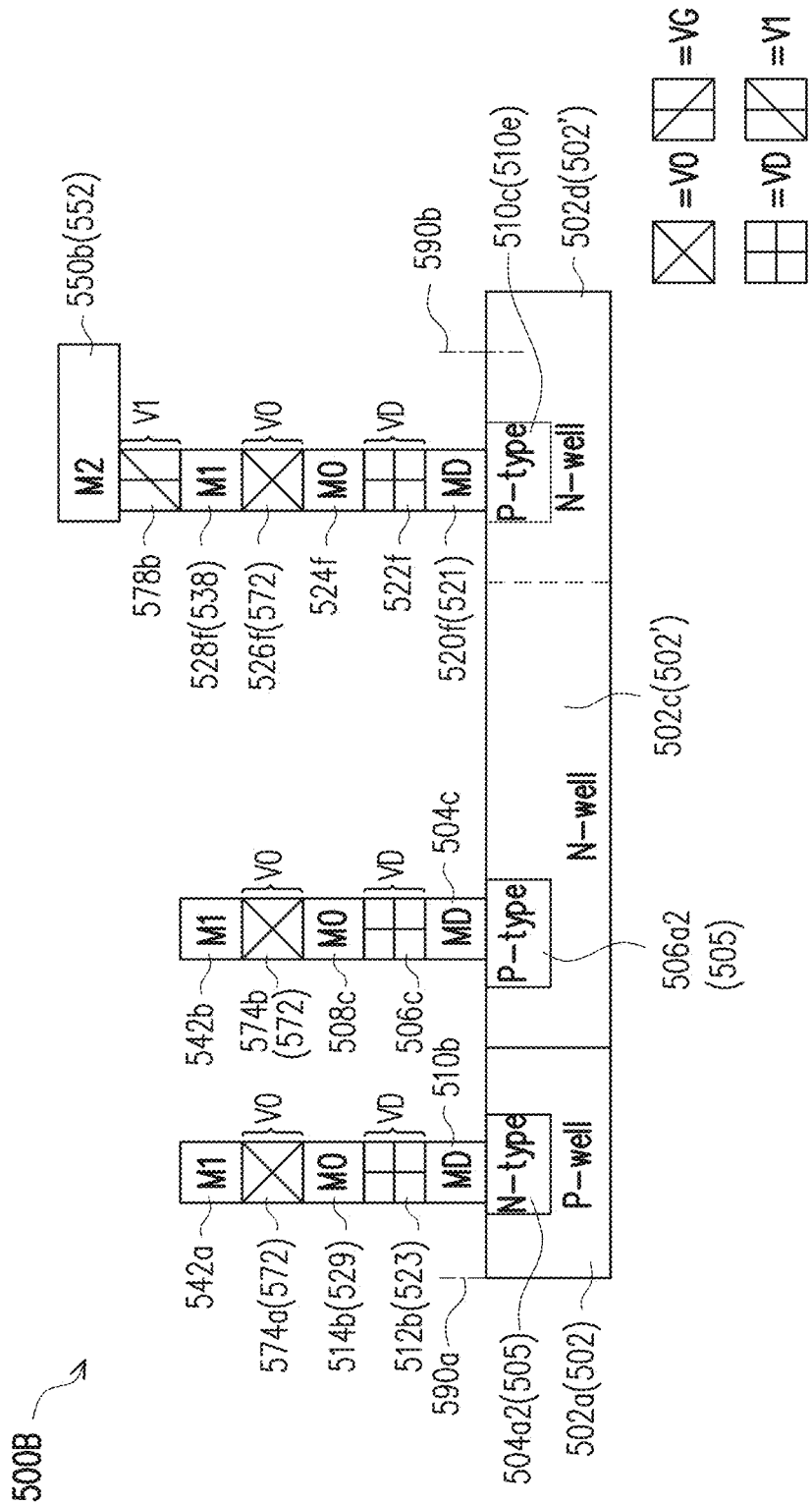

FIG. 5G is a cross-sectional view of an integrated circuit 500A corresponding to layout design 300B as intersected by plane G-G', and FIG. 5H is a cross-sectional view of an integrated circuit 500A corresponding to layout design 400B as intersected by plane H-H'.

Integrated circuit 500A is manufactured by the first portion 302a of layout design 300B, and integrated circuit 500B is manufactured by the first portion 402a of layout design 400B. In some embodiments, second portion 302b, third portion 302c and fourth portion 302d of layout design 300B are usable to manufacture an integrated circuit similar to integrated circuit 500A. In some embodiments, second portion 402b, third portion 402c and fourth portion 402d of layout design 400B are usable to manufacture an integrated circuit similar to integrated circuit 500B.

Structural relationships including alignment, lengths and widths, as well as configurations of integrated circuit 500A-500B are similar to the structural relationships and configurations of layout design 300A-300B of FIGS. 3A-3B and layout design 400A-400B of FIGS. 4A-4B, and will not be described in FIGS. 5A-5H for brevity.

For brevity, integrated circuits 500A and 500B are described below as they pertain to FIGS. 5A-5H. For brevity, elements with the same reference numeral in integrated circuits 500A and 500B are described with reference to either integrated circuit 500A or 500B, and similar detailed description is omitted.

Integrated circuit 500B is a variation of integrated circuit 500A. In comparison with integrated circuit 500A, integrated circuit 500B does not include first well 501 and second well 501'. In comparison with integrated circuit 500A, first well 502 of integrated circuit 500B replaces first well 501, and second well 502' of integrated circuit 500B replaces second well 501.

Integrated circuit 500A includes a first well 501 and a second well 501'. Each of the first well 501 and the second well 501' is located on at least the first level of integrated circuit 500A, and extends in the second direction Y.

The first well 501 of integrated circuit 500A includes dopants of a first type. The second well 501' of integrated circuit 500A includes dopants of a second type different from the first type. In some embodiments, the first type is an N-type dopant, the second type is a P-type dopant, and the first well 501 of integrated circuit 500A is an N-well, and the second well 501' of integrated circuit 500A is a P-well. In some embodiments, the first type is a P-type dopant, the second type is an N-type dopant, and the first well 501 of integrated circuit 500A is a P-well, and the second well 501' of integrated circuit 500A is an N-well.

The first well 501 of integrated circuit 500A includes a first portion 501*a* and a second portion 501*b*.

The first portion 501*a* of the first well 501 extends in the second direction Y and is adjacent to a first side 590*a* of integrated circuit 500A. In some embodiments, the first side 590*a* of integrated circuit 500A corresponds to line 352*a* of layout design 300B. The first portion 501*a* of the first well 501 is located on at least the first level of integrated circuit 500A.

The second portion 501*b* of the first well 501 extends in the second direction Y and is adjacent to a second side 590*b* of integrated circuit 500A. In some embodiments, the second side 590*b* of integrated circuit 500A corresponds to line 352*b*1 of layout design 300B. The second portion of the first well 501 is located on at least the first level of integrated circuit 500A.

The second well 501' of integrated circuit 500A includes a portion 501*c*. The second well 501' is between the first portion 501*a* of the first well 501 and the second portion 501*b* of the first well 501.

Portion 501*c* of the second well 501' extends in the second direction Y and is between the first portion 501*a* of the first well 501 and the second portion 501*b* of the first well 501. Portion 501*c* of the second well 501' is located on at least the first level of integrated circuit 500A. Other quantities or configurations of the first well 501 or the second well 501' are within the scope of the present disclosure.

Integrated circuit 500A or 500B includes a set of active regions 504 extending in the second direction Y. The set of active regions 504 is located on a first level of integrated circuit 500A or 500B.

The set of active regions 504 includes one or more of active regions 504*a*1, 506*a*1, 508*a*1 or 510*a*1. Each of the active regions 504*a*1, 506*a*1, 508*a*1, 510*a*1 of the set of active regions 504 is separated from an adjacent active region of the set of active regions 504 in the first direction X by a first pitch (not labelled).

Active region 504*a*1 is adjacent to the first side 590*a* of integrated circuit 500A. Active region 510*a*1 is adjacent to the second side 590*b* of integrated circuit 500A. The second side 590*b* of integrated circuit 500A is opposite from the first side 590*a* of integrated circuit 500A.

Active region 504*a*1 of the set of active regions 504 is embedded in the first portion 501*a* of the first well 501 of integrated circuit 500A.

Active region 510*a*1 of the set of active regions 504 is embedded in the second portion 501*b* of the first well 501 of integrated circuit 500A.

Active region 506*a*1 or 508*a*1 of the set of active regions 504 is embedded in portion 501*c* of the second well 501' of integrated circuit 500A.

Active regions 506*a*1 and 508*a*1 includes dopants of the first type. Active regions 504*a*1 and 510*a*1 includes dopants of the second type. In some embodiments, the first type is an N-type dopant, the second type is a P-type dopant, and therefore active regions 504*a*1 and 510*a*1 are each P-type active regions embedded in first well 501 (which is an N-well), and active regions 506*a*1 and 508*a*1 are each N-type active regions embedded in second well 501' (which is a P-well). In some embodiments, the first type is a P-type dopant, the second type is an N-type dopant, and therefore active regions 504*a*1 and 510*a*1 are each N-type active regions embedded in first well 501 (which is a P-well), and active regions 506*a*1 and 508*a*1 are each P-type active regions embedded in second well 501' (which is an N-well).

In some embodiments, a length of at least one of active region 504*a*1, 506*a*1, 508*a*1 or 510*a*1 in the second direction Y is different from a length of another of active region 504*a*1, 506*a*1, 508*a*1 or 510*a*1 in the second direction Y. In some embodiments, a length of at least one of active region 504*a*1, 506*a*1, 508*a*1 or 510*a*1 in the second direction Y is the same as a length of another of active region 504*a*1, 506*a*1, 508*a*1 or 510*a*1 in the second direction Y. Other quantities or configurations of the set of active regions 504 are within the scope of the present disclosure.

Integrated circuit 500A or 500B includes a set of gates 527 extending in the first direction X. The set of gates 527 overlaps the set of active regions 504 of integrated circuit 500A or the set of active regions 505 of integrated circuit 500B. The set of gates 527 is located on a second level of integrated circuit 500A or 500B. The second level is different from the first level of integrated circuit 500A or 500B. In some embodiments, the second level of integrated circuit 500A or 500B is referred to as the POLY level.

The set of gates 527 includes one or more of gate structures 520*a*, 522*a* or 524*a*. Each of gate structures 520*a* and 524*a* are separated from gate structure 522*a* in the second direction Y by a gate pitch (not labelled). Gate structures 520*a* and 524*a* are separated from each other in the first direction X. Other quantities or configurations of the set of gates 527 are within the scope of the present disclosure.

Integrated circuit 500A or 500B includes conductive structures 504*b*, 504*c*, 504*d*, 504*e*, 504*f*, 510*b*, 510*c*, 510*d*, 510*e*, 510*f*, 516*e*, 516*f* and 520*f* (collectively referred to as a "set of contacts 521").

Set of contacts 521 extends in the first direction X or the second direction Y. The set of contacts 521 is over the set of active regions 504 of integrated circuit 500A or the set of active regions 505 of integrated circuit 500B. The set of contacts 521 is located on the second level of integrated circuit 500A or 500B. In some embodiments, the second level of integrated circuit 500A or 500B is referred to as the metal diffusion (MD) level.

The set of contacts 521 electrically couples the set of active regions 504 of integrated circuit 500A or the set of active regions 505 of integrated circuit 500B to upper levels (e.g., M0, M1 or M2) of corresponding integrated circuit 500A or 500B. Conductive structures 504*b*, 510*b* electrically couple corresponding vias 506b, 512b to active region 504a1 or 504a2 (part of integrated circuit 500B). Conductive structures 504c, 510c electrically couple corresponding vias 506c, 512c to active region 506a1 or 506a2 (part of integrated circuit 500B). Conductive structures 504d, 510d electrically couple corresponding vias 506d, 512d to active region 508a1 or 508a2 (part of integrated circuit 500B). Conductive structures 504e, 510e, 516e electrically couple corresponding vias 506e, 512e, 518e to active region 510a1. Conductive structures 504f, 510f electrically couple corresponding vias 506f, 512f to active region 510b. Conductive structures 516f, 520f electrically couple corresponding vias 518f, 522f to active region 510c. Other quantities or configurations of the set of contacts 521 are within the scope of the present disclosure.

Integrated circuit 500A or 500B includes conductive structures 508b, 508c, 508d, 508e, 508f, 514b, 514e, 514f, 516c, 516d, 520e, 524f (collectively referred to as a "set of conductive structures 529"). Set of conductive structures 529 extends in the first direction X or the second direction Y. The set of conductive structures 529 is over the set of active regions 504 of integrated circuit 500A or the set of active regions 505 of integrated circuit 500B. The set of conductive structures 529 is over at least the set of contacts 521 or the set of gates 527. The set of conductive structures 529 is located on a third level of integrated circuit 500A or 500B. The third level of integrated circuit 500A or 500B is different from the first level of integrated circuit 500A or 500B and the second level of integrated circuit 500A or 500B. In some embodiments, the third level of integrated circuit 500A or 500B is referred to as the metal zero (M0) level.

The set of conductive structures 529 electrically couples the set of active regions 504 of integrated circuit 500A or the set of active regions 505 of integrated circuit 500B to upper levels (e.g., M1 or M2) of corresponding integrated circuit 500A or 500B. In some embodiments, the set of conductive structures 529 electrically couples the set of gates 527 to upper levels (e.g., M1 or M2) of integrated circuit 500A or 500B. Other quantities or configurations of the set of conductive structures 529 are within the scope of the present disclosure.

Integrated circuit 500A or 500B includes vias 504g, 506b, 506c, 506d, 506e, 506f, 512b, 512c, 512d, 512e, 512f, 514c, 514d, 518e, 518f and 522f (collectively referred to as a "set of vias 523") between the set of conductive structures 529 and the set of active regions 504 of integrated circuit 500A or the set of active regions 505 of integrated circuit 500B. The set of vias 523 electrically couple the set of conductive structures 529 to the set of active regions 504 of integrated circuit 500A or the set of active regions 505 of integrated circuit 500B. In some embodiments, one or more vias of the set of vias 523 is located where one or more conductive structures of the set of conductive structures 529 is over one or more active regions of the set of active regions 504 of integrated circuit 500A or one or more active regions of the set of active regions 505 of integrated circuit 500B.

Vias 506b, 512b electrically couple corresponding conductive structures 508b, 514b to corresponding conductive structures 504b, 510b. Vias 506c, 512c electrically couple corresponding conductive structures 508c, 516c to corresponding conductive structures 504c, 510c. Vias 506d, 512d electrically couple corresponding conductive structures 508d, 516d to corresponding conductive structures 504d, 510d. Vias 506e, 512e, 518e electrically couple corresponding conductive structures 508e, 514e, 520e to corresponding conductive structures 504e, 510e, 516e. Vias 506f, 522f electrically couple corresponding conductive structures 508f, 524f to corresponding conductive structures 504f, 520f. Vias 512f, 518f electrically couple conductive structure 514f to corresponding conductive structures 510f, 516f.

Each of vias 514c, 514d, 504g is above corresponding gate structures 522a, 520a, 524a. Vias 514c, 514d, 504g electrically couple corresponding conductive structures 516c, 516d, 506g to corresponding gate structures 522a, 520a, 524a. Vias 514c, 514d, 504g are above corresponding gate structures 522a, 520a, 524a. In some embodiments, the set of vias 523 is between the first set of conductive structures 538 and the set of gates 527. Via 504g of the set of vias 523 is located where conductive structure 540a of the first set of conductive structures 538 is over gate structure 524a of the set of gates 527.

Set of vias 523 is in the via over diffusion (VD) level or the via over gate (VG) level of integrated circuit 500A or 500B. The VG or VD level of integrated circuit 500A or 500B is between the second level and the third level. In some embodiments, vias 514c, 514d, 504g are in the VG level of integrated circuit 500A or 500B. In some embodiments, vias 506b, 506c, 506d, 506e, 506f, 512b, 512c, 512d, 512e, 512f, 518e, 518f and 522f are in the VD level of integrated circuit 500A or 500B. Other quantities or configurations of the set of vias 523 are within the scope of the present disclosure.

Integrated circuit 500A or 500B includes conductive structures 524e, 528f, 530a, 532a, 534a, 534b, 536a, 536b, 540a, 542a and 542b (collectively referred to as a "first set of conductive structures 538"). The first set of conductive structures 538 extends in the first direction X. Each conductive structure of the first set of conductive structures 538 is separated from an adjacent conductive structure of the first set of conductive structures 538 feature in at least the first direction X or the second direction Y. The first set of conductive structures 538 is over at least the set of active regions 504 of integrated circuit 500A, the set of active regions 505 of integrated circuit 500B, the set of gates 527, or the set of contacts 521. The first set of conductive structures 538 is located on a fourth level of integrated circuit 500A or 500B. The fourth level of integrated circuit 500A or 500B is different from the first level of integrated circuit 500A or 500B, the second level of integrated circuit 500A or 500B and the third level of integrated circuit 500A or 500B. In some embodiments, the fourth level of integrated circuit 500A or 500B is referred to as the metal one (M1) level.

In some embodiments, conductive structure 540a corresponds to the word line WL1 of memory cell 100 of FIG. 1 or word lines WL[1], . . . , WL[2M] of memory cell array 200A-200B of FIGS. 2A-2B.

The first set of conductive structures 538 is electrically coupled to the set of active regions 504 of integrated circuit 500A or the set of active regions 505 of integrated circuit 500B. In some embodiments, the first set of conductive structures 538 is electrically coupled to the set of gates 527. Other quantities or configurations of the first set of conductive structures 538 are within the scope of the present disclosure.

Integrated circuit 500A or 500B includes vias 522e, 526f, 560a, 562a, 564a, 566a, 566b, 568a, 568b, 570a, 570b, 574a, 574b and 580a (collectively referred to as a "first set of vias 572") between the first set of conductive structures 538 and the set of active regions 504 of integrated circuit 500A or the set of active regions 505 of integrated circuit 500B. The first set of vias 572 electrically couple the first set of conductive structures 538 to the set of active regions 504 of integrated circuit 500A or the set of active regions 505 of integrated circuit 500B. In some embodiments, one or more vias of the first set of vias 572 is located where one or more conductive structures of the first set of conductive structures 538 overlaps one or more active regions of the set of active regions 504 of integrated circuit 500A or one or more active regions of the set of active regions 505 of integrated circuit 500B.

Vias 560a, 574a electrically couple corresponding conductive structures 530a, 542a to corresponding conductive structures 508b, 514b. Vias 562a, 574b electrically couple corresponding conductive structures 530a, 542b to corresponding conductive structures 516c, 508c. Via 564a electrically couples conductive structure 532a to conductive structure 508d. Vias 566a, 566b electrically couple corresponding conductive structures 534a, 534b to conductive structures 516d. Vias 568a, 570a, 522e electrically couple corresponding conductive structures 536a, 534a, 524e to corresponding conductive structures 508e, 514e, 520e. Vias 568b, 570b, 526f electrically couple corresponding conductive structures 536b, 534b, 528f to corresponding conductive structures 508f, 514f, 524f. Via 580a electrically couples conductive structure 540a to conductive structure 506g.

First set of vias 572 is in the via zero (V0) level of integrated circuit 500A or 500B. The V0 level of integrated circuit 500A or 500B is between the third level and the fourth level. In some embodiments, the V0 level of integrated circuit 500A or 500B is between the M1 level and the M0 level. Other quantities or configurations of the first set of vias 572 are within the scope of the present disclosure.

Integrated circuit 500A or 500B includes conductive structures 550a and 550b (collectively referred to as a "second set of conductive structures 552"). The second set of conductive structures 552 extends in the first direction X. Each conductive structure of the second set of conductive structures 552 is separated from an adjacent conductive structure of the second set of conductive structures 552 in at least the first direction X or the second direction Y. In some embodiments, the second set of conductive structures 552 is over one or more of the set of active regions 504 of integrated circuit 500A, the set of active regions 505 of integrated circuit 500B or the set of contacts 521.

The second set of conductive structures 552 is located on a fifth level of integrated circuit 500A or 500B. The fifth level of integrated circuit 500A or 500B is different from the first level of integrated circuit 500A or 500B, the second level of integrated circuit 500A or 500B, the third level of integrated circuit 500A or 500B and the fourth level of integrated circuit 500A or 500B. In some embodiments, the fifth level of integrated circuit 500A or 500B is referred to as the metal two (M2) level.

In some embodiments, the second set of conductive structure 552 overlaps the set of active regions 504 of integrated circuit 500A or the set of active regions 505 of integrated circuit 500B. Conductive structure 550a overlaps active region 510a of the set of active regions 504 of integrated circuit 500A and the second side 590b of integrated circuit 500A. Conductive structure 550b overlaps active region 510c of the set of active regions 505 of integrated circuit 500B and the second side 590b of integrated circuit 500B. In some embodiments, conductive structure 550a or 550b corresponds to the bit line BL1 of memory cell 100 of FIG. 1 or bit lines BL[1], . . . , BL[2N] of memory cell array 200A-200B of FIGS. 2A-2B.

In some embodiments, the second set of conductive structures 552 is electrically coupled to the set of active regions 504 of integrated circuit 500A or the set of active regions 505 of integrated circuit 500B. Conductive structure 550a is electrically coupled to active region 510a of integrated circuit 500A. Conductive structure 550b is electrically coupled to active region 510c of integrated circuit 500B. Other quantities or configurations of the second set of conductive structures 552 are within the scope of the present disclosure.

Integrated circuit 500A or 500B includes vias 578a and 578b (collectively referred to as a "set of vias 576") between the second set of conductive structures 552 and the first set of conductive structures 538. The set of vias 576 electrically couple the second set of conductive structures 552 to the first set of conductive structures 538. Vias 578a, 578b electrically couple corresponding conductive structures 550a, 550b to corresponding conductive structures 524e, 528f. In some embodiments, the set of vias 576 electrically couple the second set of conductive structures 552 to the set of active regions 504 of integrated circuit 500A or the set of active regions 505 of integrated circuit 500B.

In some embodiments, one or more vias of the set of vias 576 is located where one or more conductive structures of the second set of conductive structures 538 overlaps one or more active regions of the set of active regions 504 of integrated circuit 500A or one or more active regions of the set of active regions 505 of integrated circuit 500B.

First set of vias 572 is in the via one (V1) level of integrated circuit 500A or 500B. The V1 level of integrated circuit 500A or 500B is between the fourth level and the fifth level. In some embodiments, the V1 level of integrated circuit 500A or 500B is between the M2 level and the M1 level. Other quantities or configurations of the set of vias 572 are within the scope of the present disclosure.

Integrated circuit 500B is a variation of integrated circuit 500A. In comparison with integrated circuit 500A, a first well 502 of integrated circuit 500B replaces first well 501, a second well 502' of integrated circuit 500B replaces second well 501, and a set of active regions 505 of integrated circuit 500B replaces the set of active regions 504.

Integrated circuit 500B includes first well 502 and second well 502'. Each of the first well 502 and the second well 502' is located on at least the first level of integrated circuit 500B, and extends in at least the second direction Y.

The first well 502 of integrated circuit 500B includes dopants of the second type. The second well 502' of integrated circuit 500B includes dopants of the first type. In some embodiments, the first type is an N-type dopant, the second type is a P-type dopant, and the first well 502 of integrated circuit 500B is a P-well, and the second well 502' of integrated circuit 500B is an N-well. In some embodiments, the first type is a P-type dopant, the second type is an N-type dopant, and the first well 502 of integrated circuit 500B is an N-well, and the second well 502' of integrated circuit 500B is a P-well.

The first well 502 of integrated circuit 500B includes a first portion 502a and a second portion 502b.

The first portion 502a of the first well 502 extends in the second direction Y and is adjacent to the first side 590a of integrated circuit 500B. In some embodiments, the first side 590a of integrated circuit 500B corresponds to line 352a of layout design 400B. The first portion 502a of the first well 502 is located on at least the first level of integrated circuit 500B.

The second portion 502b of the first well 502 extends in the second direction Y and is adjacent to the second side 590b of integrated circuit 500B. In some embodiments, the second side 590b of integrated circuit 500B corresponds to line 352b1 of layout design 400B. The second portion of the first well 502 is located on at least the first level of integrated circuit 500B. Other quantities or configurations of the first well 502, the first portion 502a of the first well 502 or the second portion 502b of the first well 502 are within the scope of the present disclosure.

The second well 502' of integrated circuit 500B includes a first portion 502c and a second portion 502d.

The first portion 502c of the second well 502' extends in the second direction Y and is adjacent to the first portion 502a of the first well 502. The first portion 502c of the second well 502' is located on at least the first level of integrated circuit 500B.

The second portion 502d of the second well 502' extends in at least the first direction X or the second direction Y. The second portion 502d of the second well 502' is adjacent to each of the second side 590b of integrated circuit 500B, the second portion 502b of the first well 502 and the first portion 502c of the second well 502'. The second portion 502d of the second well 502' is located on at least the first level of integrated circuit 500B.

The first portion 502c of the second well 502' is between the first portion 502a of the first well 502 and each of the second portion 502b of the first well 502 and the second portion 502d of the second well 502'. Other quantities or configurations of the second well 502', the first portion 502c of the second well 502' or the second portion 502d of the second well 502' are within the scope of the present disclosure.

Integrated circuit 500B includes a set of active regions 505 extending in the second direction Y. The set of active regions 505 is located on the first level of integrated circuit 500B.

The set of active regions 505 includes one or more of active regions 504a2, 506a2, 508a2 or 510e. Each of the active regions 504a2, 506a2, 508a2 or 510e of the set of active regions 505 is separated from an adjacent active region of the set of active regions 505 in the first direction X by the first pitch (not labelled).

Active region 510e includes an active region 510b and an active region 510c. Active region 510b and active region 510c are separated from each other in the second direction Y.

Active region 504a2 is adjacent to the first side 590a of integrated circuit 500B. Active region 510e is adjacent to the second side 590b of integrated circuit 500B.

Active region 504a2 of the set of active regions 505 is embedded in the first portion 502a of the first well 502 of integrated circuit 500B.

Active region 510e of the set of active regions 505 is embedded in each of the second portion 502b of the first well 502 of integrated circuit 500B and the second portion 502d of the second well 502' of integrated circuit 500B. Active region 510b is embedded in the second portion 502b of the first well 502 of integrated circuit 500B. Active region 510c is embedded in the second portion 502d of the second well 502' of integrated circuit 500B.

Active region 506a2 or 508a2 of the set of active regions 505 is embedded in the first portion 502c of the second well 502' of integrated circuit 500B.

Active regions 504a2 and 510b includes dopants of the first type. Active regions 506a2, 508a2 and 510c includes dopants of the second type.

In some embodiments, the first type is an N-type dopant, the second type is a P-type dopant, and therefore active regions 504a2 and 510b are each N-type active regions embedded in the first well 502 (which is a P-well), and active regions 506a2, 508a2 and 510c are each P-type active regions embedded in the second well 502' (which is an N-well). In some embodiments, the first type is a P-type dopant, the second type is an N-type dopant, and therefore active regions 504a2 and 510b are each P-type active regions embedded in the first well 502 (which is an N-well), and active regions 506a2, 508a2 and 510c are N-type active regions embedded in the second well 502' (which is a P-well).

In some embodiments, a length of at least one of active region 504a2, 506a2, 508a2, 510b, 510c, or 510e in the second direction Y is different from a length of another of active region 504a2, 506a2, 508a2, 510b, 510c, or 510e in the second direction Y. In some embodiments, a length of at least one of active region 504a2, 506a2, 508a2, 510b, 510c, or 510e in the second direction Y is the same as a length of another of active region 504a2, 506a2, 508a2, 510b, 510c, or 510e in the second direction Y. Other quantities or configurations of the set of active regions 505 are within the scope of the present disclosure.

In some embodiments, integrated circuit 500A-500B occupies less area than other integrated circuits. In some embodiments, by occupying less area than other integrated circuits, integrated circuit 500A-500B is utilized as part of a memory cell array 200A-200B that is denser compared with other approaches. In some embodiments, by being utilized as part of a denser memory cell array 200A-200B, memory cell array 200A-200B has a larger memory capacity than other approaches.

Figure 6:
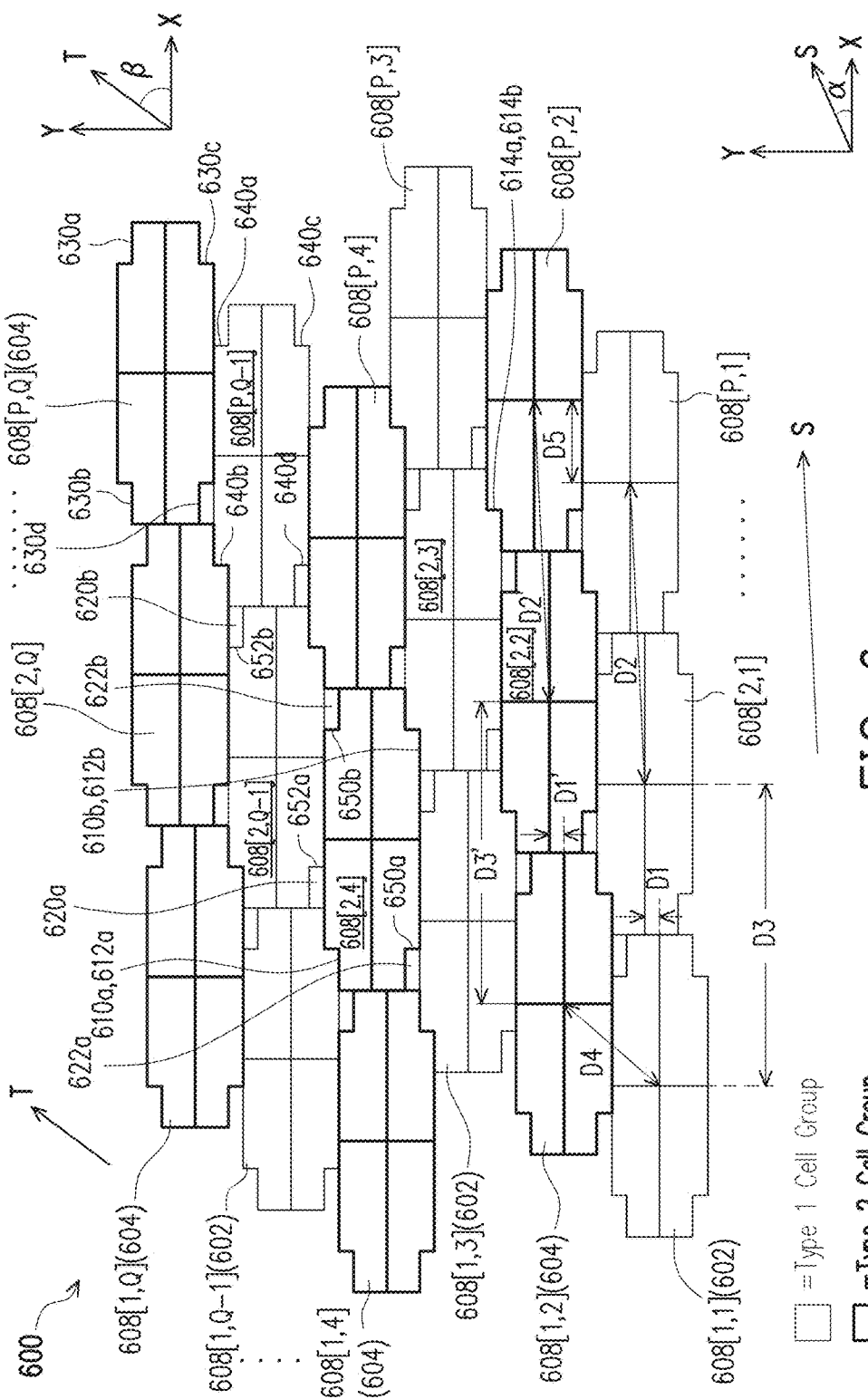
FIG. 6 is a diagram of a layout design of a memory cell array, in accordance with some embodiments.

FIG. 6 is a diagram of a layout design 600, in accordance with some embodiments.

A portion of layout design 600 is usable to manufacture integrated circuit 500A or 500B (FIGS. 5A-5H).

Layout design 600 comprises a first set of tiles 602 and a second set of tiles 604 arranged as an array of tiles. In some embodiments, at least one tile of the first set of tiles 602 corresponds to layout design 300A or 300B, and at least one tile of the second set of tiles 604 corresponds to layout design 400A or 400B. In some embodiments, at least one tile of the first set of tiles 602 corresponds to layout design 400A or 400B, and at least one tile of the second set of tiles 604 corresponds to layout design 300A or 300B. In some embodiments, a shape of the first set of tiles 602 and a shape of the second set of tiles 604 are non-rectangular, and therefore the shape of layout design 600 can also be a non-rectangular shape.

The first set of tiles 602 extends in a third direction S. The third direction S relates to the first direction X and the second direction Y. For example, in some embodiments, the third direction S is rotated from the first direction X towards the second direction Y by an angle $\alpha$. In some embodiments, the angle $\alpha$ ranges from about 0 degrees to about 180 degrees. The angle $\alpha$ is expressed by formula 2 (described below). In some embodiments, the third direction S is equal to the first direction X or the second direction Y. In some embodiments, the third direction S is different from the first direction X or the second direction Y. The first set of tiles 602 comprises one or more of tiles 608[1,1], 608[2,1], ..., 608[P,1], 608[1,3], 608[2,3], ..., 608[P,3], 608[1,Q−1], 608[2,Q−1], ..., 608[P−1,Q−1], where P is a positive integer corresponding to the number of columns in the array of tiles and Q is a positive integer corresponding to the number of rows in the array of tiles.

Each tile of the first set of tiles 602 extends in the first direction X. Each tile of the first set of tiles 602 has four notches (not labelled for ease of illustration). In some embodiments, the four notches (not labelled for ease of illustration) of each tile of the first set of tiles 602 corresponds to corner notches 390a, 390b, 390c and 390d of the set of corner notches 390 of FIGS. 3A-3B. For example, tile 608[P,Q−1] has notches 630a, 630b, 630c and 630d. In some embodiments, notches 630a, 630b, 630c and 630d are corresponding corner notches 390a, 390b, 390c and 390d of FIGS. 3A-3B. Each notch 630a, 630b, 630c and 630d is located in a corresponding corner of tile 608[P,Q−1]. In some embodiments, each notch (not labelled for ease of illustration) of each tile of the first set of tiles 602 is located in a corresponding corner of the tile of the first set of tiles 602. A center of each tile of the first set of tiles 602 is offset from a center of an adjacent tile of the first set of tiles 602 in the second direction Y by a distance D1. For example, the center of tile 608[1,1] is separated from the center of tile 608[2,1] in the second direction Y by the distance D1.

A center of each tile of the first set of tiles 602 is separated from a center of an adjacent tile of the first set of tiles 602 in the third direction S by a distance D2. For example, a center of tile 608[1,1] is separated from a center of tile 608[2,1] in the third direction S by the distance D2.

A center of each tile of the first set of tiles 602 is separated from a center of an adjacent tile of the first set of tiles 602 in the first direction X by a distance D3. For example, the center of tile 608[1,1] is separated from the center of tile 608[2,1] in the first direction X by the distance D3.

A relationship between distances D1, D2 and D3 is expressed by formula 1.

$$D2 = (D1^2 + D3^2)^{0.5} \quad (1)$$

The second set of tiles 604 extends in the third direction S. A relationship between angle α and distances D2 and D3 is expressed by formula 2.

$$\alpha = \text{ArcCos}(D3/D2) \quad (2)$$

The second set of tiles 604 comprises one or more of tiles 608[1,2], 608[2,2], ... 608[P,2], 608[1,4], 608[2,4], ..., 608[P,4], 608[1,Q], 608[2,Q], ..., 608[P,Q]. The second set of tiles 604 is separated from the first set of tiles 602 in the second direction Y.

The first set of tiles 602 and the second set of tiles 604 alternate with each other in the second direction Y. Each tile of the second set of tiles 604 extends in the first direction X. Each tile of the second set of tiles 604 has four notches (not labelled for ease of illustration). In some embodiments, the four notches (not labelled for ease of illustration) of each tile of the second set of tiles 604 corresponds to corner notches 490a, 490b, 490c and 490d of the set of corner notches 490 of FIGS. 4A-4B. For example, tile 608[P,Q] has notches 640a, 640b, 640c and 640d. In some embodiments, notches 640a, 640b, 640c and 640d are corresponding corner notches 490a, 490b, 490c and 490d of FIGS. 4A-4B. Each notch 640a, 640b, 640c and 640d is located in a corresponding corner of tile 608[P,Q]. In some embodiments, each notch (not labelled for ease of illustration) of each tile of the second set of tiles 604 is located in a corresponding corner of the tile of the second set of tile 604. A center of each tile of the second set of tiles 604 is offset from a center of an adjacent tile of the second set of tiles 604 in the second direction Y by a distance D1'. For example, the center of tile 608[1,2] is separated from the center of tile 608[2,2] in the second direction Y by the distance D1'.

A center of each tile of the second set of tiles 604 is separated from a center of an adjacent tile of the second set of tiles 604 in the third direction S by a distance D2'. For example, a center of tile 608[1,2] is separated from a center of tile 608[2,2] in the third direction S by the distance D2'.

A center of each tile of the second set of tiles 604 is separated from a center of an adjacent tile of the second set of tiles 604 in the first direction X by a distance D3'. For example, the center of tile 608[1,2] is separated from the center of tile 608[2,2] in the first direction X by the distance D3'.

A relationship between distances D1', D2' and D3' is expressed by formula 3.

$$D2' = (D1'^2 + D3'^2)^{0.5} \quad (3)$$

A relationship between angle α and distances D2' and D3' is expressed by formula 4.

$$\alpha = \text{ArcCos}(D3'/D2') \quad (4)$$

A center of a tile of the second set of tiles 604 is separated from a center of an adjacent tile of the first set of tiles 604 in a fourth direction T by a distance D4. For example, the center of tile 608[1,1] is separated from the center of tile 608[1,2] in the fourth direction T by the distance D4. The fourth direction T relates to the first direction X and the second direction Y. For example, the fourth direction T is rotated from the first direction X towards the second direction Y by an angle β. In some embodiments, the angle β ranges from about 0 degrees to about 180 degrees. The angle β relates to distances D5 and D4 by formula 5.

$$\beta = \text{ArcCos}(D5/D4) \quad (5)$$

In some embodiments, the fourth direction T is equal to the first direction X or the second direction Y. In some embodiments, the fourth direction T is different from the first direction X or the second direction Y. A center of a tile of the second set of tiles 604 is separated from a center of an adjacent tile of the first set of tiles 604 in the first direction X by a distance D5. For example, the center of tile 608[P,1] is separated from the center of tile 608[P,2] in the first direction X by the distance D5.

In some embodiments, two notches (not labelled) of a tile in the second set of tiles 604 are flush with tiles in the first set of tiles 602, and the other two notches (not labelled) are not flush with adjacent tiles in the first set of tiles 602 or the second set of tiles 604 creating a corresponding space (not labelled) between adjacent tiles. In some embodiments, one or more spaces (not labelled) between adjacent tiles can be utilized for well contacts (not shown) or substrate contacts (not shown). In some embodiments, additional well contacts (not shown) or substrate contacts (not shown) can be utilized to improve latch-up prevention. In some embodiments, latch-up is a short circuit between one or more wells and the substrate. In some embodiments, two notches (not labelled) of a tile in the second set of tiles 604 are flush with corresponding notches (not labelled) of two different tiles in the first set of tiles 602. For example, notch 610a of tile 608[2,4] of the second set of tiles 604 is flush with a corresponding notch 612a of tile 608[1,Q−1] of the first set of tiles 602, and notch 610b of tile 608[2,4] of the second set of tiles 604 is flush with a corresponding notch 612b of tile 608[2,3] of the first set of tiles 602.

In some embodiments, two notches (not labelled for ease of illustration) of a tile in the first set of tiles 602 are flush with corresponding notches (not labelled for ease of illustration) of two different tiles in the second set of tiles 604. For example, notch 612b of tile 608[2,3] of the first set of tiles 602 is flush with a corresponding notch 610b of tile 608[2,4] of the second set of tiles 604, and notch 614a of tile 608[2,3] of the first set of tiles 602 is flush with a corresponding notch 614b of tile 608[P,2] of the second set of tiles 604. In some embodiments, two notches (not labelled for ease of illustration) of a tile in the second set of tiles 604 are not flush with portions of adjacent tiles in the first set of tiles 602 or the second set of tiles 604 creating a space (not labelled for ease of illustration) that can be utilized for well contacts (not shown) or substrate contacts (not shown). For example, in some embodiments, a notch 650*a* of tile 608[2, 4] is not flush with adjacent tiles 608[1,4] and 608[1, 3] resulting in space 622*a*. Similarly, in some embodiments, a notch 650*b* of tile 608[2, 4] is not flush with adjacent tiles 608[2,Q-1] and 608[P, 4] resulting in space 622*b*. For example, in some embodiments, as shown in FIG. 6, space 620*a* is between tile 608[2, Q-1] and tile 608[1, Q-1] of the first set of tiles 602, and space 620*b* is between tile 608[2, Q-1] and 608[P, Q-1] of the first set of tiles 602. In these embodiments, space 622*a* and space 622*b* can be utilized for well contacts (not shown) or substrate contacts (not shown). In some embodiments, two notches (not labelled for ease of illustration) of a tile in the first set of tiles 602 are not flush with portions of adjacent tiles in the second set of tiles 604 or the first set of tiles 602. For example, in some embodiments, a notch 652*a* of tile 608[2, Q-1] is not flush with adjacent tiles 608[2, 4] and 608[1, Q-1] resulting in space 620*a*. Similarly, in some embodiments, a notch 652*b* of tile 608[2, Q-1] is not flush with adjacent tiles 608[P,Q-1] and 608[2, Q] resulting in space 620*b*. In these embodiments, space 620*a* and space 620*b* can be utilized for well contacts (not shown) or substrate contacts (not shown). In some embodiments, at least space 620*a*, 620*b*, 622*a* or 622*b* is 12.5% of the area of a tile in the first set of tiles 602 or the second set of tiles 604.

In some embodiments, at least one of distances D1, D1', D2, D2', D3, D3', D4 or D5 is different from another of distances D1, D1', D2, D2', D3, D3', D4 or D5. In some embodiments, at least one of distances D1, D1', D2, D2', D3, D3', D4 or D5 is the same as another of distances D1, D1', D2, D2', D3, D3', D4 or D5. Other quantities or configurations of the first set of tiles 602 or the second set of tiles 604 are within the scope of the present disclosure. In some embodiments, each of the notches of at least one tile of the first set of tiles 602 or the second set of tiles 604 is a right-angled notch. In some embodiments, each of the notches of at least one tile of the first set of tiles 602 or the second set of tiles 604 is referred to as a corner notch. In some embodiments, each of the notches of at least one tile of the first set of tiles 602 or the second set of tiles 604 is a quirk. Other shapes or configurations of the notches in the first set of tiles 602 or the second set of tiles 604 are within the scope of the present disclosure.

In some embodiments, a shape of the first set of tiles 602 and a shape of the second set of tiles 604 are non-rectangular, and therefore can be placed as standard cells in layout design 600 closer to each other than other designs. In some embodiments, by placing the first set of tiles 602 and the second set of tiles 604 closer to each other than other cells, the first set of tiles or the second set of tiles can be utilized to manufacture corresponding integrated circuits that are closer to each other than other integrated circuits. In some embodiments, by manufacturing integrated circuits that are closer to each other than other integrated circuits, the area of the manufactured integrated circuits are also smaller than other integrated circuits.

Figure 7:
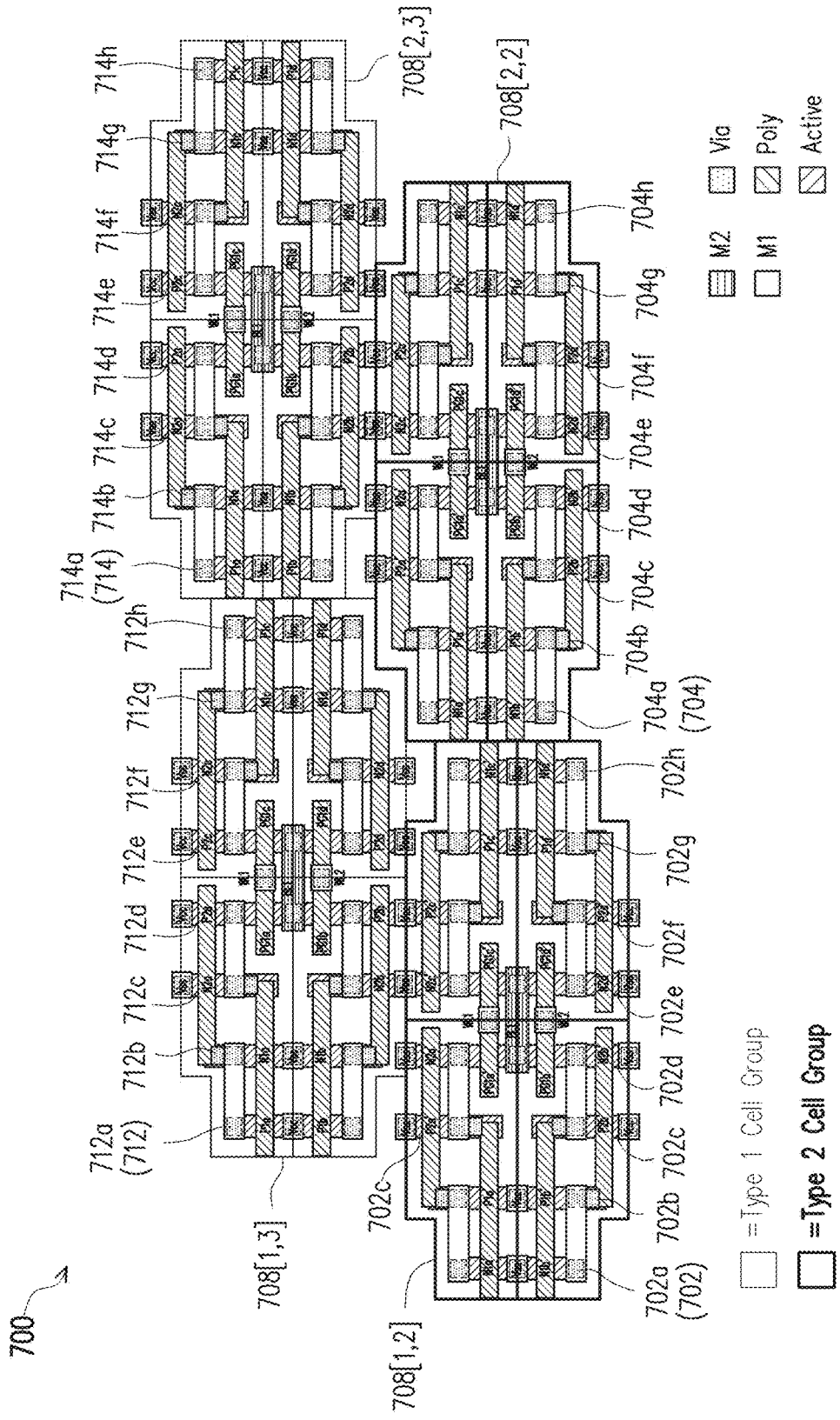
FIG. 7 is a diagram of a layout design of a memory cell array, in accordance with some embodiments.

FIG. 7 is a diagram of a layout design 700, in accordance with some embodiments.

Layout design 700 is a variation of layout design 600 (FIG. 6). Similar elements have a same reference number increased by 100. Layout design 700 combines features of layout design 300A of FIG. 3A, layout design 400A of FIG. 4A and layout design 600 of FIG. 6.

Layout design 700 includes tile 708[1,2], tile 708[2,2], tile 708[1,3] and tile 708[2,3]. Tiles 708[1,2], 708[2,2], 708[1,3] and 708[2,3] are a variation of corresponding tiles 608[1,2], 608[2,2], 608[1,3] and 608[2,3] of FIG. 6.

Each of tiles 708[1,2] and 708[2,2] corresponds to layout design 300A of FIG. 3A, and each of tiles 708[1,3] and 708[2,3] corresponds to layout design 400A of FIG. 4A. In some embodiments, each of tiles 708[1,2] and 708[2,2] corresponds to layout design 400A of FIG. 4A, and each of tiles 708[1,3] and 708[2,3] corresponds to layout design 300A of FIG. 3A. For ease of illustration, each of the elements within tiles 708[1,2], 708[2,2], 708[1,3] and 708 [2,3] are not labeled.

Tiles 708[1,2], 708[2,2], 708[1,3] and 708[2,3] include corresponding set of active region layout patterns 702, 704, 712 and 714.

The set of active region 702 or 704 corresponds to the set of active region layout patterns 412*a*, 412*b*, 412*c* and 412*d* of layout design 400A. The set of active region 712 or 714 corresponds to the set of active region layout patterns 312*a*, 312*b*, 312*c* and 312*d* of layout design 300A.

The set of active region 702 includes active region layout patterns 702*a*, 702*b*, 702*c*, 702*d*, 702*e*, 702*f*, 702*g* and 702*h*. Active region layout pattern 702*a* corresponds to active region layout patterns 404*a* and 404*b*, active region layout pattern 702*b* corresponds to active region layout patterns 406*a* and 406*b*, active region layout pattern 702*c* corresponds to active region layout patterns 408*a* and 408*b*, active region layout pattern 702*d* corresponds to active region layout patterns 410*a* and 410*b*, active region layout pattern 702*e* corresponds to active region layout patterns 410*c* and 410*d*, active region layout pattern 702*f* corresponds to active region layout patterns 408*c* and 408*d*, active region layout pattern 702*g* corresponds to active region layout patterns 406*c* and 406*d*, active region layout pattern 702*h* corresponds to active region layout patterns 404*c* and 404*d*.

The set of active region 702 includes active region layout patterns 704*a*, 704*b*, 704*c*, 704*d*, 704*e*, 704*f*, 704*g* and 704*h*. Active region layout patterns 704*a*, 704*b*, 704*c*, 704*d*, 704*e*, 704*f*, 704*g* and 704*h* are similar to corresponding active region layout patterns 702*a*, 702*b*, 702*c*, 702*d*, 702*e*, 702*f*, 702*g* and 702*h*, and similar detailed description is therefore omitted.

The set of active region 712 includes active region layout patterns 712*a*, 712*b*, 712*c*, 712*d*, 712*e*, 712*f*, 712*g* and 712*h*. Active region layout pattern 712*a* corresponds to active region layout patterns 304*a* and 304*b*, active region layout pattern 712*b* corresponds to active region layout patterns 306*a* and 306*b*, active region layout pattern 712*c* corresponds to active region layout patterns 308*a* and 308*b*, active region layout pattern 712*d* corresponds to active region layout patterns 310*a* and 310*b*, active region layout pattern 712*e* corresponds to active region layout patterns 310*c* and 310*d*, active region layout pattern 712*f* corresponds to active region layout patterns 308*c* and 308*d*, active region layout pattern 712*g* corresponds to active region layout patterns 306*c* and 306*d*, active region layout pattern 712*h* corresponds to active region layout patterns 304*c* and 304*d*.

The set of active region 714 includes active region layout patterns 714*a*, 714*b*, 714*c*, 714*d*, 714*e*, 714*f*, 714*g* and 714*h*. Active region layout patterns 714*a*, 714*b*, 714*c*, 714*d*, 714*e*, 714*f*, 714*g* and 714*h* are similar to corresponding active region layout patterns 712*a*, 712*b*, 712*c*, 712*d*, 712*e*, 712*f*, 712*g* and 712*h*, and similar detailed description is therefore omitted.

The n-type layout patterns of the set of active region layout pattern 702 or 704 of corresponding tile 708[1,2] or 708[2,2] are aligned in the second direction Y with corresponding n-type layout patterns of the set of active region layout patterns 712 or 714 of corresponding tile 708[1,3] or 708[2,3]. For example, n-type active region layout patterns 702d, 702e, 702h, 704a, 704d, 704e and 704h are aligned in the second direction Y with corresponding n-type active region layout patterns 712b, 712c, 712f, 712g, 714b, 714c and 714f.

The p-type layout patterns of the set of active region layout pattern 712 or 714 of corresponding tile 708[1,2] or 708[2,2] are aligned in the second direction Y with corresponding p-type layout patterns of the set of active region layout patterns 712 or 714 of corresponding tile 708[1,3] or 708[2,3]. For example, p-type active region layout patterns 702c, 702f, 702g, 704b, 704c, 704f and 704g are aligned in the second direction Y with corresponding p-type active region layout patterns 712a, 712d, 712e, 712h, 714a, 714d and 714e. Other quantities or configurations of tiles 708[1,2], 708[2,2], 708[1,3] and 708[2,3] are within the scope of the present disclosure.

In some embodiments, layout design 700 has a non-rectangular shape which results in a smaller standard cell than other designs. In some embodiments, by having a smaller standard cell, layout design 700 can be utilized to manufacture integrated circuits that are smaller than other integrated circuits.

Figure 8:
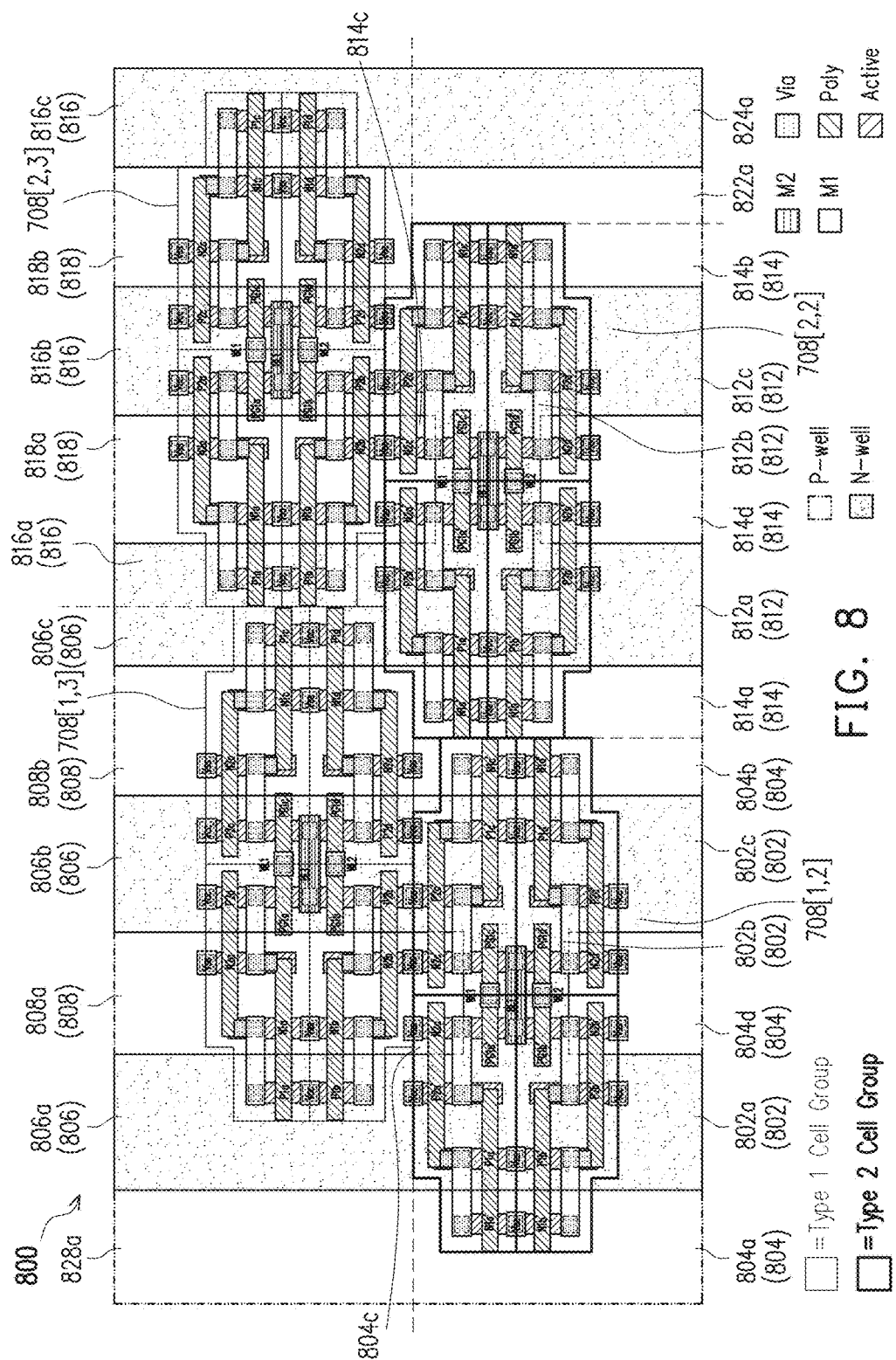
FIG. 8 is a diagram of a layout design of a memory cell array, in accordance with some embodiments.

FIG. 8 is a diagram of a layout design 800, in accordance with some embodiments.

Layout design 800 is a variation of layout design 600 of FIG. 6 and layout design 700 of FIG. 7. Similar elements have a same reference number increased by 200. Layout design 800 combines features of layout design 300B of FIG. 3B, layout design 400B of FIG. 4B and layout design 600 of FIG. 6.

In comparison with layout design 700 of FIG. 7, layout design 800 further includes a first well layout pattern 802, a second well layout pattern 804, a third well layout pattern 806, a fourth well layout pattern 808, a fifth well layout pattern 812, a sixth well layout pattern 814, a seventh well layout pattern 816, an eighth well layout pattern 818, and well layout patterns 822a, 824a and 828a.

First well layout pattern 802 and fifth well layout pattern 812 are similar to second well layout pattern 414 of layout design 400B of FIG. 4B, and similar detailed description is therefore omitted. Second well layout pattern 804 and sixth well layout pattern 814 are similar to the first well layout pattern 416 of layout design 400B of FIG. 4B, and similar detailed description is therefore omitted. Third well layout pattern 806 and seventh well layout pattern 816 are similar to first well layout pattern 314 of layout design 300B of FIG. 3B, and similar detailed description is therefore omitted. Fourth well layout pattern 808 and eighth well layout pattern 818 are similar to second well layout pattern 316 of layout design 300B of FIG. 3B, and similar detailed description is therefore omitted.

First well layout pattern 802 includes well layout patterns 802a, 802b and 802c. Well layout patterns 802a, 802b and 802c are similar to corresponding well layout patterns 454a, 454b and 454c of layout design 400B of FIG. 4B, and similar detailed description is therefore omitted.

Second well layout pattern 804 includes well layout patterns 804a, 804b, 804c and 804d. Well layout patterns 804a, 804b, 804c and 804d are similar to corresponding well layout patterns 456a, 456b, 456c and 456d of layout design 400B of FIG. 4B, and similar detailed description is therefore omitted.

Third well layout pattern 806 includes well layout patterns 806a, 806b and 806c. Well layout patterns 806a, 806b and 806c are similar to corresponding well layout patterns 354a, 354b and 354c of layout design 300B of FIG. 3B, and similar detailed description is therefore omitted.

Fourth well layout pattern 808 includes well layout patterns 808a and 808b. Well layout patterns 808a and 808b are similar to corresponding well layout patterns 356a and 356b of layout design 300B of FIG. 3B, and similar detailed description is therefore omitted.

Fifth well layout pattern 812 includes well layout patterns 812a, 812b and 812c. Well layout patterns 812a, 812b and 812c are similar to corresponding well layout patterns 454a, 454b and 454c of layout design 400B of FIG. 4B, and similar detailed description is therefore omitted.

Sixth well layout pattern 814 includes well layout patterns 814a, 814b, 814c and 814d. Well layout patterns 814a, 814b, 814c and 814d are similar to corresponding well layout patterns 456a, 456b, 456c and 456d of layout design 400B of FIG. 4B, and similar detailed description is therefore omitted.

Seventh well layout pattern 816 includes well layout patterns 816a, 816b and 816c. Well layout patterns 816a, 816b and 816c are similar to corresponding well layout patterns 354a, 354b and 354c of layout design 300B of FIG. 3B, and similar detailed description is therefore omitted.

Eighth well layout pattern 818 includes well layout patterns 818a and 818b. Well layout patterns 818a and 818b are similar to corresponding well layout patterns 356a and 356b of layout design 300B of FIG. 3B, and similar detailed description is therefore omitted.

Well layout pattern 822a is similar to well layout pattern 456a of layout design 400B of FIG. 4B, and similar detailed description is therefore omitted. Well layout pattern 824a is similar to well layout pattern 454a of layout design 400B of FIG. 4B, and similar detailed description is therefore omitted. Well layout pattern 828a is similar to well layout pattern 356a of layout design 300B of FIG. 3B, and similar detailed description is therefore omitted.

In some embodiments, well layout patterns 804a and 828a are part of a same continuous well layout pattern. In some embodiments, at least two of well layout patterns 802a, 802b, 802c, 806a and 806b are part of a same continuous well layout pattern. In some embodiments, well layout patterns 804c and 808a are part of a same continuous well layout pattern. In some embodiments, well layout patterns 802c and 806b are part of a same continuous well layout pattern. In some embodiments, at least two of well layout patterns 804b, 814a and 808b are part of a same continuous well layout pattern.

In some embodiments, at least two of well layout patterns 812a, 812b, 812c, 816a and 816b are part of a same continuous well layout pattern. In some embodiments, well layout patterns 814c and 818a are part of a same continuous well layout pattern. In some embodiments, well layout patterns 812c and 816b are part of a same continuous well layout pattern. In some embodiments, at least two of well layout patterns 822a, 814b and 818b are part of a same continuous well layout pattern. In some embodiments, well layout patterns 816c and 824a are part of a same continuous well layout pattern.

Other quantities or configurations of one or more of first well layout pattern 802, second well layout pattern 804, third well layout pattern 806, fourth well layout pattern 808, fifth well layout pattern 812, sixth well layout pattern 814, seventh well layout pattern 816, eighth well layout pattern 818 or well layout patterns 822a, 824a and 828a are within the scope of the present disclosure.

In some embodiments, layout design 800 has a non-rectangular shape which results in a smaller standard cell than other designs. In some embodiments, by having a smaller standard cell, layout design 800 can be utilized to manufacture integrated circuits that are smaller than other integrated circuits.

Figure 9:
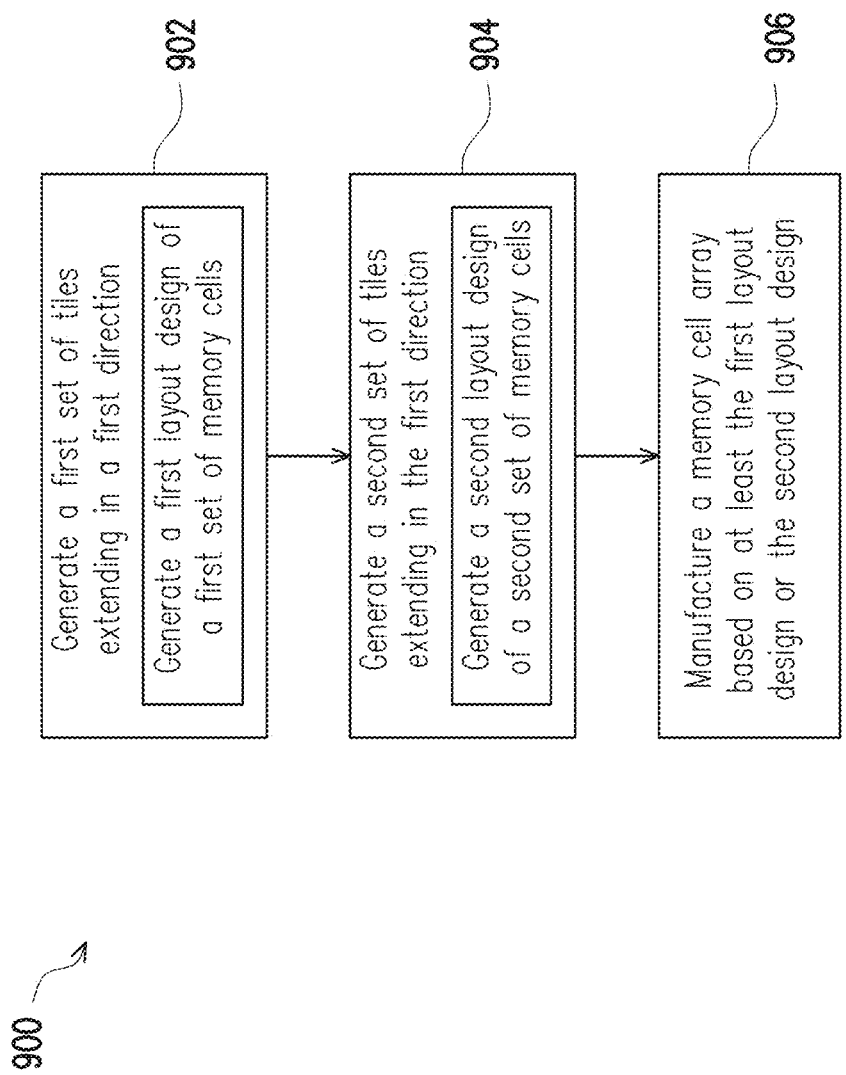
FIG. 9 is a flowchart of a method of forming or manufacturing a memory cell array, in accordance with some embodiments.

FIG. 9 is a flowchart of a method 900 of forming or manufacturing a memory cell array in accordance with some embodiments. It is understood that additional operations may be performed before, during, and/or after the method 900 depicted in FIG. 9, and that some other processes may only be briefly described herein. In some embodiments, the method 900 is usable to form one or more memory cells, such as memory cell 100 (FIG. 1), one or more memory cell arrays, such as memory cell array 200A-200B (FIGS. 2A-2B) or one or more integrated circuits such as integrated circuit 500A-500H (FIGS. 5A-5H). In some embodiments, the method 900 is usable to form memory cell arrays or integrated circuits having similar structural relationships as one or more of layout designs 300A-300B, 400A-400B or 600-800 (FIG. 3A-3B, 4A-4B or 6-8).

In operation 902 of method 900, a first set of tiles 602 extending in a first direction (e.g., third direction S) is generated. In some embodiments, generating the first set of tiles 602 of operation 902 includes operation 902a.

In some embodiments, operation 902a includes generating a first layout design (e.g., layout design 300A-300B) of a first set of memory cells 204. In some embodiments, at least one tile of the first set of tiles 602 corresponds to layout design 300A or 300B. In some embodiments, each tile of the first set of tiles 602 corresponds to layout design 300A or 300B of the first set of memory cells 204. In some embodiments, each tile of the first set of tiles 602 is offset from an adjacent tile of the first set of tiles in the second direction Y different from the first direction ((e.g., third direction S).

In some embodiments, generating the first layout design (e.g., layout design 300A-300B) of the first set of memory cells 204 of operation 902a includes generating a first portion 302a of the first layout design (e.g., layout design 300A-300B), generating a second portion 302b of the first layout design, generating a third portion 302c of the first layout design and generating a fourth portion 302d of the first layout design.

In some embodiments, the first portion 302a of the first layout design (e.g., layout design 300A-300B) corresponds to fabricating a first memory cell 202[1,2] of the first set of memory cells 204 of memory cell array 200A-200B. In some embodiments, the second portion 302b of the first layout design (e.g., layout design 300A-300B) corresponds to fabricating a second memory cell 202[2,2] of the first set of memory cells 204 of memory cell array 200A-200B. In some embodiments, the third portion 302c of the first layout design (e.g., layout design 300A-300B) corresponds to fabricating a third memory cell 202[1,3] of the first set of memory cells 204 of memory cell array 200A-200B. In some embodiments, the fourth portion 302d of the first layout design (e.g., layout design 300A-300B) corresponds to fabricating a fourth memory cell 202[2,3] of the first set of memory cells 204 of memory cell array 200A-200B.

In some embodiments, the first portion 302a of the first layout design (e.g., layout design 300A-300B) and the second portion 302b of the first layout design are mirror images of each other with respect to the second direction Y.

In some embodiments, the third portion 302c of the first layout design (e.g., layout design 300A-300B) and the fourth portion 302d of the first layout design are mirror images of each other with respect to the second direction Y.

In operation 904 of method 900, a second set of tiles 604 extending in the first direction (e.g., third direction S) is generated. In some embodiments, the second set of tiles 604 is separated from the first set of tiles 602 in at least the second direction Y. In some embodiments, generating the second set of tiles 604 of operation 904 includes operation 904a.

In some embodiments, operation 904a includes generating a second layout design (e.g., layout design 400A-400B) of a second set of memory cells 206. In some embodiments, at least one tile of the second set of tiles 604 corresponds to layout design 400A or 400B. In some embodiments, each tile of the second set of tiles 604 corresponds to the second layout design (e.g., layout design 400A-400B) of the second set of memory cells 206. In some embodiments, each tile of the second set of tiles 604 is offset from an adjacent tile of the second set of tiles 604 in the second direction Y.

In some embodiments, generating the second layout design (e.g., layout design 400A-400B) of the second set of memory cells 206 of operation 904a includes generating a first portion 402a of the second layout design (e.g., layout design 400A-400B), generating a second portion 402b of the first layout design, generating a third portion 402c of the first layout design and generating a fourth portion 402d of the first layout design.

In some embodiments, the first portion 402a of the second layout design (e.g., layout design 400A-400B) corresponds to fabricating a first memory cell 202[2,4] of the second set of memory cells 206 of memory cell array 200A-200B. In some embodiments, the second portion 402b of the second layout design (e.g., layout design 400A-400B) corresponds to fabricating a second memory cell 202[3,4] of the second set of memory cells 206 of memory cell array 200A-200B. In some embodiments, the third portion 402c of the second layout design (e.g., layout design 400A-400B) corresponds to fabricating a third memory cell 202[2,5] of the second set of memory cells 206 of memory cell array 200A-200B. In some embodiments, the fourth portion 402d of the second layout design (e.g., layout design 400A-400B) corresponds to fabricating a fourth memory cell 202[3,5] of the second set of memory cells 206 of memory cell array 200A-200B.

In some embodiments, the first portion 402a of the second layout design (e.g., layout design 400A-400B) and the third portion 402c of the second layout design are mirror images of each other with respect to the third direction (e.g., first direction X). In some embodiments, the second portion 402b of the second layout design (e.g., layout design 400A-400B) and the fourth portion 402d of the second layout design are mirror images of each other with respect to the third direction (e.g., first direction X).

In some embodiments, the first set of tiles 602 and the second set of tiles 604 alternate with each other in the second direction X. In some embodiments, each tile of the first set of tiles 602 and each tile of the second set of tiles 604 extends in a third direction (e.g., first direction X) different from the first direction and the second direction.

In some embodiments, at least operation 902 or 904 is performed by a processing device (e.g., processor 1202 (FIG. 12)) configured to execute instructions for generating the first set of tiles 602 or the second set of tiles 604. In some embodiments, the first set of tiles 602 or the second set of tiles 604 are stored in a memory (e.g., a non-transitory computer-readable medium 1204 (FIG. 12)) as layout design 1216.

In some embodiments, at least layout design 300A-300B, 400A-400B or 600-800 is a graphic database system (GD-SII) file format.

In operation 906 of method 900, a memory cell array 200A or 200B or an integrated circuit 500A or 500B is manufactured based on at least the first layout design (layout design 300A or 300B), the second layout design (second layout design 400A or 400B) or layout designs 600-800. In some embodiments, operation 906 of method 900 includes manufacturing memory cell array 200A or 200B or integrated circuit 500A or 500B based on at least the first set of tiles 602 or the second set of tiles 604. In some embodiments, operation 906 includes manufacturing memory cell 100 based on at least the first layout design 300A or 300B or second layout design 400A or 400B. In some embodiments, operation 906 includes manufacturing memory cell array 200A or 200B or integrated circuit 500A or 500B based on at least the first set of tiles 602 or the second set of tiles 604.

In some embodiments, operation 906 of method 900 comprises manufacturing at least one mask based on at least layout design 300A-300B, 400A-400B or 600-800, and manufacturing the memory cell array (e.g., memory cell, 100, memory cell array 200A-200B) or integrated circuit (e.g., integrated circuit 500A or 500B) based on the at least one mask.

In some embodiments, one or more of operations 902, 904 or 906 is not performed.

In some embodiments, method 900 generates one or more layout designs (e.g., first layout design 300A-300B, second layout design 400A-400B or layout design 600-800) that occupy less area than other approaches. In some embodiments, method 900 is used to manufacture a memory cell array (e.g., memory cell 100, memory cell array 200A-200B or integrated circuit 500A-500B) that occupies less area than other memory cell arrays.

Figure 10A:
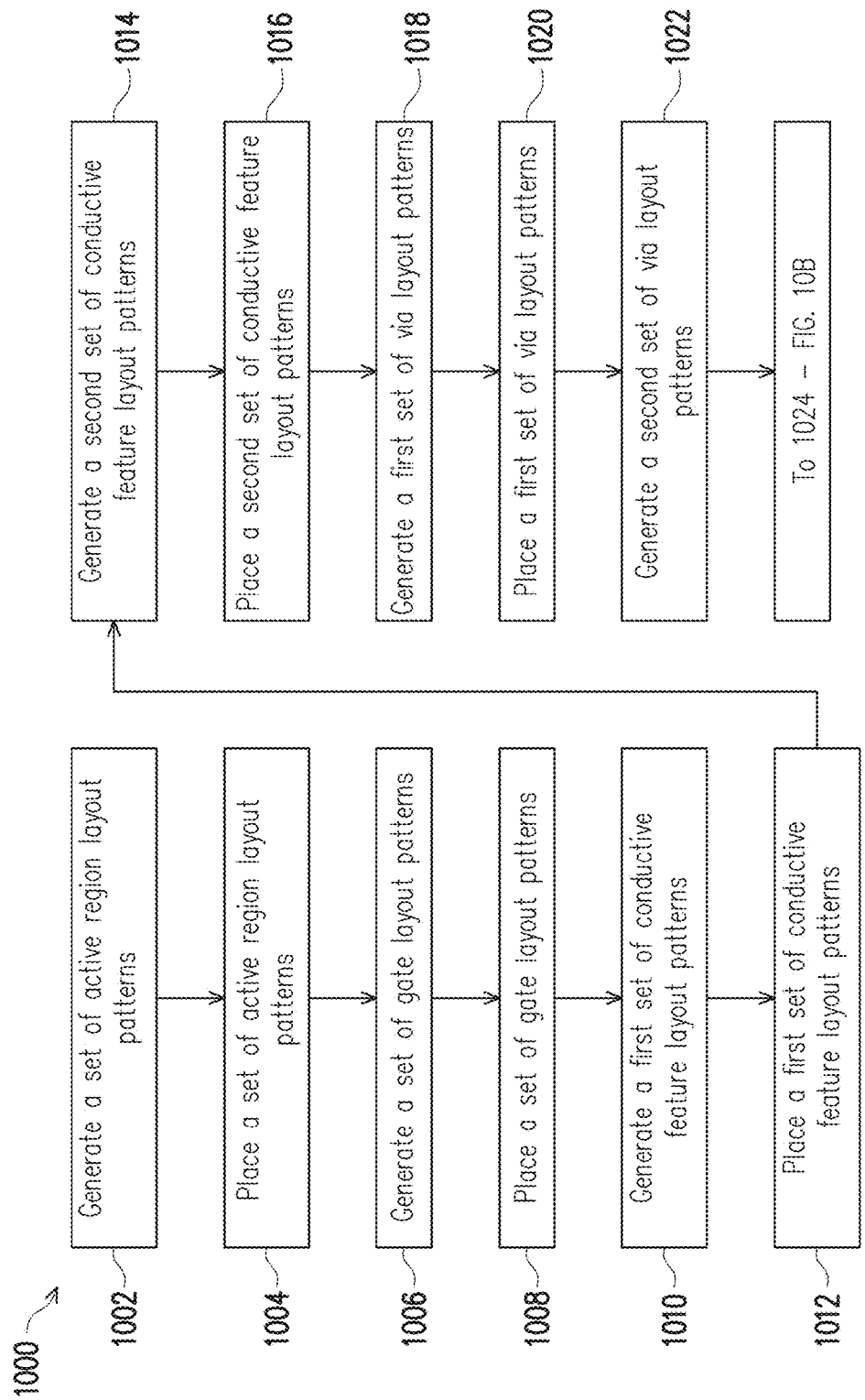
FIGS. 10A-10B are flowcharts of a method of generating a layout design of a memory cell array, in accordance with some embodiments.
Figure 10B:
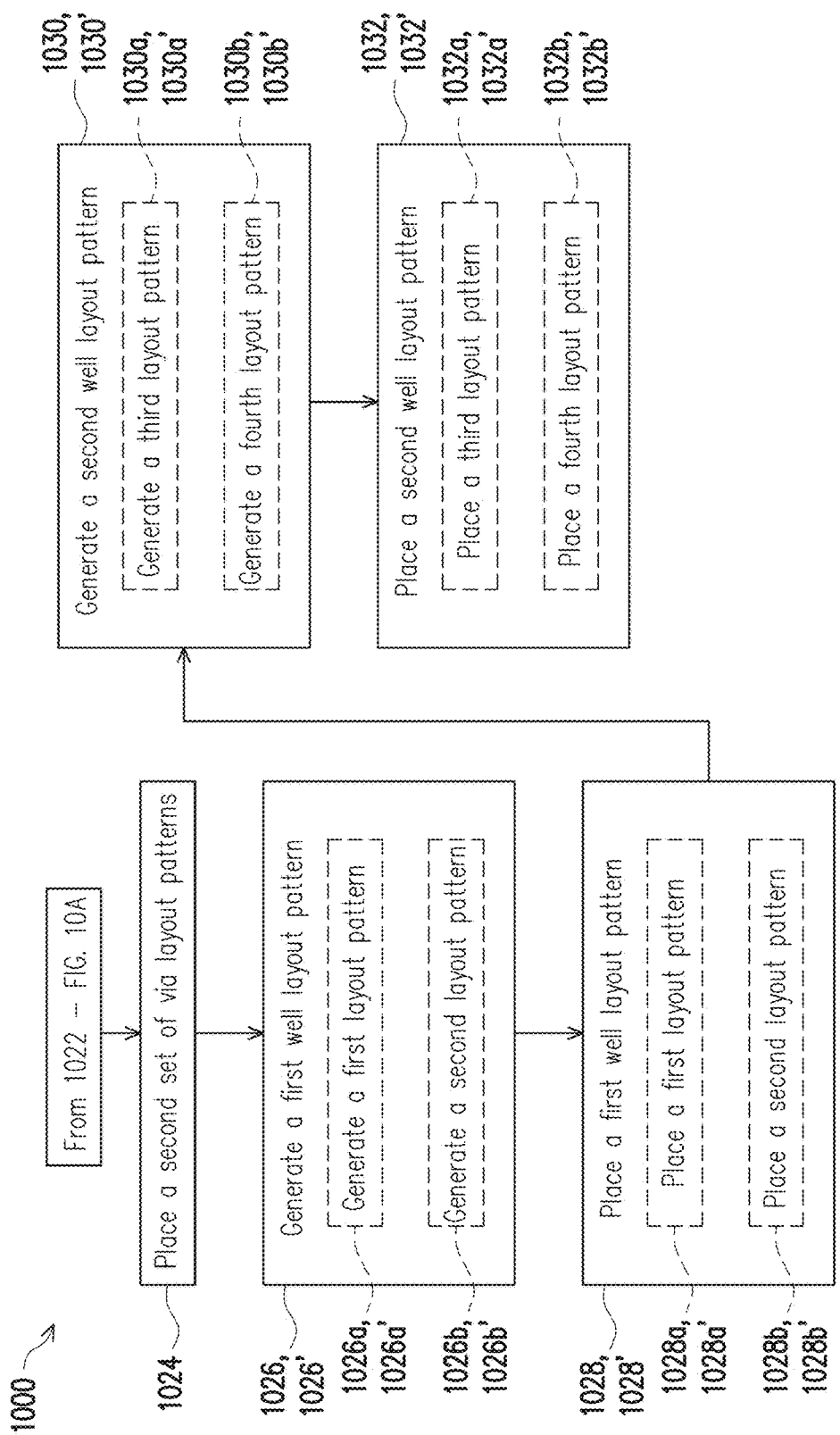

FIGS. 10A-10B are a flowchart of a method 1000 of generating a layout design of a memory cell array in accordance with some embodiments. It is understood that additional operations may be performed before, during, and/or after the method 1000 depicted in FIGS. 10A-10B, and that some other processes may only be briefly described herein. Method 1000 is an embodiment of at least operation 902a or 904a. In some embodiments, the method 1000 is usable to generate one or more of layout designs 300A-300B (FIGS. 3A-3B) or 400A-400B (FIGS. 4A-4B) or 600-700 (FIGS. 600-700) of memory cell 100 (FIG. 1), memory cell array 200A-200B (FIGS. 2A-2B) or integrated circuit 500A-500B (FIGS. 5A-5H).

In operation 1002 of method 1000, a set of active region layout patterns 312a or 412a is generated. In some embodiments, generating the set of active region layout patterns 312a, 412a corresponds to fabricating a set of active regions 504 or 505 of memory cell array 200A-200B. In some embodiments, each of the layout patterns of the set of active region layout patterns 312a, 412a is separated from an adjacent layout pattern of the set of active region layout patterns 312a, 412a in the first direction X by a first pitch. In some embodiments, the set of active region layout patterns 312a, 412a extend in the second direction Y different from the first direction and being located on a first layout level (e.g., active region or well).

In some embodiments, the set of active region layout patterns of method 1000 includes one or more of set of active region layout patterns 312b, 312c, 312d, 412a, 412b or 412c.

In some embodiments, generating the set of active region layout patterns 312a, 412a of operation 1002 includes generating a first active region layout pattern 304a, 404a adjacent to a first side 352a, 452a of the layout design 300A-300B or 400A-400B of memory cell 100, and generating a second active region layout pattern 310a, 410a adjacent to a second side 352b1, 452b1 of memory cell 100 opposite from the first side 352a, 452a of the memory cell 100. In some embodiments, a length of the first active region layout pattern 304a, 404a in the second direction Y is different from a length of the second active region layout pattern 310a, 410a in the second direction Y.

In operation 1004, a set of active region layout patterns 312a, 412a is placed on a first layout level. In some embodiments, the first layout level corresponds to the active region of layout design 300A-300B or 400A-400B (FIGS. 4A-4B).

In operation 1006, a set of gate layout patterns 326a or 426a is generated. In some embodiments, the set of gate layout patterns 326a, 426a corresponds to fabricating a set of gate structures 527 of memory cell array 200A-200B or integrated circuit 500A-500B. In some embodiments, the set of gate layout patterns 326a, 426a extends in the first direction X and overlaps the set of active region layout patterns 312a, 412a.

In some embodiments, the set of gate layout patterns of method 1000 includes one or more of set of gate layout patterns 326b, 326c, 326d, 426b, 426c or 426d.

In operation 1008, the set of gate layout patterns 326a, 426a is placed on a second layout level (e.g., POLY) different from the first layout level.

In operation 1010, a first set of conductive feature layout patterns 338a or 438a is generated. In some embodiments, the first set of conductive feature layout patterns 338a, 438a corresponds to fabricating a first set of conductive structures 538 of memory cell array 200A-200B or integrated circuit 500A-500B. In some embodiments, the first set of conductive feature layout patterns 338a, 438a extends in the first direction X, and is over at least the set of active region layout patterns 312a, 412a or the set of gate layout patterns 326a, 426a. In some embodiments, each conductive feature layout pattern of the first set of conductive feature layout patterns 338a, 438a is separated from an adjacent layout pattern of the first set of conductive feature layout patterns 338a, 438a in at least the first direction X or the second direction Y.

In some embodiments, the first set of conductive feature layout patterns of method 1000 includes one or more of set of conductive feature layout patterns 338b, 338c, 338d, 340, 342, 344, 438b, 438c, 438d, 440, 442 or 444.

In operation 1012, the first set of conductive feature layout patterns 338a, 438a is placed on a third layout level (e.g., M1) different from the first layout level and the second layout level.

In operation 1014, a second set of conductive feature layout patterns 350 or 450 is generated. In some embodiments, the second set of conductive feature layout patterns 350, 450 corresponds to fabricating a second set of conductive structures 552 of memory cell array 200A-200B or integrated circuit 500A-500B. In some embodiments, the second set of conductive feature layout patterns 350, 450 extends in the first direction X and overlaps at least the second active region layout pattern 310a, 310b, 310c, 310d, 410a, 410b, 410c or 410d and the second side 352b1, 452b1 of layout design 300A-300b, 400A-400B of memory cell 100. In some embodiments, each conductive feature layout pattern of the second set of conductive feature layout patterns 350, 450 is separated from an adjacent layout pattern of the second set of conductive feature layout patterns 350, 450 in at least the first direction X or the second direction Y.

In operation 1016, the second set of conductive feature layout patterns 350, 450 is placed on a fourth layout level (e.g., M2) different from the first layout level, the second layout level and the third layout level.

In operation 1018, a first set of via layout patterns 358a or 458a is generated. In some embodiments, the first set of via layout patterns 358a, 458a corresponds to fabricating a first set of vias 572. In some embodiments, the first set of vias 572 couple the first set of conductive structures 538 to the set of active regions 504, 505. In some embodiments, each via layout pattern of the first set of via layout patterns 358a, 458a is located where each conductive feature layout pattern of the first set of conductive feature layout patterns 338a, 438a overlaps each active region layout pattern of the set of active region layout patterns 312a, 412a.

In some embodiments, the first set of via layout patterns of method 1000 includes one or more of via layout patterns 358b, 358c, 358d, 458b, 458c, 458d, 374, 376, 378, 380, 474, 476, 478 or 480.

In operation 1020, the first set of via layout patterns 358a, 458a is placed between the first set of conductive feature layout patterns 338a, 438a and the set of active region layout patterns 312a, 412a. In some embodiments, the first set of via layout patterns 358a, 458a are on at least the V0 level of layout design 300A-300B, 400A-400B.

In operation 1022, a second set of via layout patterns 380 or 480 is generated. In some embodiments, the second set of via layout patterns 380, 480 corresponds to fabricating a second set of vias 523. In some embodiments, the second set of vias 523 couple the first set of conductive structures 338a, 438a to the set of gates 527. In some embodiments, a first via layout pattern 380a, 480a of the second set of via layout patterns 380, 480 is located where a first conductive feature layout pattern 340a, 440a of the set of conductive feature layout patterns 340, 440 overlaps a first gate layout pattern 324a, 324c, 424a, 424c of the set of gate layout patterns 326a, 426a.

In some embodiments, the second set of via layout patterns of method 1000 includes one or more of via layout patterns 358a, 358b, 358c, 358d, 458a, 458b, 458c, 458d, 374, 376, 378, 474, 476 or 478.

In operation 1024, the second set of via layout patterns 380, 480 is placed between the first set of conductive feature layout patterns 340, 440 and the set of gate layout patterns 326a, 426a. In some embodiments, the second set of via layout patterns 380, 480 are on at least the VG level of layout design 300A-300B, 400A-400B Method 1000 includes either operations 1026-1032 or operations 1026'-1032'.

Operations 1026-1032 are discussed with reference to layout design 300A-300B. For example, first well layout pattern 314 corresponds to the first well layout pattern of operations 1026-1032, and the second well layout pattern 316 corresponds to the second well layout pattern of operations 1026-1032 of layout design 300A-300B.

Operations 1026'-1032' are discussed with reference to layout design 400A-400B, such that first well layout pattern 416 corresponds to the first well layout pattern of operations 1026'-1032', and the second well layout pattern 414 corresponds to the second well layout pattern of operations 1026'-1032'.

For simplicity, operations 1026'-1032' are discussed after the discussion of operations 1026-1032.

In operation 1026, a first well layout pattern 314 is generated. In some embodiments, the first well layout pattern 314 corresponds to fabricating a first well 501 of memory cell array 200A-200B or integrated circuit 500A. In some embodiments, the first well 501 has a first dopant type. In some embodiments, the first dopant type is an N-dopant type. In some embodiments, the first dopant type is a P-dopant type.

In some embodiments, operation 1026 includes one or more of operations 1026a or 1026b.

In some embodiments, operation 1026a includes generating a first layout pattern (e.g., layout pattern 354a or 354c). In some embodiments, the first layout pattern 354a corresponds to fabricating a first portion 501a of the first well 501. In some embodiments, the first layout pattern 354a extends in the second direction Y and is adjacent to the first side 352a of the layout design 300B of memory cell 100.

In some embodiments, operation 1026b includes generating a second layout pattern (e.g., layout pattern 354b). In some embodiments, the second layout pattern 354b corresponds to fabricating a second portion 501b of the first well 501. In some embodiments, the second layout pattern extends in the second direction and is adjacent to the second side of the memory cell 100.

In operation 1028, the first well layout pattern 314 is placed on a fourth layout level (e.g., well level) different from the first layout level, the second layout level and the third layout level. In some embodiments, a portion of the fourth layout level includes the first layout level. In some embodiments, a portion of the fourth layout level is the same as the first layout level.

In some embodiments, operation 1028 includes one or more of operations 1028a or 1028b.

In some embodiments, operation 1028a includes placing the first layout pattern 354a below the first active region layout pattern 304a.

In some embodiments, operation 1028b includes placing the second layout pattern 354b below the second active region layout pattern 310a.

In operation 1030, a second well layout pattern 316 is generated. In some embodiments, the second well layout pattern 316 corresponds to fabricating a second well 501' of memory cell array 200A-200B or integrated circuit 500A. In some embodiments, the second well 501' has a second dopant type different from the first dopant type. In some embodiments, the second dopant type is a P-dopant type. In some embodiments, the second dopant type is an N-dopant type.

In some embodiments, operation 1030 includes one or more of operations 1030a or 1030b.

In some embodiments, operation 1030a includes generating a third layout pattern (e.g., layout pattern 356a). In some embodiments, the third layout pattern 356a corresponds to fabricating a portion 501c of the second well 501'. In some embodiments, the third layout pattern 356a extends in the second direction Y. In some embodiments, the third layout pattern 356a is between the first layout pattern and 354a the second layout pattern 354b.

In some embodiments, operation 1030b includes generating a fourth layout pattern (e.g., layout pattern 356b). In some embodiments, the fourth layout pattern 356b corresponds to fabricating a portion of the second well 501' similar to portion 501c. In some embodiments, the fourth layout pattern 356b extends in the second direction Y. In some embodiments, the fourth layout pattern 356b is between the second layout pattern 354b and the third layout pattern 354c.

In operation 1032, the second well layout pattern 316 is placed on the fourth layout level. In some embodiments, operation 1032 further includes placing the second well layout pattern 316 between the first layout pattern 354a and the second layout pattern 354b. In some embodiments, operation 1032 further includes placing the second well layout pattern 316 below a third active region layout pattern 306a of the set of active region layout patterns 312a and a fourth active region 308a of the set of active region layout patterns 312a.

In some embodiments, operation 1032 includes one or more of operations 1032a or 1032b.

In some embodiments, operation 1032a includes placing the third layout pattern 356a below each of a third active region layout pattern 306a of the set of active region layout patterns 312a and a fourth active region 308a of the set of active region layout patterns 312a.

In some embodiments, operation 1032b includes placing the fourth layout pattern 356b below each of active region layout pattern 306b of the set of active region layout patterns 312a and active region 308b of the set of active region layout patterns 312a.

For simplicity, operations 1026'-1032' are discussed after the discussion of operations 1026-1032.

In operation 1026', a first well layout pattern 416 is generated. In some embodiments, the first well layout pattern 416 corresponds to fabricating a first well 502 of memory cell array 200A-200B or integrated circuit 500B. In some embodiments, the first well 502 has a first dopant type. In some embodiments, the first dopant type is a P-dopant type. In some embodiments, the first dopant type is an N-dopant type.

In some embodiments, operation 1026' includes one or more of operations 1026a' or 1026b'.

In some embodiments, operation 1026a' includes generating a first layout pattern (e.g., layout pattern 456a or 456b). In some embodiments, the first layout pattern 456a corresponds to fabricating a first portion 502a of the first well 502. In some embodiments, the first layout pattern 456a extends in the second direction Y and is adjacent to the first side 452a of the layout design 400B of memory cell 100.

In some embodiments, operation 1026b' includes generating a second layout pattern (e.g., layout pattern 456c or 456d). In some embodiments, the second layout pattern 456c corresponds to fabricating a second portion 502b of the first well 501. In some embodiments, the second layout pattern 456c extends in the second direction Y and is adjacent to the second side 452b1 of the layout design 400B of memory cell 100.

In operation 1028', the first well layout pattern 416 is placed on the fourth layout level. In some embodiments, operation 1028' includes one or more of operations 1028a' or 1028b'.

In some embodiments, operation 1028a' includes placing the first layout pattern 456a below the first active region layout pattern 404a.

In some embodiments, operation 1028b' includes placing the second layout pattern 456c below a first portion 410a1 of the second active region layout pattern 410a.

In operation 1030', a second well layout pattern 414 is generated. In some embodiments, the second well layout pattern 414 corresponds to fabricating a second well 502' of memory cell array 200A-200B or integrated circuit 500B. In some embodiments, the second well 502' has a second dopant type different from the first dopant type. In some embodiments, the second dopant type is an N-dopant type. In some embodiments, the second dopant type is a P-dopant type.

In some embodiments, operation 1030' includes one or more of operations 1030a' or 1030b'.

In some embodiments, operation 1030a' includes generating a third layout pattern (e.g., layout pattern 454a or 454c). In some embodiments, the third layout pattern 454a corresponds to fabricating a first portion 502c of the second well 502'. In some embodiments, the third layout pattern 454a extends in the second direction Y.

In some embodiments, operation 1030b' includes generating a fourth layout pattern (e.g., layout pattern 454b). In some embodiments, the fourth layout pattern 454b corresponds to fabricating a second portion 502d of the second well 502'. In some embodiments, the fourth layout pattern 454b extends in the second direction Y and is adjacent to the second side 452b1 of the layout design 400B of memory cell 100.

In operation 1032', the second well layout pattern 414 is placed on the fourth layout level.

In some embodiments, operation 1032' includes one or more of operations 1032a' or 1032b'.

In some embodiments, operation 1032a' includes placing the third layout pattern 454a between the first layout pattern 456a and at least the second layout pattern 456c or the fourth layout pattern 456d. In some embodiments, operation 1032a' includes placing the third layout pattern 454a below a third active region layout pattern 406a of the set of active region layout patterns 412a and a fourth active region 408a of the set of active region layout patterns 412a.

In some embodiments, operation 1032b' includes placing the fourth layout pattern 454b below a second portion 410a2 of the second active region layout pattern 410a.

In some embodiments, one or more of operations 1002-1024, 1026-1032 or 1026'-1032' is not performed.

One or more of the operations of methods 1000 is performed by a processing device (e.g., processor 1202 (FIG. 12)) configured to execute instructions for generating a layout design (e.g., first layout design 300A-300B, second layout design 400A-400B or layout design 600-800). In some embodiments, first layout design 300A-300B, second layout design 400A-400B or layout design 600-800 are stored in a memory (e.g., a non-transitory computer-readable medium 1204 (FIG. 12)) as layout design 1216. In some embodiments, one or more operations of methods 900-1000 is performed using a same processing device as that used in a different one or more operations of methods 900-1000. In some embodiments, a different processing device is used to perform one or more operations of methods 900-1000 from that used to perform a different one or more operations of methods 900-1000.

In some embodiments, method 1000 generates one or more layout designs (e.g., first layout design 300A-300B, second layout design 400A-400B or layout design 600-800) that occupy less area than other approaches.

Figure 11:
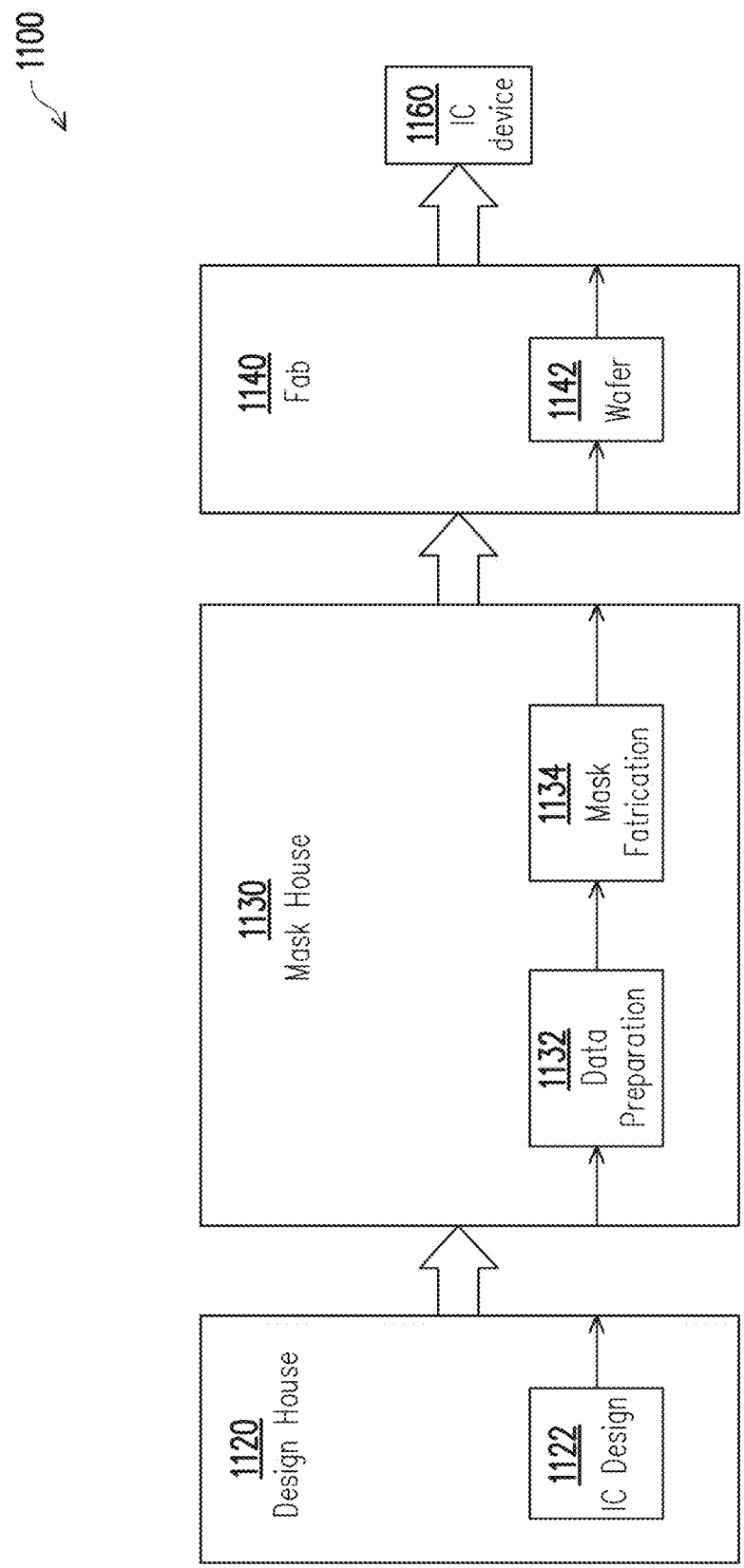
FIG. 11 is a block diagram of an integrated circuit (IC) manufacturing system and an IC manufacturing flow associated therewith, in accordance with some embodiments.

FIG. 11 is a block diagram of an integrated circuit (IC) manufacturing system 1100, and an IC manufacturing flow associated therewith, in accordance with at least one embodiment of the present disclosure.

In FIG. 11, IC manufacturing system 1100 includes entities, such as a design house 1120, a mask house 1130, and an IC manufacturer/fabricator ("fab") 1140, that interact with one another in the design, development, and manufacturing cycles and/or services related to manufacturing an IC device 1160. The entities in system 1100 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1120, mask house 1130, and IC fab 1140 is owned by a single larger company. In some embodiments, two or more of design house 1120, mask house 1130, and IC fab 1140 coexist in a common facility and use common resources.

Design house (or design team) 1120 generates an IC design layout 1122. IC design layout 1122 includes various geometrical patterns designed for an IC device 1160. The geometrical patterns correspond to patterns of metal, oxide, or semiconductor layers that make up the various components of IC device 1160 to be fabricated. The various layers combine to form various IC features. For example, a portion of IC design layout 1122 includes various IC features, such as an active region, gate electrode, source electrode and drain electrode, metal lines or vias of an interlayer interconnection, and openings for bonding pads, to be formed in a semiconductor substrate (such as a silicon wafer) and various material layers disposed on the semiconductor substrate. Design house 1120 implements a proper design procedure to form IC design layout 1122. The design procedure includes one or more of logic design, physical design or place and route. IC design layout 1122 is presented in one or more data files having information of the geometrical patterns. For example, IC design layout 1122 can be expressed in a GDSII file format or DFII file format.

Mask house 1130 includes data preparation 1132 and mask fabrication 1134. Mask house 1130 uses IC design layout 1122 to manufacture one or more masks to be used for fabricating the various layers of IC device 1160 according to IC design layout 1122. Mask house 1130 performs mask data preparation 1132, where IC design layout 1122 is translated into a representative data file ("RDF"). Mask data preparation 1132 provides the RDF to mask fabrication 1134. Mask fabrication 1134 includes a mask writer. A mask writer converts the RDF to an image on a substrate, such as a mask (reticle) or a semiconductor wafer. The IC design layout 1122 is manipulated by mask data preparation 1132 to comply with particular characteristics of the mask writer and/or requirements of IC fab 1140. In FIG. 11, mask data preparation 1132 and mask fabrication 1134 are illustrated as separate elements. In some embodiments, mask data preparation 1132 and mask fabrication 1134 can be collectively referred to as mask data preparation.

In some embodiments, mask data preparation 1132 includes optical proximity correction (OPC) which uses lithography enhancement techniques to compensate for image errors, such as those that can arise from diffraction, interference, other process effects and the like. OPC adjusts IC design layout 1122. In some embodiments, mask data preparation 1132 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1132 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout 1122 to compensate for limitations during mask fabrication 1134, which may undo part of the modifications performed by OPC in order to meet mask creation rules.

In some embodiments, mask data preparation 1132 includes lithography process checking (LPC) that simulates processing that will be implemented by IC fab 1140 to fabricate IC device 1160. LPC simulates this processing based on IC design layout 1122 to create a simulated manufactured device, such as IC device 1160. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout 1122.

It should be understood that the above description of mask data preparation 1132 has been simplified for the purposes of clarity. In some embodiments, data preparation 1132 includes additional features such as a logic operation (LOP) to modify the IC design layout 1122 according to manufacturing rules. Additionally, the processes applied to IC design layout 1122 during data preparation 1132 may be executed in a variety of different orders.

After mask data preparation 1132 and during mask fabrication 1134, a mask or a group of masks are fabricated based on the modified IC design layout. In some embodiments, an electron-beam (e-beam) or a mechanism of multiple e-beams is used to form a pattern on a mask (photomask or reticle) based on the modified IC design layout. The mask can be formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM. The mask(s) generated by mask fabrication 1134 is used in a variety of processes. For example, such a mask(s) is used in an ion implantation process to form various doped regions in the semiconductor wafer, in an etching process to form various etching regions in the semiconductor wafer, and/or in other suitable processes.

IC fab 1140 is an IC fabrication business that includes one or more manufacturing facilities for the fabrication of a variety of different IC products. In some embodiments, IC Fab 1140 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1140 uses the mask (or masks) fabricated by mask house 1130 to fabricate IC device 1160. Thus, IC fab 1140 at least indirectly uses IC design layout 1122 to fabricate IC device 1160. In some embodiments, a semiconductor wafer 1142 is fabricated by IC fab 1140 using the mask (or masks) to form IC device 1160. Semiconductor wafer 1142 includes a silicon substrate or other proper substrate having material layers formed thereon. Semiconductor wafer further includes one or more of various doped regions, dielectric features, multilevel interconnects, and the like (formed at subsequent manufacturing steps).

Details regarding an integrated circuit (IC) manufacturing system (e.g., system 1100 of FIG. 11), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

Figure 12:
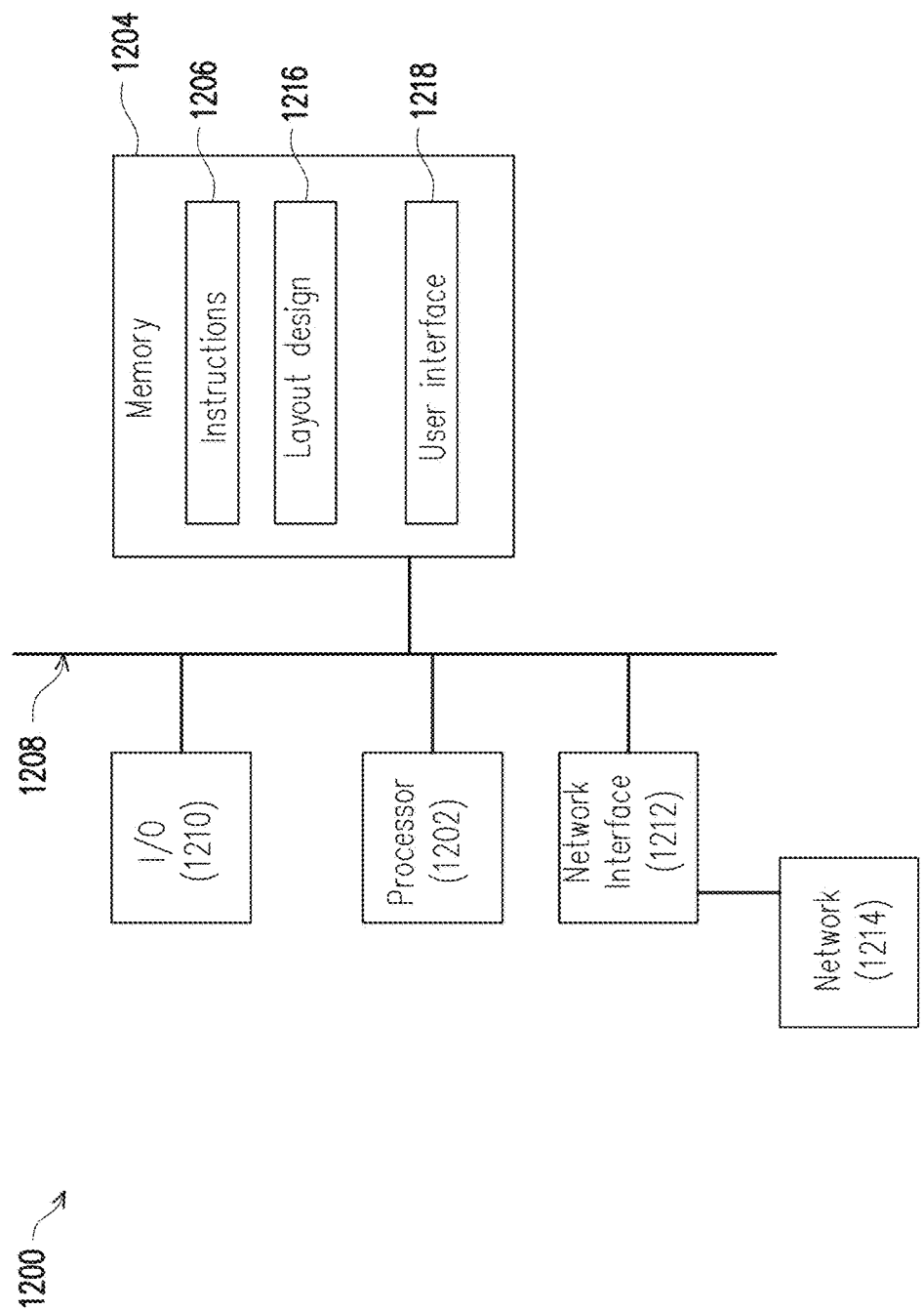
FIG. 12 is a block diagram of a system for designing an IC layout design, in accordance with some embodiments.

FIG. 12 is a block diagram of a system 1200 for designing an IC layout design in accordance with some embodiments. In some embodiments, system 1200 generates or places one or more IC layout designs described herein. System 1200 includes a hardware processor 1202 and a non-transitory, computer readable storage medium 1204 encoded with, i.e., storing, the computer program code 1206, i.e., a set of executable instructions. Computer readable storage medium 1204 is configured for interfacing with manufacturing machines for producing the integrated circuit (e.g., memory cell array). The processor 1202 is electrically coupled to the computer readable storage medium 1204 via a bus 1208. The processor 1202 is also electrically coupled to an I/O interface 1210 by bus 1208. A network interface 1212 is also electrically connected to the processor 1202 via bus 1208. Network interface 1212 is connected to a network 1214, so that processor 1202 and computer readable storage medium 1204 are capable of connecting to external elements via network 1214. The processor 1202 is configured to execute the computer program code 1206 encoded in the computer readable storage medium 1204 in order to cause system 1200 to be usable for performing a portion or all of the operations as described in method 900 or 1000.

In some embodiments, the processor 1202 is a central processing unit (CPU), a multi-processor, a distributed processing system, an application specific integrated circuit (ASIC), and/or a suitable processing unit.

In some embodiments, the computer readable storage medium 1204 is an electronic, magnetic, optical, electromagnetic, infrared, and/or a semiconductor system (or apparatus or device). For example, the computer readable storage medium 1204 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 1204 includes a compact disk-read only memory (CD-ROM), a compact disk-read/write (CD-R/W), and/or a digital video disc (DVD).

In some embodiments, the storage medium 1204 stores the computer program code 1206 configured to cause system 1200 to perform method 900 or 1000. In some embodiments, the storage medium 1204 also stores information needed for performing method 900 or 1000 as well as information generated during performing method 900 or 1000, such as layout design 1216 and user interface 1218, and/or a set of executable instructions to perform the operation of method 900 or 1000. In some embodiments, layout design 1216 comprises one or more of layout designs 300A, 300B, 400A, 400B or 600-800.

In some embodiments, the storage medium 1204 stores instructions (e.g., computer program code 1206) for interfacing with manufacturing machines. The instructions (e.g., computer program code 1206) enable processor 1202 to generate manufacturing instructions readable by the manufacturing machines to effectively implement method 900 or 1000 during a manufacturing process.

System 1200 includes I/O interface 1210. I/O interface 1210 is coupled to external circuitry. In some embodiments, I/O interface 1210 includes a keyboard, keypad, mouse, trackball, trackpad, and/or cursor direction keys for communicating information and commands to processor 1202.

System 1200 also includes network interface 1212 coupled to the processor 1202. Network interface 1212 allows system 1200 to communicate with network 1214, to which one or more other computer systems are connected. Network interface 1212 includes wireless network interfaces such as BLUETOOTH, WIFI, WIMAX, GPRS, or WCDMA; or wired network interface such as ETHERNET, USB, or IEEE-1394. In some embodiments, method 900 or 1000 is implemented in two or more systems 1200, and information such as layout design, and user interface are exchanged between different systems 1200 by network 1214.

System 1200 is configured to receive information related to a layout design through I/O interface 1210 or network interface 1212. The information is transferred to processor 1202 by bus 1208 to determine a layout design for producing one or more of memory cell 100, memory cell array 200A or 200B or memory cell array 500A or 500B. The layout design is then stored in computer readable medium 1204 as layout design 1216. System 1200 is configured to receive information related to a user interface through I/O interface 1210 or network interface 1212. The information is stored in computer readable medium 1204 as user interface 1218.

In some embodiments, method 900 or 1000 is implemented as a standalone software application for execution by a processor. In some embodiments, method 900 or 1000 is implemented as a software application that is a part of an additional software application. In some embodiments, method 900 or 1000 is implemented as a plug-in to a software application.

In some embodiments, method 900 or 1000 is implemented as a software application that is a portion of an EDA tool. In some embodiments, method 900 or 1000 is implemented as a software application that is used by an EDA tool. In some embodiments, the EDA tool is used to generate a layout of the integrated circuit device or memory cell array. In some embodiments, the layout is stored on a non-transitory computer readable medium. In some embodiments, the layout is generated using a tool such as VIRTUOSO® available from CADENCE DESIGN SYSTEMS, Inc., or another suitable layout generating tool. In some embodiments, the layout is generated based on a netlist which is created based on the schematic design. In some embodiments, method 900 or 1000 is implemented by a manufacturing device to manufacture an integrated circuit (e.g., memory cell 100 or memory cell array 300A-300B, 400A-400B, 600-800 or 500A-500H) using a set of masks manufactured based on one or more layout designs (e.g., layout design 300A, 300B, 400A, 400B or 600-800) generated by system 1200.

System 1200 of FIG. 12 generates layout designs (e.g., layout design 300A, 300B, 400A, 400B or 600-800) of memory cell 100, memory cell array 200A or 200B or memory cell array 500A or 500B that occupy less area than other approaches.

One aspect of this description relates to a method of forming a memory cell array. The method includes generating a first set of tiles extending in a first direction, generating a second set of tiles extending in the first direction and being separated from the first set of tiles in the second direction, at least one of the above operations is performed by a hardware processor, and at least one of the above layout designs is stored on a non-transitory computer-readable medium. The method further includes manufacturing the memory cell array based on at least the first layout design or the second layout design. In some embodiments, the generating the first set of tiles includes generating a first layout design of a first set of memory cells, each tile of the first set of tiles corresponds to the first layout design of the first set of memory cells, and each tile of the first set of tiles is offset from an adjacent tile of the first set of tiles in a second direction different from the first direction. In some embodiments, the generating the second set of tiles includes generating a second layout design of a second set of memory cells, each tile of the second set of tiles corresponds to the second layout design of the second set of memory cells, and each tile of the second set of tiles is offset from an adjacent tile of the second set of tiles in the second direction. In some embodiments, the first set of tiles and the second set of tiles alternate with each other in the second direction, each tile of the first set of tiles and each tile of the second set of tiles extends in a third direction different from the first direction and the second direction. In some embodiments, the first set of memory cells are arranged in at least a first row and a second row of the memory cell array. In some embodiments, the second set of memory cells are arranged in at least a third row and a fourth row of the memory cell array. In some embodiments, the first set of memory cells includes 4 memory cells; and the second set of memory cells includes 4 memory cells. In some embodiments, each memory cell of the first set of memory cells comprises a five transistor (5T) synchronous random access memory (SRAM) memory cell; and each memory cell of the second set of memory cells comprises a 5T SRAM memory cell. In some embodiments, the generating the first layout design of the first set of memory cells includes generating a first portion of the first layout design, the first portion of the first layout design corresponding to fabricating a first memory cell of the first set of memory cells of the memory cell array; generating a second portion of the first layout design, the second portion of the first layout design corresponding to fabricating a second memory cell of the first set of memory cells of the memory cell array; generating a third portion of the first layout design, the third portion of the first layout design corresponding to fabricating a third memory cell of the first set of memory cells of the memory cell array; and generating a fourth portion of the first layout design, the fourth portion of the first layout design corresponding to fabricating a fourth memory cell of the first set of memory cells of the memory cell array, wherein the first portion of the first layout design and the second portion of the first layout design are mirror images of each other with respect to the second direction, and the third portion of the first layout design and the fourth portion of the first layout design are mirror images of each other with respect to the second direction. In some embodiments, the generating the second layout design of the second set of memory cells includes generating a first portion of the second layout design, the first portion of the second layout design corresponding to fabricating a first memory cell of the second set of memory cells of the memory cell array; generating a second portion of the second layout design, the second portion of the second layout design corresponding to fabricating a second memory cell of the second set of memory cells of the memory cell array; generating a third portion of the second layout design, the third portion of the second layout design corresponding to fabricating a third memory cell of the second set of memory cells of the memory cell array; and generating a fourth portion of the second layout design, the fourth portion of the second layout design corresponding to fabricating a fourth memory cell of the second set of memory cells of the memory cell array, wherein the first portion of the second layout design and the third portion of the second layout design are mirror images of each other with respect to the third direction, and the second portion of the second layout design and the fourth portion of the second layout design are mirror images of each other with respect to the third direction. In some embodiments, the generating the first layout design of the first set of memory cells or generating the second layout design of the second set of memory cells includes generating a set of active region layout patterns corresponding to fabricating a set of active regions of the memory cell array, each of the layout patterns of the set of active region layout patterns being separated from an adjacent layout pattern of the set of active region layout patterns in the third direction by a first pitch, the set of active region layout patterns extending in the second direction and being located on a first layout level, wherein generating the set of active region layout patterns includes generating a first active region layout pattern; generating a second active region layout pattern; generating a third active region layout pattern between the first active region layout pattern and the second active region layout pattern, and generating a fourth active region layout pattern between the third active region layout pattern and the second active region layout pattern, a length of the first active region layout pattern being different from a length of the second active region layout pattern. In some embodiments, the generating the first layout design of the first set of memory cells or generating the second layout design of the second set of memory cells includes generating a set of gate layout patterns corresponding to fabricating a set of gate structures of the memory cell array, the set of gate layout patterns extending in the third direction, overlapping the set of active region layout patterns, and being located on a second layout level different from the first layout level; and generating a first set of conductive feature layout patterns corresponding to fabricating a first set of conductive structures of the memory cell array, the first set of conductive feature layout patterns extending in the third direction and over at least the set of active region layout patterns or the set of gate layout patterns, each conductive feature layout pattern of the first set of conductive feature layout patterns being separated from an adjacent layout pattern of the first set of conductive feature layout patterns in at least the second direction or the third direction, and being located on a third layout level different from the first layout level and the second layout level.

Another aspect of this description relates to a method of forming a memory cell array having a memory cell. The method includes generating, by a processor, a layout design of the memory cell array, wherein the generating of the layout design includes generating a set of active region layout patterns corresponding to fabricating a set of active regions of the memory cell array, generating a set of gate layout patterns corresponding to fabricating a set of gate structures of the memory cell array, generating a first set of conductive feature layout patterns corresponding to fabricating a first set of conductive structures of the memory cell array, wherein at least one of the above layout patterns is stored on a non-transitory computer-readable medium, and at least one of the above operations is performed by a hardware processor. In some embodiments, each of the layout patterns of the set of active region layout patterns being separated from an adjacent layout pattern of the set of active region layout patterns in a first direction by a first pitch, the set of active region layout patterns extending in a second direction different from the first direction and being located on a first layout level, wherein generating the set of active region layout patterns includes generating a first active region layout pattern adjacent to a first side of the memory cell, and generating a second active region layout pattern adjacent to a second side of the memory cell opposite from the first side of the memory cell, a length of the first active region layout pattern being different from a length of the second active region layout pattern. In some embodiments, the set of gate layout patterns extending in the first direction, overlapping the set of active region layout patterns, and being located on a second layout level different from the first layout level. In some embodiments, the first set of conductive feature layout patterns extending in the first direction and over at least the set of active region layout patterns or the set of gate layout patterns, each conductive feature layout pattern of the first set of conductive feature layout patterns being separated from an adjacent layout pattern of the first set of conductive feature layout patterns in at least the first direction or the second direction, and being located on a third layout level different from the first layout level and the second layout level. In some embodiments, the method further includes manufacturing the memory cell array based on the layout design. In some embodiments, generating the layout design of the memory cell array further includes generating a second set of conductive feature layout patterns corresponding to fabricating a second set of conductive structures of the memory cell array, the second set of conductive feature layout patterns extending in the first direction and overlapping at least the second active region layout pattern and the second side of the memory cell, each conductive feature layout pattern of the second set of conductive feature layout patterns being separated from an adjacent layout pattern of the second set of conductive feature layout patterns in at least the first direction or the second direction, and being located on a fourth layout level different from the first layout level, the second layout level and the third layout level. In some embodiments, the generating the layout design of the memory cell array further includes generating a first set of via layout patterns between the first set of conductive feature layout patterns and the set of active region layout patterns, the first set of via layout patterns corresponding to fabricating a first set of vias, the first set of vias coupling the first set of conductive structures to the set of active regions, and each via layout pattern of the first set of via layout patterns being located where each conductive feature layout pattern of the first set of conductive feature layout patterns overlaps each active region layout pattern of the set of active region layout patterns. In some embodiments, the generating the layout design of the memory cell array further includes generating a second set of via layout patterns between the first set of conductive feature layout patterns and the set of gate layout patterns, the second set of via layout patterns corresponding to fabricating a second set of vias, the second set of vias coupling the first set of conductive structures to the set of gates, and a first via layout pattern of the second set of via layout patterns being located where a first conductive feature layout pattern of the first set of conductive feature layout patterns overlaps a first gate layout pattern of the set of gate layout patterns. In some embodiments, the first active region layout pattern corresponds to a first active region of a first P-type transistor. In some embodiments, the second active region layout pattern corresponds to a second active region of a second P-type transistor coupled to the first P-type transistor; and a pass-gate transistor coupled to the second P-type transistor, each of the pass-gate transistor, the first P-type transistor and the second P-type transistor being part of a five transistor (5T) synchronous random access memory (SRAM) memory cell. In some embodiments, the generating the layout design of the memory cell array further includes generating a first well layout pattern corresponding to fabricating a first well of the memory cell array, the first well having a first dopant type, and the first well layout pattern being located on a fourth layout level different from the first layout level, the second layout level and the third layout level, the generating the first well layout pattern includes generating a first layout pattern corresponding to fabricating a first portion of the first well, the first layout pattern extending in the second direction, being adjacent to the first side of the memory cell, and being below the first active region layout pattern; and generating a second layout pattern corresponding to fabricating a second portion of the first well, the second layout pattern extending in the second direction, being adjacent to the second side of the memory cell, and being below the second active region layout pattern. In some embodiments, the generating the layout design of the memory cell array further includes generating a second well layout pattern corresponding to fabricating a second well of the memory cell array, the second well having a second dopant type different from the first dopant type, and the second well layout pattern being located on the fourth layout level, being between the first layout pattern and the second layout pattern, and being below a third active region layout pattern of the set of active region layout patterns and a fourth active region of the set of active region layout patterns. In some embodiments, the first active region layout pattern corresponds to a first active region of a first N-type transistor. In some embodiments, the second active region layout pattern corresponds to a second active region of a second N-type transistor coupled to the first N-type transistor; and a pass-gate transistor coupled to the second N-type transistor, each of the pass-gate transistor, the first N-type transistor and the second N-type transistor being part of a five transistor (5T) synchronous random access memory (SRAM) memory cell. In some embodiments, the generating the layout design of the memory cell array further includes generating a first well layout pattern corresponding to fabricating a first well of the memory cell array, the first well having a first dopant type, and the first well layout pattern being located on a fourth layout level different from the first layout level, the second layout level and the third layout level, the generating the first well layout pattern includes generating a first layout pattern corresponding to fabricating a first portion of the first well, the first layout pattern extending in the second direction, being adjacent to the first side of the memory cell, and being below the first active region layout pattern; and generating a second layout pattern corresponding to fabricating a second portion of the first well, the second layout pattern extending in the second direction, being adjacent to the second side of the memory cell, and being below a first portion of the second active region layout pattern. In some embodiments, the generating the layout design of the memory cell array further includes generating a second well layout pattern corresponding to fabricating a second well of the memory cell array, the second well having a second dopant type different from the first dopant type, and the second well layout pattern being located on the fourth layout level, the generating the second well layout pattern includes generating a third layout pattern corresponding to fabricating a first portion of the second well, the third layout pattern extending in the second direction, being between the first layout pattern and the second layout pattern, and being below a third active region layout pattern of the set of active region layout patterns and a fourth active region of the set of active region layout patterns; and generating a fourth layout pattern corresponding to fabricating a second portion of the second well, the fourth layout pattern extending in the second direction, being adjacent to the second side of the memory cell, and being below a second portion of the second active region layout pattern.

Still another aspect of this description relates to a memory cell array. The memory cell array includes a first memory cell arranged in a first row in a first direction; and a second memory cell arranged in a second row in the first direction. In some embodiments, the first memory cell or the second memory cell includes a set of active regions, each of the active regions of the set of active regions being separated from an adjacent active region of the set of active regions in the first direction by a first pitch, the set of active regions extending in a second direction different from the first direction and being located on a first level. In some embodiments, the set of active regions includes a first active region adjacent to a first side of the first memory cell, and a second active region adjacent to a second side of the first memory cell opposite from the first side of the first memory cell, a length of the first active region being different from a length of the second active region. In some embodiments, the first memory cell or the second memory cell includes a set of gates extending in the first direction, overlapping the set of active regions, and being located on a second level different from the first level. In some embodiments, the first memory cell or the second memory cell includes a first set of conductive structures extending in the first direction and over at least the set of active regions or the set of gates, each conductive structure of the first set of conductive structures being separated from an adjacent conductive structure of the first set of conductive structures feature in at least the first direction or the second direction, and being located on a third level different from the first level and the second level. In some embodiments, the memory array further includes a second set of conductive structures extending in the first direction and overlapping at least the second active region and the second side of the first memory cell, each conductive structure of the second set of conductive structures being separated from an adjacent structure of the second set of conductive structures in at least the first direction or the second direction, and being located on a fourth level different from the first level, the second level and the third level. In some embodiments, the memory array further includes a first set of vias between the first set of conductive structures and the set of active regions, the first set of vias coupling the first set of conductive structures to the set of active regions, and at least one via of the first set of vias being located where at least one conductive structure of the first set of conductive structures overlaps at least one active region of the set of active regions. In some embodiments, the memory array further includes a second set of vias between the first set of conductive structures and the set of gates, the second set of vias coupling the first set of conductive structures to the set of gates, and a first via of the second set of vias being located where a first conductive structure of the first set of conductive structures is over a first gate of the set of gates. In some embodiments, the memory array further includes a first well having a first dopant type, and being located on at least the first level, the first well including a first portion extending in the second direction, being adjacent to the first side of the first memory cell, and the first active region of the set of active regions being embedded in the first portion of the first well; and a second portion extending in the second direction, being adjacent to the second side of the first memory cell, and the second active region of the set of active regions being embedded in the second portion of the first well. In some embodiments, the memory array further includes a second well having a second dopant type different from the first dopant type, and the second well is between the first portion of the first well and the second portion of the first well. In some embodiments, the set of active regions further includes a third active region embedded in the second well; and a fourth active region embedded in the second well, the third active region being between the first active region and the fourth active region, and the fourth active region being between the third active region and the second active region. In some embodiments, the memory array further includes a first well having a first dopant type, and being located on at least the first level, the first well including a first portion of the first well extending in the second direction, being adjacent to the first side of the first memory cell, and the first active region being embedded in the first portion of the first well; and a second portion of the first well extending in the second direction, being adjacent to the second side of the first memory cell. In some embodiments, the memory array further includes a second well having a second dopant type different from the first dopant type, and the second well including a first portion of the second well extending in the second direction, and being adjacent to the first portion of the first well; and a second portion of the second well extending in the second direction, and being adjacent to each of the second side of the first memory cell, the second portion of the first well and the first portion of the second well. In some embodiments, the second active region includes a first portion of the second active region embedded in the second portion of the first well; and a second portion of the second active region embedded in the second portion of the second well, and being aligned with the first portion of the second active region in the second direction. In some embodiments, the set of active regions further includes a third active region embedded in the first portion of the second well; and a fourth active region embedded in the first portion of the second well, the third active region being between the first active region and the fourth active region, and the fourth active region being between the third active region and the second active region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a memory cell array, the method comprising:
generating a first set of tiles extending in a first direction, wherein the generating the first set of tiles comprises:
generating a first layout design of a first set of memory cells, each tile of the first set of tiles corresponds to the first layout design of the first set of memory cells, and each tile of the first set of tiles is offset from an adjacent tile of the first set of tiles in a second direction different from the first direction;
generating a second set of tiles, wherein the generating the second set of tiles comprises:
generating a second layout design of a second set of memory cells, each tile of the second set of tiles corresponds to the second layout design of the second set of memory cells, and each tile of the second set of tiles is offset from an adjacent tile of the second set of tiles in the second direction,
wherein each tile of the first set of tiles extends in a third direction different from the first direction and the second direction, the first set of tiles and the second set of tiles alternate with each other in the second direction, and each tile of the second set of tiles extends in the third direction, and at least one of the above generating operations is performed by a hardware processor, and the first layout design is stored in a non-transitory computer-readable medium; and
manufacturing the memory cell array based on at least the first layout design.

2. The method of claim 1, wherein generating the second layout design of the second set of memory cells comprises:
generating a first portion of the second layout design, the first portion of the second layout design corresponding to fabricating a first memory cell of the second set of memory cells of the memory cell array;
generating a second portion of the second layout design, the second portion of the second layout design corresponding to fabricating a second memory cell of the second set of memory cells of the memory cell array;
generating a third portion of the second layout design, the third portion of the second layout design corresponding to fabricating a third memory cell of the second set of memory cells of the memory cell array; and
generating a fourth portion of the second layout design, the fourth portion of the second layout design corresponding to fabricating a fourth memory cell of the second set of memory cells of the memory cell array, wherein
the first portion of the second layout design and the third portion of the second layout design are mirror images of each other with respect to the third direction, and
the second portion of the second layout design and the fourth portion of the second layout design are mirror images of each other with respect to the third direction.

3. The method of claim 1, wherein generating the first layout design of the first set of memory cells or generating the second layout design of the second set of memory cells comprises:
generating a set of active region layout patterns corresponding to fabricating a set of active regions of the memory cell array, each active region layout pattern of the set of active region layout patterns being separated from an adjacent layout pattern of the set of active region layout patterns in the third direction by a first pitch, the set of active region layout patterns extending in the second direction and being located on a first layout level, wherein generating the set of active region layout patterns comprises:
generating a first active region layout pattern;
generating a second active region layout pattern;
generating a third active region layout pattern between the first active region layout pattern and the second active region layout pattern, and
generating a fourth active region layout pattern between the third active region layout pattern and the second active region layout pattern, a length of the first active region layout pattern being different from a length of the second active region layout pattern;
generating a set of gate layout patterns corresponding to fabricating a set of gate structures of the memory cell array, the set of gate layout patterns extending in the third direction, overlapping the set of active region layout patterns, and being located on a second layout level different from the first layout level; and
generating a first set of conductive feature layout patterns corresponding to fabricating a first set of conductive structures of the memory cell array, the first set of conductive feature layout patterns extending in the third direction and over at least the set of active region layout patterns or the set of gate layout patterns, each conductive feature layout pattern of the first set of conductive feature layout patterns being separated from an adjacent layout pattern of the first set of conductive feature layout patterns in at least the second direction or the third direction, and being located on a third layout level different from the first layout level and the second layout level.

4. The method of claim 1, wherein
the first set of memory cells are arranged in at least a first row and a second row of the memory cell array, the first set of memory cells includes 4 memory cells, each memory cell of the first set of memory cells comprises a five transistor (5T) synchronous random access memory (SRAM) memory cell; and
the second set of memory cells are arranged in at least a third row and a fourth row of the memory cell array, the second set of memory cells includes 4 memory cells, each memory cell of the second set of memory cells comprises a 5T SRAM memory cell.

5. The method of claim 1, wherein generating the first layout design of the first set of memory cells comprises:
generating a first portion of the first layout design, the first portion of the first layout design corresponding to fabricating a first memory cell of the first set of memory cells of the memory cell array;
generating a second portion of the first layout design, the second portion of the first layout design corresponding to fabricating a second memory cell of the first set of memory cells of the memory cell array;
generating a third portion of the first layout design, the third portion of the first layout design corresponding to fabricating a third memory cell of the first set of memory cells of the memory cell array; and
generating a fourth portion of the first layout design, the fourth portion of the first layout design corresponding to fabricating a fourth memory cell of the first set of memory cells of the memory cell array, wherein the first portion of the first layout design and the second portion of the first layout design are mirror images of each other with respect to the second direction, and the third portion of the first layout design and the fourth portion of the first layout design are mirror images of each other with respect to the second direction.

6. A method of forming a memory cell array having a memory cell, the method comprising:

generating, by a processor, a layout design of the memory cell array, the layout design having a corner notch, wherein the generating of the layout design comprises:

generating a set of active region layout patterns corresponding to fabricating a set of active regions of the memory cell array, each active region layout pattern of the set of active region layout patterns being separated from an adjacent layout pattern of the set of active region layout patterns in a first direction by a first pitch, the set of active region layout patterns extending in a second direction different from the first direction and being located on a first layout level, the set of active region layout patterns including a first active region layout pattern adjacent to the corner notch and a first side of the memory cell, and a second active region layout pattern adjacent to a second side of the memory cell opposite from the first side of the memory cell;

wherein at least one of the above layout patterns is stored in a non-transitory computer-readable medium, and at least one of the above generating operations is performed by a hardware processor, and manufacturing the memory cell array based on the layout design.

7. The method of claim 6, wherein generating the layout design of the memory cell array further comprises:

generating a set of gate layout patterns corresponding to fabricating a set of gate structures of the memory cell array, the set of gate layout patterns extending in the first direction, overlapping the set of active region layout patterns, and being located on a second layout level different from the first layout level; and generating a first set of conductive feature layout patterns corresponding to fabricating a first set of conductive structures of the memory cell array, the first set of conductive feature layout patterns extending in the first direction and over at least the set of active region layout patterns or the set of gate layout patterns, each conductive feature layout pattern of the first set of conductive feature layout patterns being separated from an adjacent layout pattern of the first set of conductive feature layout patterns in at least the first direction or the second direction, and being located on a third layout level different from the first layout level and the second layout level.

8. The method of claim 7, wherein generating the layout design of the memory cell array further comprises:

generating a second set of conductive feature layout patterns corresponding to fabricating a second set of conductive structures of the memory cell array, the second set of conductive feature layout patterns extending in the first direction and overlapping at least the second active region layout pattern and the second side of the memory cell, each conductive feature layout pattern of the second set of conductive feature layout patterns being separated from an adjacent layout pattern of the second set of conductive feature layout patterns in at least the first direction or the second direction, and being located on a fourth layout level different from the first layout level, the second layout level and the third layout level.

9. The method of claim 7, wherein generating the layout design of the memory cell array further comprises:

generating a first set of via layout patterns between the first set of conductive feature layout patterns and the set of active region layout patterns, the first set of via layout patterns corresponding to fabricating a first set of vias, the first set of vias coupling the first set of conductive structures to the set of active regions, and each via layout pattern of the first set of via layout patterns being located where each conductive feature layout pattern of the first set of conductive feature layout patterns overlaps each active region layout pattern of the set of active region layout patterns.

10. The method of claim 9, wherein generating the layout design of the memory cell array further comprises:

generating a second set of via layout patterns between the first set of conductive feature layout patterns and the set of gate layout patterns, the second set of via layout patterns corresponding to fabricating a second set of vias, the second set of vias coupling the first set of conductive structures to the set of gate structures, and a first via layout pattern of the second set of via layout patterns being located where a first conductive feature layout pattern of the first set of conductive feature layout patterns overlaps a first gate layout pattern of the set of gate layout patterns.

11. The method of claim 7, wherein the first active region layout pattern corresponds to a first active region of:

a first P-type transistor;

the second active region layout pattern corresponds to a second active region of:

a second P-type transistor coupled to the first P-type transistor; and a pass-gate transistor coupled to the second P-type transistor, each of the pass-gate transistor, the first P-type transistor and the second P-type transistor being part of a five transistor (5T) synchronous random access memory (SRAM) memory cell, and a length of the first active region layout pattern is different from a length of the second active region layout pattern, the first active region layout pattern extending from a side of the layout design to the corner notch of the layout design, and the second active region layout pattern extending from the side of the layout design to another side of the layout design.

12. The method of claim 11, wherein generating the layout design of the memory cell array further comprises:

generating a first well layout pattern corresponding to fabricating a first well of the memory cell array, the first well having a first dopant type, and the first well layout pattern being located on a fourth layout level different from the first layout level, the second layout level and the third layout level, the generating the first well layout pattern comprises:

generating a first layout pattern corresponding to fabricating a first portion of the first well, the first layout pattern extending in the second direction, being adjacent to the first side of the memory cell and the corner notch, and being below the first active region layout pattern; and generating a second layout pattern corresponding to fabricating a second portion of the first well, the second layout pattern extending in the second direction, being adjacent to the second side of the memory cell, and being below the second active region layout pattern; and generating a second well layout pattern corresponding to fabricating a second well of the memory cell array, the second well having a second dopant type different from the first dopant type, and the second well layout pattern being located on the fourth layout level, being between the first layout pattern and the second layout pattern, and being below a third active region layout pattern of the set of active region layout patterns and a fourth active region of the set of active region layout patterns.

13. The method of claim 7, wherein
the first active region layout pattern corresponds to a first active region of:
a first N-type transistor;
the second active region layout pattern corresponds to a second active region of:
a second N-type transistor coupled to the first N-type transistor; and
a pass-gate transistor coupled to the second N-type transistor, each of the pass-gate transistor, the first N-type transistor and the second N-type transistor being part of a five transistor (5T) synchronous random access memory (SRAM) memory cell, and
a length of the first active region layout pattern is different from a length of the second active region layout pattern, the first active region layout pattern extending from a side of the layout design to the corner notch of the layout design.

14. The method of claim 13, wherein generating the layout design of the memory cell array further comprises:
generating a first well layout pattern corresponding to fabricating a first well of the memory cell array, the first well having a first dopant type, and the first well layout pattern being located on a fourth layout level different from the first layout level, the second layout level and the third layout level, the generating the first well layout pattern comprises:
generating a first layout pattern corresponding to fabricating a first portion of the first well, the first layout pattern extending in the second direction, being adjacent to the first side of the memory cell and the corner notch, and being below the first active region layout pattern; and
generating a second layout pattern corresponding to fabricating a second portion of the first well, the second layout pattern extending in the second direction, being adjacent to the second side of the memory cell, and being below a first portion of the second active region layout pattern; and
generating a second well layout pattern corresponding to fabricating a second well of the memory cell array, the second well having a second dopant type different from the first dopant type, and the second well layout pattern being located on the fourth layout level, the generating the second well layout pattern comprises:
generating a third layout pattern corresponding to fabricating a first portion of the second well, the third layout pattern extending in the second direction, being between the first layout pattern and the second layout pattern, and being below a third active region layout pattern of the set of active region layout patterns and a fourth active region of the set of active region layout patterns; and generating a fourth layout pattern corresponding to fabricating a second portion of the second well, the fourth layout pattern extending in the second direction, being adjacent to the second side of the memory cell, and being below a second portion of the second active region layout pattern.

15. A memory cell array comprising:
a first memory cell arranged in a first row in a first direction;
a first bit line extending in a second direction different from the first direction, and being coupled to the first memory cell;
a second memory cell arranged in a second row in the first direction,
a second bit line extending in the second direction, and being coupled to the second memory cell;
wherein at least the first memory cell corresponds to a five transistor (5T) memory cell, and the first memory cell comprises:
a first active region adjacent to a first side of the first memory cell, and
a second active region adjacent to a second side of the first memory cell opposite from the first side of the first memory cell, a length of the first active region being different from a length of the second active region, the first and the second active regions extending in the second direction, being located on a first level and being separated from each other in the first direction.

16. The memory cell array of claim 15, further comprising:
a set of gates extending in the first direction, overlapping the first and second active regions, and being located on a second level different from the first level; and
a first set of conductive structures extending in the first direction and over at least the first and second active regions or the set of gates, each conductive structure of the first set of conductive structures being separated from an adjacent conductive structure of the first set of conductive structures in at least the first direction or the second direction, and being located on a third level different from the first level and the second level.

17. The memory cell array of claim 16, further comprising:
a second set of conductive structures extending in the first direction and overlapping at least the second active region and the second side of the first memory cell, each conductive structure of the second set of conductive structures being separated from an adjacent structure of the second set of conductive structures in at least the first direction or the second direction, and being located on a fourth level different from the first level, the second level and the third level;
a first set of vias between the first set of conductive structures and the first and second active regions, the first set of vias coupling the first set of conductive structures to the first and second active regions, and at least one via of the first set of vias being located where at least one conductive structure of the first set of conductive structures overlaps at least one of the first and second active regions; and
a second set of vias between the first set of conductive structures and the set of gates, the second set of vias coupling the first set of conductive structures to the set of gates, and a first via of the second set of vias being located where a first conductive structure of the first set of conductive structures is over a first gate of the set of gates.

18. The memory cell array of claim 16, further comprising:
   a first well having a first dopant type, and being located on at least the first level, the first well comprising:
      a first portion extending in the second direction, being adjacent to the first side of the first memory cell, and the first active region being embedded in the first portion of the first well; and
      a second portion extending in the second direction, being adjacent to the second side of the first memory cell, and the second active region being embedded in the second portion of the first well;
   a second well having a second dopant type different from the first dopant type, and the second well being between the first portion of the first well and the second portion of the first well;
   a third active region embedded in the second well; and
   a fourth active region embedded in the second well, the third active region being between the first active region and the fourth active region, and the fourth active region being between the third active region and the second active region.

19. The memory cell array of claim 16, further comprising:
   a first well having a first dopant type, and being located on at least the first level, the first well comprising:
      a first portion of the first well extending in the second direction, being adjacent to the first side of the first memory cell, and the first active region being embedded in the first portion of the first well; and
      a second portion of the first well extending in the second direction, being adjacent to the second side of the first memory cell;
   a second well having a second dopant type different from the first dopant type, and the second well comprising:
      a first portion of the second well extending in the second direction, and being adjacent to the first portion of the first well; and
      a second portion of the second well extending in the second direction, and being adjacent to each of the second side of the first memory cell, the second portion of the first well and the first portion of the second well,
   wherein the second active region comprises:
      a first portion of the second active region embedded in the second portion of the first well; and
      a second portion of the second active region embedded in the second portion of the second well, and being aligned with the first portion of the second active region in the second direction;
   a third active region embedded in the first portion of the second well; and
   a fourth active region embedded in the first portion of the second well, the third active region being between the first active region and the fourth active region, and the fourth active region being between the third active region and the second active region.

20. The memory cell array of claim 15, wherein at least the second memory cell corresponds to another 5T memory cell, and the second memory cell comprises:
   a third active region adjacent to a first side of the second memory cell; and
   a fourth active region adjacent to a second side of the second memory cell opposite from the first side of the second memory cell, a length of the third active region being different from a length of the fourth active region, the third active region and the fourth active region extending in the second direction, being located on the first level and being separated from each other in the first direction.

* * * * *